(12) United States Patent
Freer et al.

(10) Patent No.: US 9,390,951 B2
(45) Date of Patent: Jul. 12, 2016

(54) METHODS AND SYSTEMS FOR ELECTRIC FIELD DEPOSITION OF NANOWIRES AND OTHER DEVICES

(71) Applicants: OneD Material LLC, Palo Alto, CA (US); SHARP KABUSHIKI KAISHA, Osaka (JP)

(72) Inventors: Erik Freer, Campbell, CA (US); James M. Hamilton, Sunnyvale, CA (US); David P. Stumbo, Pleasanton, CA (US); Kenji Komiya, Osaka (JP); Akihide Shibata, Osaka (JP)

(73) Assignee: SHARP KABUSHIKI KAISHA, Osaka-shi, Osaka (JP)

( * ) Notice: Subject to any disclaimer, the term of this patent is extended or adjusted under 35 U.S.C. 154(b) by 0 days.

(21) Appl. No.: 14/340,306

(22) Filed: Jul. 24, 2014

(65) Prior Publication Data

US 2014/0331930 A1 Nov. 13, 2014

Related U.S. Application Data

(62) Division of application No. 13/322,117, filed as application No. PCT/US2010/036065 on May 25, 2010, now abandoned.

(60) Provisional application No. 61/181,229, filed on May 26, 2009.

(51) Int. Cl.
*B05C 13/02* (2006.01)
*H01L 21/677* (2006.01)
(Continued)

(52) U.S. Cl.
CPC ........... *H01L 21/67703* (2013.01); *B82Y 10/00* (2013.01); *B82Y 40/00* (2013.01);
(Continued)

(58) Field of Classification Search
USPC ................ 118/66, 58, 500, 62, 63, 313–315; 428/142, 143, 221, 323; 977/773, 762
See application file for complete search history.

(56) References Cited

U.S. PATENT DOCUMENTS 3,873,359 A 3/1975 Lando
3,873,360 A 3/1975 Lando
(Continued)

FOREIGN PATENT DOCUMENTS

EP 1087413 A2 3/2001
JP 11-11917 A 1/1999
(Continued)

OTHER PUBLICATIONS

Lahoun et al., "Epitaxial Core-Shell and Core-Multishell Nanowire Heterostructures", Nature, Nature Publishing Group, vol. 420, 2002, pp. 57-61.
(Continued)

*Primary Examiner* — Yewebdar Tadesse
(74) *Attorney, Agent, or Firm* — Nixon & Vanderhye, P.C.

(57) ABSTRACT

Methods, systems, and apparatuses for nanowire deposition are provided. A deposition system includes an enclosed flow channel, an inlet port, and an electrical signal source. The inlet port provides a suspension that includes nanowires into the channel. The electrical signal source is coupled to an electrode pair in the channel to generate an electric field to associate at least one nanowire from the suspension with the electrode pair. The deposition system may include various further features, including being configured to receive multiple solution types, having various electrode geometries, having a rotatable flow channel, having additional electrical conductors, and further aspects.

18 Claims, 47 Drawing Sheets

(51) Int. Cl.
*B82Y 10/00* (2011.01)
*B82Y 40/00* (2011.01)
*C25D 13/02* (2006.01)
*C25D 13/22* (2006.01)
*C25D 17/12* (2006.01)
*H01L 29/06* (2006.01)

(52) U.S. Cl.
CPC .............. *C25D 13/02* (2013.01); *C25D 13/22* (2013.01); *C25D 17/12* (2013.01); *H01L 29/0665* (2013.01); *H01L 29/0673* (2013.01)

(56) References Cited

U.S. PATENT DOCUMENTS

| | | |
|---|---|---|
| 3,900,614 A | 8/1975 | Lando |
| 4,673,474 A | 6/1987 | Ogawa |
| 4,939,556 A | 7/1990 | Eguchi et al. |
| 5,023,139 A | 6/1991 | Birnboim et al. |
| 5,089,545 A | 2/1992 | Pol |
| 5,252,835 A | 10/1993 | Lieber et al. |
| 5,274,602 A | 12/1993 | Glenn |
| 5,453,970 A | 9/1995 | Rust et al. |
| 5,475,341 A | 12/1995 | Reed |
| 5,505,928 A | 4/1996 | Alivisatos et al. |
| 5,512,131 A | 4/1996 | Kumar et al. |
| 5,524,092 A | 6/1996 | Park |
| 5,537,075 A | 7/1996 | Miyazaki |
| 5,539,214 A | 7/1996 | Lynch et al. |
| 5,581,091 A | 12/1996 | Moskovits et al. |
| 5,589,692 A | 12/1996 | Reed |
| 5,607,876 A | 3/1997 | Biegelsen et al. |
| 5,620,850 A | 4/1997 | Bamdad et al. |
| 5,640,343 A | 6/1997 | Gallagher et al. |
| 5,690,807 A | 11/1997 | Clark, Jr. et al. |
| 5,726,524 A | 3/1998 | Debe |
| 5,739,057 A | 4/1998 | Tiwari et al. |
| 5,747,180 A | 5/1998 | Miller et al. |
| 5,751,018 A | 5/1998 | Alivisatos et al. |
| 5,751,156 A | 5/1998 | Muller et al. |
| 5,776,748 A | 7/1998 | Singhvi et al. |
| 5,824,470 A | 10/1998 | Baldeschwieler et al. |
| 5,830,538 A | 11/1998 | Gates et al. |
| 5,840,435 A | 11/1998 | Lieber et al. |
| 5,847,565 A | 12/1998 | Narayanan |
| 5,858,862 A | 1/1999 | Westwater et al. |
| 5,864,823 A | 1/1999 | Levitan |
| 5,897,945 A | 4/1999 | Lieber et al. |
| 5,900,160 A | 5/1999 | Whitesides et al. |
| 5,903,010 A | 5/1999 | Flory et al. |
| 5,908,692 A | 6/1999 | Hamers et al. |
| 5,916,642 A | 6/1999 | Chang |
| 5,942,443 A | 8/1999 | Parce et al. |
| 5,990,479 A | 11/1999 | Weiss et al. |
| 5,997,832 A | 12/1999 | Lieber et al. |
| 6,036,774 A | 3/2000 | Lieber et al. |
| 6,038,060 A | 3/2000 | Crowley |
| 6,048,616 A | 4/2000 | Gallagher et al. |
| 6,060,121 A | 5/2000 | Hidber et al. |
| 6,060,724 A | 5/2000 | Flory et al. |
| 6,069,380 A | 5/2000 | Chou et al. |
| 6,123,819 A | 9/2000 | Peeters |
| 6,128,214 A | 10/2000 | Kuekes et al. |
| 6,136,156 A | 10/2000 | El-Shall et al. |
| 6,143,184 A | 11/2000 | Martin et al. |
| 6,149,819 A | 11/2000 | Martin et al. |
| 6,159,742 A | 12/2000 | Lieber et al. |
| 6,180,239 B1 | 1/2001 | Whitesides et al. |
| 6,187,165 B1 | 2/2001 | Chien et al. |
| 6,190,634 B1 | 2/2001 | Lieber et al. |
| 6,203,864 B1 | 3/2001 | Zhang et al. |
| 6,207,392 B1 | 3/2001 | Weiss et al. |
| 6,211,464 B1 | 4/2001 | Mochizuki et al. |
| 6,225,198 B1 | 5/2001 | Alivisatos et al. |
| 6,231,744 B1 | 5/2001 | Ying et al. |
| 6,256,767 B1 | 7/2001 | Kuekes et al. |
| 6,270,074 B1 | 8/2001 | Rasmussen et al. |
| 6,278,231 B1 | 8/2001 | Iwasaki et al. |
| 6,286,226 B1 | 9/2001 | Jin |
| 6,287,765 B1 | 9/2001 | Cubicciotti |
| 6,306,736 B1 | 10/2001 | Alivisatos et al. |
| 6,314,019 B1 | 11/2001 | Kuekes et al. |
| 6,325,904 B1 | 12/2001 | Peeters |
| 6,333,200 B1 | 12/2001 | Kaler et al. |
| 6,340,822 B1 | 1/2002 | Brown et al. |
| 6,346,189 B1 | 2/2002 | Dai et al. |
| 6,355,198 B1 | 3/2002 | Kim et al. |
| 6,358,643 B1 | 3/2002 | Katz et al. |
| 6,359,288 B1 | 3/2002 | Ying et al. |
| 6,413,489 B1 | 7/2002 | Ying et al. |
| 6,437,329 B1 | 8/2002 | Yedur et al. |
| 6,459,095 B1 | 10/2002 | Heath et al. |
| 6,465,132 B1 | 10/2002 | Jin |
| 6,468,657 B1 | 10/2002 | Hou et al. |
| 6,468,677 B1 | 10/2002 | Benton et al. |
| 6,503,375 B1 | 1/2003 | Mayden et al. |
| 6,528,020 B1 | 3/2003 | Dai et al. |
| 6,536,106 B1 | 3/2003 | Jackson et al. |
| 6,538,367 B1 | 3/2003 | Choi et al. |
| 6,559,468 B1 | 5/2003 | Kuekes et al. |
| 6,586,095 B2 | 7/2003 | Wang et al. |
| 6,628,053 B1 | 9/2003 | Den et al. |
| 6,687,987 B2 | 2/2004 | Mayer et al. |
| 6,716,409 B2 | 4/2004 | Hafner et al. |
| 6,720,728 B2 | 4/2004 | Den et al. |
| 6,741,019 B1 | 5/2004 | Filas et al. |
| 6,743,408 B2 | 6/2004 | Lieber et al. |
| 6,756,025 B2 | 6/2004 | Colbert et al. |
| 6,756,795 B2 | 6/2004 | Hunt et al. |
| 6,762,056 B1 | 7/2004 | Peeters |
| 6,781,166 B2 | 8/2004 | Lieber et al. |
| 6,787,769 B2 | 9/2004 | Nakayama et al. |
| 6,803,840 B2 | 10/2004 | Hunt et al. |
| 6,808,746 B1 | 10/2004 | Dai et al. |
| 6,815,706 B2 | 11/2004 | Li et al. |
| 6,846,565 B2 | 1/2005 | Korgel et al. |
| 6,846,682 B2 | 1/2005 | Heath et al. |
| 6,872,645 B2 | 3/2005 | Duan et al. |
| 6,878,871 B2 | 4/2005 | Scher et al. |
| 6,882,051 B2 | 4/2005 | Majumdar et al. |
| 6,882,767 B2 | 4/2005 | Yang et al. |
| 6,900,479 B2 | 5/2005 | DeHon et al. |
| 6,902,720 B2 | 6/2005 | McGimpsey |
| 6,903,015 B2 | 6/2005 | Matsui et al. |
| 6,936,761 B2 | 8/2005 | Pichler |
| 6,946,197 B2 | 9/2005 | Yadav et al. |
| 6,958,216 B2 | 10/2005 | Kelley et al. |
| 6,962,823 B2 | 11/2005 | Empedocles et al. |
| 6,963,077 B2 | 11/2005 | DeHon et al. |
| 6,974,706 B1 | 12/2005 | Melker et al. |
| 6,996,147 B2 | 2/2006 | Majumdar et al. |
| 7,039,619 B2 | 5/2006 | Nugent |
| 7,048,903 B2 | 5/2006 | Colbert et al. |
| 7,051,945 B2 | 5/2006 | Empedocles et al. |
| 7,052,861 B2 | 5/2006 | Massey et al. |
| 7,057,881 B2 | 6/2006 | Chow et al. |
| 7,064,372 B2 | 6/2006 | Duan et al. |
| 7,067,328 B2 | 6/2006 | Dubrow et al. |
| 7,067,867 B2 | 6/2006 | Duan et al. |
| 7,068,898 B2 | 6/2006 | Buretea et al. |
| 7,073,157 B2 | 7/2006 | DeHon et al. |
| 7,087,833 B2 | 8/2006 | Scher et al. |
| 7,091,120 B2 | 8/2006 | Buretea et al. |
| 7,105,428 B2 | 9/2006 | Pan et al. |
| 7,115,971 B2 | 10/2006 | Stumbo et al. |
| 7,129,554 B2 | 10/2006 | Lieber et al. |
| 7,132,275 B2 | 11/2006 | Reich et al. |
| 7,135,728 B2 | 11/2006 | Duan et al. |
| 7,151,209 B2 | 12/2006 | Empedocles et al. |
| 7,163,659 B2 | 1/2007 | Stasiak et al. |
| 7,172,953 B2 | 2/2007 | Lieber et al. |
| 7,186,355 B2 | 3/2007 | Swager |
| 7,189,435 B2 | 3/2007 | Tuominen et al. |
| 7,190,049 B2 | 3/2007 | Tuominen et al. |

(56) References Cited

U.S. PATENT DOCUMENTS

| | | |
|---|---|---|
| 7,211,464 B2 | 5/2007 | Lieber et al. |
| 7,232,460 B2 | 6/2007 | Van Erlach et al. |
| 7,254,151 B2 | 8/2007 | Lieber et al. |
| 7,256,466 B2 | 8/2007 | Lieber et al. |
| 7,301,199 B2 | 11/2007 | Lieber et al. |
| 7,303,875 B1 | 12/2007 | Bock et al. |
| 7,323,143 B2 | 1/2008 | Anderson et al. |
| 7,339,184 B2 | 3/2008 | Romano et al. |
| 7,344,961 B2 | 3/2008 | Romano et al. |
| 7,381,316 B1 | 6/2008 | Lee et al. |
| 7,385,262 B2 | 6/2008 | O'Keeffe et al. |
| 7,385,267 B2 | 6/2008 | Lieber et al. |
| 7,449,757 B2 | 11/2008 | Bradley et al. |
| 7,857,956 B2 | 12/2010 | Burke et al. |
| 7,858,965 B2 | 12/2010 | Lu et al. |
| 7,915,151 B2 | 3/2011 | Lieber et al. |
| 7,951,698 B2 | 5/2011 | Moon et al. |
| 7,968,474 B2 | 6/2011 | Martin et al. |
| 2002/0005876 A1 | 1/2002 | Grimes et al. |
| 2002/0013031 A1 | 1/2002 | Chen et al. |
| 2002/0084502 A1 | 7/2002 | Jang et al. |
| 2002/0130311 A1 | 9/2002 | Lieber et al. |
| 2002/0146714 A1 | 10/2002 | Lieber et al. |
| 2002/0179434 A1 | 12/2002 | Dai et al. |
| 2003/0048619 A1 | 3/2003 | Kaler et al. |
| 2003/0073071 A1 | 4/2003 | Fritz et al. |
| 2003/0113713 A1 | 6/2003 | Glezer et al. |
| 2003/0113940 A1 | 6/2003 | Erlanger et al. |
| 2003/0124717 A1 | 7/2003 | Awano et al. |
| 2003/0134267 A1 | 7/2003 | Kang et al. |
| 2003/0134433 A1 | 7/2003 | Gabriel et al. |
| 2003/0189202 A1 | 10/2003 | Li et al. |
| 2004/0026684 A1 | 2/2004 | Empedocles |
| 2004/0067530 A1 | 4/2004 | Gruner |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0157414 A1 | 8/2004 | Gale et al. |
| 2004/0188721 A1 | 9/2004 | Lieber et al. |
| 2005/0029678 A1 | 2/2005 | Hanralh et al. |
| 2005/0037374 A1 | 2/2005 | Melker et al. |
| 2005/0064731 A1 | 3/2005 | Park et al. |
| 2005/0072213 A1 | 4/2005 | Besnard et al. |
| 2005/0079533 A1 | 4/2005 | Samuelson et al. |
| 2005/0079659 A1 | 4/2005 | Duan et al. |
| 2005/0100960 A1 | 5/2005 | Dai et al. |
| 2005/0101026 A1 | 5/2005 | Sailor et al. |
| 2005/0109989 A1 | 5/2005 | Whiteford et al. |
| 2005/0126913 A1 | 6/2005 | Burke et al. |
| 2005/0157445 A1 | 7/2005 | Bradley et al. |
| 2005/0161662 A1 | 7/2005 | Majumdar et al. |
| 2005/0199731 A9 | 9/2005 | Empedocles et al. |
| 2005/0201149 A1 | 9/2005 | Duan et al. |
| 2005/0202615 A1 | 9/2005 | Duan et al. |
| 2005/0249667 A1 | 11/2005 | Tuszynski et al. |
| 2005/0253137 A1 | 11/2005 | Whang et al. |
| 2005/0256816 A1 | 11/2005 | Nugent |
| 2005/0287717 A1 | 12/2005 | Heald et al. |
| 2006/0054936 A1 | 3/2006 | Lieber et al. |
| 2006/0105513 A1 | 5/2006 | Afzali-Ardakani et al. |
| 2006/0160246 A1 | 7/2006 | Massey et al. |
| 2006/0175601 A1 | 8/2006 | Lieber et al. |
| 2006/0188774 A1 | 8/2006 | Niu et al. |
| 2006/0237749 A1 | 10/2006 | Lieber et al. |
| 2006/0239688 A1 | 10/2006 | Hillis et al. |
| 2006/0269927 A1 | 11/2006 | Lieber et al. |
| 2007/0026645 A1 | 2/2007 | Lieber et al. |
| 2007/0032023 A1 | 2/2007 | Lieber et al. |
| 2007/0032051 A1 | 2/2007 | Lieber et al. |
| 2007/0032052 A1 | 2/2007 | Lieber et al. |
| 2007/0045667 A1 | 3/2007 | Lieber et al. |
| 2007/0048492 A1 | 3/2007 | Lieber et al. |
| 2007/0161237 A1 | 7/2007 | Lieber et al. |
| 2007/0252136 A1 | 11/2007 | Lieber et al. |
| 2007/0264623 A1 | 11/2007 | Wang et al. |
| 2007/0281156 A1 | 12/2007 | Lieber et al. |
| 2008/0116491 A1 | 5/2008 | Lieber et al. |
| 2008/0132052 A1 | 6/2008 | Moon et al. |
| 2008/0143906 A1* | 6/2008 | Allemand et al. ............ 349/43 |
| 2008/0224123 A1* | 9/2008 | Martin et al. ............... 257/23 |
| 2009/0004852 A1 | 1/2009 | Lieber et al. |
| 2009/0120359 A1* | 5/2009 | Roussillon et al. .......... 118/300 |
| 2010/0050935 A1* | 3/2010 | Roussillon et al. .......... 118/58 |
| 2010/0227382 A1 | 9/2010 | Lieber et al. |
| 2011/0174619 A1 | 7/2011 | Lieber et al. |
| 2012/0135158 A1 | 5/2012 | Freer et al. |

FOREIGN PATENT DOCUMENTS

| | | |
|---|---|---|
| JP | 2000-31462 A1 | 1/2000 |
| JP | 2002-346996 A | 12/2002 |
| JP | 2003-332266 A | 11/2003 |
| JP | 2004-071654 A | 3/2004 |
| JP | 2006-114494 A | 4/2006 |
| JP | 2006-329802 A | 12/2006 |
| JP | 2007-317961 A | 12/2007 |
| JP | 2008-260073 A | 10/2008 |
| JP | 2009-032894 A | 2/2009 |
| WO | 91/06036 A1 | 5/1991 |
| WO | 95/02709 A2 | 1/1995 |
| WO | 95/02709 A3 | 4/1995 |
| WO | 96/29629 A2 | 9/1996 |
| WO | 96/29629 A3 | 4/1997 |
| WO | 97/33737 A1 | 9/1997 |
| WO | 97/34025 A1 | 9/1997 |
| WO | 98/39250 A1 | 9/1998 |
| WO | 98/42620 A1 | 10/1998 |
| WO | 98/48456 A1 | 10/1998 |
| WO | 99/63347 A2 | 12/1999 |
| WO | 00/09443 A1 | 2/2000 |
| WO | 00/17101 A1 | 3/2000 |
| WO | 00/19494 A1 | 4/2000 |
| WO | 99/63347 A3 | 4/2000 |
| WO | 00/51186 A1 | 8/2000 |
| WO | 01/03208 A1 | 1/2001 |
| WO | 01/44796 A1 | 6/2001 |
| WO | 02/17362 A2 | 2/2002 |
| WO | 02/31183 A1 | 4/2002 |
| WO | 02/48701 A2 | 6/2002 |
| WO | 02/080280 A1 | 10/2002 |
| WO | 02/086480 A1 | 10/2002 |
| WO | 03/005450 A2 | 1/2003 |
| WO | 03/016901 A1 | 2/2003 |
| WO | 02/48701 A3 | 4/2003 |
| WO | 03/053851 A2 | 7/2003 |
| WO | 03/054931 A1 | 7/2003 |
| WO | 03/063208 A2 | 7/2003 |
| WO | 2004/003535 A1 | 1/2004 |
| WO | 2004/010552 A1 | 1/2004 |
| WO | 03/053851 A3 | 2/2004 |
| WO | 03/063208 A3 | 2/2004 |
| WO | 2004/032190 A2 | 4/2004 |
| WO | 2004/032193 A2 | 4/2004 |
| WO | 2004/034025 A2 | 4/2004 |
| WO | 2005/030636 A3 | 4/2004 |
| WO | 2004/038767 A2 | 5/2004 |
| WO | 2004/038767 A3 | 8/2004 |
| WO | 2004/032193 A3 | 1/2005 |
| WO | 2005/114282 A2 | 2/2005 |
| WO | 2004/034025 A3 | 3/2005 |
| WO | 2005/030636 A2 | 4/2005 |
| WO | 2004/032190 A3 | 6/2005 |
| WO | 2005/089165 A2 | 9/2005 |
| WO | 2005093831 A1 | 10/2005 |
| WO | 2005094440 A2 | 10/2005 |
| WO | 2005/119789 A1 | 12/2005 |
| WO | 2005/089165 A3 | 5/2006 |
| WO | 2005/114282 A3 | 6/2006 |
| WO | 2005094440 A3 | 6/2006 |
| WO | 2006107312 A1 | 10/2006 |
| WO | 2006/132659 A2 | 12/2006 |
| WO | 2007/044034 A2 | 4/2007 |
| WO | 2007/061945 A2 | 5/2007 |
| WO | 2008/060455 A2 | 5/2008 |

(56) References Cited

FOREIGN PATENT DOCUMENTS

| WO | 2009/023305 A2 | 2/2009 |
|---|---|---|
| WO | 2009/101944 A1 | 8/2009 |
| WO | 2010/138506 A1 | 12/2010 |

OTHER PUBLICATIONS

Lahoun et al., "Semiconductor Nanowire Heterostructures", Phil. Trans. R. Soc. Land., Royal Society, vol. 362, 2004, pp. 1247-1260.
Law et al., "Nanoribbon Waveguides for Subwavelength Photonics Integration", Science, Association of the Advancement of Science, vol. 305, 2004, pp. 1269-1273.
Leff et al., "Thermodynamic Control of Gold Nanocrystal Size: Experiment and Theory", J. Phys. Chem., American Chemical Society, vol. 99, 1995, pp. 7036-7041.
Lei et al., "Nanowire Transistors With Ferroelectric Gate Dielectrics: Enhanced Performance and Memory Effects", Appl. Phys. Lett., American Institute of Physics, vol. 84, 2004, pp. 4553-4555.
Lieber, C., "Nanoscale Science and Technology: Building a Big Future from Small Things", MRS Bull, Materials Research Society, vol. 28, 2003, pp. 219-223.
Lieber, C., "Nanowire Superlattices," Nano Lett., American Chemical Society, vol. 2, 2002, pp. 81-82.
Lu et al., "One-Dimensional Hole Gas in Germanium/Silicon Nanowire Heterostructures", Proc. Natl. Acad. Sci. U.S.A., National Academy of Sciences, vol. 102, No. 29, 2005, pp. 10046-10051.
Martel et al., "Single-And Multi-Wall Carbon Nanotube Field-Effect Transistors" Appl. Phys. Lett., American Institute of Physics, vol. 73, 1998, pp. 2447-2449.
Mayer et al., "Electric-field Directed Assembly of Nanowires for Heterogeneous Integration of On-chip Electronic Systems", MRS Fall Meeting, Abstract JJ5.1, Materials Research Society, (Nov. 2007).
Mcalpine, M., "Nanoimprint Lithography for Hybrid Plastic Electronics", Nano Lett., American Chemical Society, vol. 3, 2003, pp. 443-445.
Mcalpine et al., "High-Performance Nanowire Electronics and Photonics on Glass and Plastic Substrates", Nano Lett, American Chemical Society, vol. 3, 2003, pp. 1531-1535.
Mcalpine et al., "High-Performance Nanowire Electronics and Photonics and Nanoscale Patterning on Flexible Plastic Substrates", Proc IEEE, IEEE Service Center, vol. 93, Issue 7, 2005, pp. 1357-1363.
Menon et al., "Fabrication and Evaluation of Nanoelectrode Ensembles", Anal. Chem., American Chemical Society, vol. 67, 1995, pp. 1920-1928.
Mizutani et al., "Fabrication and Characterization of Carbon Nanotube FETs", Proc. SPIE, The International Society for Optical Engineering, vol. 5732, 2005, pp. 28-36.
Morales et al., "A Laser Ablation Method for the Synthesis of Crystalline Semiconductor Nanowires", Science, American Association for the Advancement of Science, vol. 279, 1998, pp. 208-211.
Musin, R.N., "Structural and Electronic Properties of Epitaxial Core-Shell Nanowire Heterostructures", Phys. Rev.B, The American Physical Society, vol. 71, 2005, pp. 155318.
Nosho, Y., "N-Type Carbon Nanotube Field-Effect Transistors Fabricated by Using Ca Contact Electrodes", Appl. Phys. Lett., American Institute of Physics, vol. 86, 2005, 73105.
Padeste et al., "Modular Amperometric Immunosensor Devices", 8th Int'l Coni. Solid State Act. Euro. IX, Found Sensors & Actuator Technol., vol. 357, 1995, pp. 487-490.
Papadakis et al., "Controlled, Accurate Dielectrophoretic Assembly of Metallic Nanowires into Ordered Arrays", 2007 MRS Fall Meeting, Abstract JJ5.2.
Patolsky et al., "Nanowire nanosensors," Mal. Today, Elsevier Science, vol. 1369, 2005, pp. 20-28.
Patolsky et al., "Electrical Detection of Single Viruses", Proc. Natl. Acad. Sci. U.S.A., National Academy of Sciences, vol. 101, 2004, pp. 14017-14022.

Pavesi et al., "Optical Gain in Silicon Nanocrystals", Nature, Nature Publishing Group, vol. 408, 2000, pp. 440-444.
Phanindra et al., "Electric Field Directed Growth of Molecular Wires of Charge Transfer Molecules on Prefabricated Metal Electrodes", 2007 MRS Fall Meeting, Abstract JJ5.3, Materials Research Society (Nov. 2007).
Qi et al., "Toward Large Arrays of Multiplex Functionalized Carbon Nanolube Sensors for Highly Sensitive and Selective Molecular Detection," Nano Lett., American Chemical Society, vol. 3, 2005, pp. 347-351.
Rueckes et al., "Carbon Nanotube-Based Nonvolatile Random Access Memory for Molecular Computing", Science, American Association for the Advancement of Science, vol. 298, 2007, pp. 94-97.
Star et al., "Preparation and Properties of Polymer-Wrapped Single-Walled Carbon Nanotubes," Angew. Chem. Int. Ed. Engl., Wiley-VCH, vol. 40, 2001, pp. 1721-1725.
Takayama et al., "Patterning Cells and Their Environments Using Multiple Laminar Fluid Flows in Capillary Networks", Proc. Nail. Acad Sci. U.S.A., National Academy of Sciences, vol. 96, 1999, pp. 5545-5548.
Tans et al., "Room-Temperature Transistor Based on a Single Carbon Nanolube", Nature, Nature Publishing Group, vol. 393, 1998, pp. 49-52.
Tiefenauer et al., "Towards Amperometric Immunosensor Devices", Biosens. Bioelectron., Elsevier Advanced Technology, vol. 12, 1997, pp. 213-223.
Tong et al., "Subwavelength-Diameter Silica Wires for Low-Loss Optical Wave Guiding", Nature, Nature Publishing Group, vol. 426, 2003, pp. 816-819.
Thess et al., "Crystalline Ropes of Metallic Carbon Nanotubes", Science, American Association for the Advancement of Science, vol. 273, 1996, pp. 483-487.
Urban et al., "Single-Crystalline Barium Titanate Nanowires", Adv. Mal., Wiley-VCH, vol. 15, 2003, pp. 423-426.
Vossmeyer et al., "Combinatorial Approaches Toward Patterning Nanocrystals", J. Appl. Phys., American Institute of Physics, vol. 84, 1998, pp. 3664-3670.
Wang et al., "Highly Polarized Photoluminescence and Photodetection from Single Indium Phosphide Nanowires," Science, Association for the Advancement, vol. 293, 2001, pp. 1455-1457.
Wang et al., "SiO2-Enhanced Synthesis of Si Nanowires by Laser Ablation", Appl. Phys. Lett., American Institute of Physics, vol. 73, 1998, pp. 902-3904.
Wang et al., "Label-Free Detection of Small-Molecule-Protein Interactions by Using Nanowire Nanosensors," Proc. Nail. Acad. Sci., National Academy of Sciences, vol. 102, 2005, pp. 3208-3212.
Wei et al., "Synthesis of Single Crystal Bismuth-Telluride and Lead-Telluride Nanowires for New Thermoelectric Materials," Mal. Res. Soc. Symp. Proc., Materials Research Society, vol. 581, 2000, pp. 219-223.
Whang et al., "Large-Scale Hierarchical Organization of Nanowire Arrays for Integrated Nanosysterns," Nano. Lett., American Chemical Society, vol. 3, 2003, pp. 1255-1259.
Whang et al., "Nanolithographys Using Hierarchically Assembled Nanowire Masks," Nano. Lett, American Chemical Society, vol. 3, 2003, pp. 951-954.
Wolf et al., "Volume 1—Process Technology," in Silicon Processing for the VLSI ERA, 2nd Ed., Lattice Press, Sunset Beach, CA, 2000, pp. 12-13.
Wong et al., "Covalently Funtionalized Nanolubes As Nanometre-Sized Probes in Chemistry and Biology", Nature, Nature Publishing Group, vol. 394, 1998, pp. 52-55.
Wu et al., "Block-by-Block Growth of Single-Crystalline Si/SiGe Superlattice Nanowires," Nano. Lett., American Chemical Society, vol. 2, 2002, pp. 83-86.
Wu et al., "Controlled Growth and Structures of Molecular-Scale Silicon Nanowires," Nano. Lett., American Chemical Society, vol. 4, 2004, pp. 433-436.
Wu et al., "Single-Crystal Metallic Nanowires and Metal/Semiconductor Nanowire Heterostructures", Nature, Nature Publishing Group, vol. 430, 2004, pp. 61-65.

(56) References Cited

OTHER PUBLICATIONS

Xiang et al., "Ge/Si Nanowire Heterostructures As High-Performance Field-Effect Transistors", Nature, Nature Publishing Group, vol. 441, 2006, pp. 489-493.
Yamada et al., "Analysis of Submicron Carbon Nanotube Field-Effect Transistors," Appl. Phys. Lett., American Institute of Physics, vol. 76, 2000, pp. 628-630.
Yamamoto et al., "Orientation and Purification of Carbon Nanotubes using AC Electrophoresis," J. Phys. D: Appl. Phys. 31 (1998) L34-L36, 3 pages.
Chung et al., "Silicon Nanowire Devices", Appl. Phys. Lett., American Institute of Physics, vol. 76, Feb. 2000, pp. 2068-2070.
Duan et al., "Nonvolatile Memory and Programmable Logic from Molecule-Gated Nanowires", Nano Lett., American Chemical Society, vol. 2, No. 5, 2002, pp. 487-490.
Qi et al., "Toward Large Arrays of Multiplex Functionalized Carbon Nanolube Sensors for Highly Sensitive and Selective Molecular Detection," Nano Lett., American Chemical Society, vol. 3, 2003, pp. 347-351.
Rueckes et al., "Carbon Nanotube-Based Nonvolatile Random Access Memory for Molecular Computing", Science, American Association for the Advancement of Science, vol. 298, 2000, pp. 94-97.
Wang et al., "SiO2-Enhanced Synthesis of Si Nanowires by Laser Ablation", Appl. Phys. Lett., American Institute of Physics, vol. 73, 1998, pp. 3902-3904.
Non-Final Office Action for U.S. Appl. No. 11/979,949, Martin et al., filed Sep. 9, 2007, mailed Sep. 11, 2009, 8 pages.
Non-Final Office Action for U.S. Appl. No. 11/979,949, Martin et al., filed Sep. 9, 2007, mailed Feb. 16, 2010, 15 pages.
Non-Final Office Action for U.S. Appl. No. 11/979,949, Martin et al., filed Sep. 9, 2007, mailed Aug. 2, 2010, 16 pages.
Final Office Action for U.S. Appl. No. 11/979,949, Martin et al., filed Sep. 9, 2007, mailed Dec. 30, 2010, 7 pages.
Hamers, et al., "Electrically directed assembly and detection of nanowire bridges in aqueous media", Nanotech (2006), 17:S280-S286.
First Non-Final Office Action for U.S. Appl. No. 09/935,776, Lieber, et al., filed Aug. 22, 2001, mailed Sep. 2, 2003, 13 pages.
First Final Office Action for U.S. Appl. No. 09/935,776, Lieber, et al., filed Aug. 22, 2001, mailed Sep. 15, 2004, 11 pages.
Second Non-Final Office Action for U.S. Appl. No. 09/935,776, Lieber, et al., filed Aug. 22, 2001, mailed Mar. 11, 2005, 10 pages.
Second Final Office Action for U.S. Appl. No. 09/935,776, Lieber, et al., filed Aug. 22, 2001, mailed Aug. 30, 2005, 10 pages.
Third Non-Final Office Action for U.S. Appl. No. 09/935,776, Lieber, et al., filed Aug. 22, 2001, mailed May 16, 2006, 6 pages.
First Non-Final Office Action for U.S. Appl. No. 10/020,004, Lieber, et al., filed Dec. 11, 2001, mailed Jan. 15, 2003, 5 pages.
First Final Office Action for U.S. Appl. No. 10/020,004, Lieber, et al., filed Dec. 11, 2001, mailed Jun. 25, 2004, 5 pages.
Second Non-Final Office Action for U.S. Appl. No. 10/020,004, Lieber, et al., filed Dec. 11, 2001, mailed Mar. 14, 2005, 4 pages.
Second Final Office Action for U.S. Appl. No. 10/020,004, Lieber, et al., filed Dec. 11, 2001, mailed Aug. 30, 2005, 5 pages.
First Non-Final Office Action for U.S. Appl. No. 10/196,337, Lieber, et al., filed Jul. 16, 2002, mailed Jun. 30, 2004, 9 pages.
First Final Office Action for U.S. Appl. No. 10/196,337, Lieber, et al., filed Jul. 16, 2002, mailed Jan. 3, 2005, 10 pages.
Second Non-Final Office Action for U.S. Appl. No. 10/196,337, Lieber, et al., filed Jul. 16, 2002, mailed May 25, 2005, 11 pages.
Second Final Office Action for U.S. Appl. No. 10/196,337, Lieber, et al., filed Jul. 16, 2002, mailed Feb. 23, 2006, 12 pages.
Third Non-Final Office Action for U.S. Appl. No. 10/196,337, Lieber, et al., filed Jul. 16, 2002, mailed Nov. 2, 2006, 13 pages.
First Non-Final Office Action for U.S. Appl. No. 10/734,086, Lieber, et al., filed Dec. 11, 2003, mailed Apr. 7, 2006, 10 pages.
Second Non-Final Office Action for U.S. Appl. No. 10/734,086, Lieber, et al., filed Dec. 11, 2003, mailed Oct. 27, 2006, 7 pages.
Non-Final Office Action for U.S. Appl. No. 10/995,075, Whang, et al., filed Nov. 22, 2004, mailed Nov. 29, 2005, 4 pages.
Non-Final Office Action for U.S. Appl. No. 11/012,549, Lieber, et al., filed Dec. 15, 2004, mailed Dec. 20, 2006, 9 pages.
Non-Final Office Action for U.S. Appl. No. 11/582,167, Lieber, et al., filed Oct. 17, 2006, mailed on Apr. 23, 2007, 9 pages.
Co-pending U.S. Appl. No. 11/485,893, inventors Lieber, et al., filed Jul. 13, 2006, 52 pages.
Co-pending U.S. Appl. No. 11/501,466 inventors Lieber, et al., filed Aug. 9, 2006, 164 pages.
Co-pending U.S. Appl. No. 11/543,746, inventors Lieber, et al., filed Oct. 4, 2006, 136 pages.
Co-pending U.S. Appl. No. 10/588,833, inventors Lieber, et al., filed Aug. 9, 2006, 65 pages.
Cheung et al., "Diameter Controlled Synthesis of Carbon Nanotubes", J. Phys. Chem. B, American Chemical Society, vol. 106, No. 10, Feb. 16, 2002, pp. 2429-2433.
Choi et al., "Enhancement of Ferroelectricity in Strained BaTiO3 Thin Films", Science, American Chemical Society, vol. 306, No. 5698, Nov. 2004, pp. 1005-1009.
Chung et al., "Silicon Nanowire Devices", Appl. Phys. Lett., American Institute of Physics, vol. 76, Feb. 2002, pp. 2068-2070.
Collier et al., "Electronically Configurable Molecular-Based Logic Gates", Science, American Association for the Advancement of Science, vol. 285, No. 5426, Jul. 1999, pp. 391-394.
Cui et al. "Doping and Electrical Transport in Silicon Nanowires", J. Phys. Chem. B, American Chemical Society, vol. 104, No. 22, May 2000, pp. 5213-5216.
Cui et al., "Diameter-Controlled Synthesis of Single-Crystal Silicon Nanowires", Appl. Phys. Lett., American Institute of Physics, vol. 78, 2001, pp. 2214-2216.
Cui et al., "Functional Nanoscale Electronic Devices Assembled Using Silicon Nanowire Building Blocks", Science, American Association for the Advancement of Science, vol. 291, No. 5505, Feb. 2001, pp. 851-853.
Cui et al., "Nanowire Nanosensors for Highly Sensitive and Selective Detection of Biological and Chemical Species" Science, American Chemical Society, vol. 293, No. 5533, Aug. 2001, pp. 1289-1292.
Duan et al., "Synthesis and Optical Properties of Gallium Arsenide Nanowires", Appl. Phys. Lett., American Institute of Physics, vol. 76, 2000, pp. 1116-1118.
Duan et al., "Indium Phosphide Nanowires as Building Blocks for Nanoscale Electronic and Optoelectronic Devices", Nature, Nature Publishing Group, vol. 409, Jan. 4, 2001, pp. 66-69.
Duan et al., "General Synthesis of Compound Semiconductor Nanowires", Adv. Mater., WILEY-VCH, vol. 12, No. 4, Feb. 2000, pp. 298-302.
Duan et al., "High-Performance Thin-Film Transistors Using Semiconductor Nanowires and Nanoribbons", Nature, Nature Publishing Group, vol. 425, Sep. 2003, pp. 274-278.
Duan et al., "Laser-Assisted Catalytic Growth of Single Crystal GaN Nanowires", J. Am. Chem. Soc., American Chemical Society, vol. 122, 2000, pp. 188-189.
Duan et al., "Nonvolatile Memory and Programmable Logic from Molecule-Gated Nanowires", Nano Lett., American Chemical Society, vol. 2, No. 5, 2002, pp. 5487-5490.
Duan et al., "Single-Nanowire Electrically Driven Lasers", Nature, Nature Publishing Group, vol. 421, Jan. 2003, pp. 241-245.
Esfarjani et al., "Electronic and Transport Properties of N—P Doped Nanotubes", Appl. Phys. Lett., American Institute of Physics, vol. 74, 1999, pp. 79-81.
Fan et al., "Precision Transport and Positioning of Nanowires by Electric Fields", 2007 MRS Fall Meeting, Abstract JJ5.3, Nov. 2007.
Friedman et al., "High-Speed Integrated Nanowire Circuits", Nature, Nature Publishing Group, vol. 434, Apr. 2005, 1085.
Givargizov, E.I., "Fundamental Aspects of VLS Growth", J. Crystal Growth, vol. 31, Dec. 1975, pp. 20-30.
Gradecak, F., et al., "GaN Nanowire Lasers with Low Lasing Thresholds", Appl. Phys. Lett., American Institute of Physics, vol. 87, 2005, 173111.
Gudiksen et al., "Diameter-Selective Synthesis of Semiconductor Nanowires", J. Am. Chem. Soc., American Chemical Society, vol. 122, 2000, pp. 8801-8802.

(56) References Cited

OTHER PUBLICATIONS

Gudiksen et al., "Growth of Nanowire Superlattice Structures for Nanoscale Photonics and Electronics", Nature, Nature Publishing Group, vol. 415, Feb. 2002, pp. 617-620.
Gudiksen, et al., "Size-Dependent Photoluminescence from Single Indium Phosphide Nanowires" J. Phys. Chem. B, American Chemical Society, vol. 106, No. 16, Mar. 30, 2002, pp. 4036-4039.
Gudiksen et al., "Synthetic Control of the Diameter and Length of Single Crystal Semiconductor Nanowires" J. Phys. Chem. B, American Chemical Society, vol. 105, Apr. 18, 2001, pp. 4062-4064.
Guo et al., "A Silicon Single-Electron Transistor Memory Operating at Room Temperature", Science, Science Publishing Group, vol. 275, No. 5300, Jan. 1997, pp. 649-651. (1997).
Guo et al., "Nanoscale Silicon Field Effect Transistors Fabricated Using Imprint Lithography", Appl. Phys. Lett., American Chemical Society, vol. 71, 1997, pp. 1881-1883.
Hahm et al., "Direct Ultrasensitive Electrical Detection of DNA and DNA Sequence Variations Using Nanowire Nanosensors", Nano. Lett., American Chemical Society, vol. 4, No. 1, Dec. 9, 2003, pp. 51-54.
Haraguchi et al., "GaAs p-n Junction Formed in Quantum Wire Crystals", Appl. Phys. Lett., American Institute of Physics, vol. 60, No. 6, Feb. 1992, pp. 745-747.
Haraguchi et al., "Polarization Dependence of Light Emitted From GaAs p-n Junctions in Quantum Wire Crystals," J. Appl. Phys., American Institute of Physics, vol. 75, No. 8, Apr. 1994, pp. 4220-4225.
Heath, J., et al., "A Liquid Solution Synthesis of Single Crystal Germanium Quantum Wires", Chem. Phys. Lett, vol. 208, No. 3-4, Jun. 1993, pp. 263-265.
Hiruma et al., "GaAs Free-Standing Quantum-Size Wires," J. Appl. Phys., American Institute of Physics, vol. 74, 1993, pp. 3162-3171.
Hiruma et al., "Self-organized growth of GaAs/InAs heterostructure Nanocylinders by Organometallic Vapor Phase Epitaxy", J. Crystal Growth, vol. 163, No. 3, Jun. 1996, pp. 226-231.
Holmes et al., "Control of Thickness and Orientation of Solution-Grown Silicon Nanowires", Science, American Association for the Advancement of Science, vol. 287, No. 5457, Feb. 2000, pp. 1471-1473.
Hsu et al. "MFMox Ferroelectric Memory Transistor", Non-Volatile Memory Technology Symposium, Electron Devices Society,Nov. 2004, pp. 24-27.
Hu et al., "Chemistry and Physics in One Dimension: Synthesis and Properties of Nanowires and Nanotubes", Acc. Chem. Res., American Chemical Society, vol. 32, No. 5, 1999, pp. 435-445.
Hu et al., "Controlled Growth and Electrical Properties of Heterojunctions of Carbon Nanotubes and Silicon Nanowires", Nature, Nature Publishing Group, vol. 399, Mar. 1999, pp. 48-51.
Hu et al., "Serpentine Superlattice nanowire-Array Lasers", Quant. Elect., Journal of IEEE, vol. 31, No. 8, Aug. 1995, pp. 1380-1388.
Huang et al., "Room-Temperature Ultraviolet Nanowire Nanolasers", Science,American Association for the Advancement of Science, vol. 292, No. 5523, Jun. 2001, pp. 1897-1898.
Huang et al., "Directed Assembly of One-dimensional Nanostructures into Functional Networks", Science, American Association for the Advancement of Science, vol. 291, No. 5504, Jan. 2001, pp. 630-633.
Huang et al., "Gallium Nitride Nanowire Nanodevices", Nano. Lett., American Chemical Society, vol. 2, No. 2, Jan. 11, 2002, pp. 101-104.
Huang et al., "Logic Gates and Computation from Assembled Nanowire Building Blocks", Science, American Association for the Advancement of Science, vol. 294, No. 5545, Nov. 2001, pp. 1313-1317.
Javey et al., "Ballistic Carbon Nanotube Field-Effect Transistors", Nature, Nature Publishing Group, vol. 424, Aug. 2003, pp. 654-657. (2003).
Jin et al., "Scalable Interconnection and Integration of Nanowire Devices without Registration" Nano. Lett., American Chemical Society, vol. 4, No. 5, Apr. 10, 2004, pp. 915-919.
Johnson et al., "Single Gallium Nitride Nanowire Lasers", Nat. Mater., Nature Publishing Group, vol. 1, 2002, pp. 106-110, (2002).
Johnson et al., "Single Nanowire Lasers" J. Phys. Chem. B., American Chemical Society, vol. 105, No. 46, Oct. 23, 2001, pp. 11387-11390.
Joselevich et al., "Vectorial Growth of Metallic and Semiconducting Single-Wall Carbon Nanotubes", Nano. Lett., American Chemical Society, vol. 2, No. 10, Aug. 30, 2002, pp. 1137-1141.
Kanjanachvchel et al., "Coulomb Blockage in Strained-Si Nanowires on Leaky Virtual Substrates", Semi. Sci. Technol., vol. 16, No. 2, 2001, pp. 72-76.
Kong et al., "Chemical Vapor Deposition of Methane for Single-Walled Carbon Nanotubes", Chem. Phys. Lett., vol. 292, No. 4-6, Aug. 1998, pp. 567-574.
Kong et al., "Nanotube Molecular Wires as Chemical Sensors", Science, American Association for the Advancement of Science, vol. 287, No. 5453, Jan. 2000, pp. 622-625.
Kong et al., "Synthesis of Individual Single-Walled Carbon Nanotubes on Patterned Silicon Wafers", Nature, Nature Publishing Group, vol. 395, Oct. 1998, pp. 878-881.
U.S. Appl. No. 13/322,117 Restriction Requirement mailed Sep. 6, 2013, 7 pages.
Office Action Received for Japanese Patent Application No. 2012-513177, mailed on Sep. 24, 2013, 8 pages (3 pages of Japanese Office action and 5 pages of English translation).
International Search Report and Written Opinion received for PCT Application No. PCT/US2010/036065 mailed on Sep. 24, 2010, 15 pages.
Yang, P., "Wires on water", Nature, Nature Publishing Group, vol. 425, Sep. 2003, pp. 243-244.
Yang et al., "Controlled Growth of ZnO Nanowires and Their Optical Properties", Adv. Funct. Mater., Wiley VCH, vol. 12, No. 5, May 2002, pp. 323-331.
Yu et al., "Nanoscale Silicon Wires Synthesized Using Simple Physical Evaporation", Appl. Phys. Lett., American Institute of Physics, vol. 72, Jun. 1998, pp. 3458-3460.
Yun et al., "Ferroelectric Properties of Individual Barium Titanate Nanowires Investigated by Scanned Probe Microscopy", Nano Lett., American Chemical Society, vol. 2, Feb. 2002, pp. 447-450.
Zheng, G., "Synthesis and Fabrication of High-Performance n-Type Silicon Nanowire Transistors", Adv. Mater., Wiley-VCH, vol. 16, Issue 21, Nov. 2004, pp. 1890-1893.
Zheng et al., "Multiplexed Electrical Detection of Cancer Markers With Nanowire Sensor Arrays", Nat. Biotechnol., Nature Publishing Group, vol. 23, Sep. 2005, 1294-1301.
Zhong, Z., "Coherent Single Charge Transport in Molecular-Scale Silicon Nanowires", Nano. Lett., American Chemical Society, vol. 5, Apr. 2005, pp. 1143-1146.
Zhong et al., "Nanowire Crossbar Arrays as Address Decoders for Integrated Nanosystems", Science, American Association for the Advancement of Science, vol. 302, No. 5649, Nov. 2003, pp. 1377-1379.
Zhong et al., "Synthesis of p-Type Gallium Nitride Nanowires for Electronic and Photonic Nanodevices", Nano Lett., American Chemical Society, vol. 3, Feb. 2003, pp. 343-346.
Zhou et al., "Growth Morphology and Micro-Structural Aspects of Si Nanowires Synthesized by Laser Ablation", J. Cryst. Growth, North-Holland, vol. 197, Issues 1-2, Feb. 1999, pp. 129-135.
"IBM Creates World's Highest Performing Nanotube Transistors", IBM News, http://www.ibm.com/news/us/en/ (2002), 5 pages.
International Search Report for PCT Patent Application No. PCT/US01/48230, mailed on Oct. 15, 2002, 3 pages.
International Search Report for PCT Patent Application No. PCT/US03/22753, mailed on Nov. 17, 2003, 4 pages.
International Search Report for PCT Patent Application No. PCT/US03/22061, mailed on Jun. 22, 2004, 3 pages.
International Search Report for PCT Patent Application No. PCT/US2005/004459, mailed on Aug. 29, 2005, 4 pages.
International Search Report for PCT Patent Application No. PCT/US2005/020974, mailed on Feb. 6, 2006, 3 pages.
International Search Report for PCT Patent Application No. PCT/US2005/026759, mailed on Jun. 6, 2006, 6 pages.

(56) References Cited

OTHER PUBLICATIONS

International Search Report for PCT Patent Application No. PCT/US2005/034345, mailed on Feb. 19, 2007, 4 pages.
Written Opinion for PCT Patent Application No. PCT/US01/48230, mailed on Mar. 10, 2003, 5 pages.
International Preliminary Examination Report for PCT Patent Application No. PCT/US01/48230, completed on May 20, 2003, 11 pages.
Written Opinion for PCT Patent Application No. PCT/US2005/004459, issued on Aug. 14, 2006, 5 pages.
International Preliminary Report on Patentability for PCT Patent Application No. PCT/US2005/020974, issued on Dec. 20, 2006, 16 pages.
Written Opinion for PCT Patent Application No. PCT/US2005/020974, issued on Dec. 20, 2006, 7 pages.
Written Opinion for PCT Patent Application No. PCT/US2005/026759, issued Jan. 30, 2007, 10 pages.
Invitation to Pay Additional Fees for PCT Patent Application No. PCT/US05/044212, mailed on Apr. 24, 2007, 5 pages.
Written Opinion for PCT Patent Application No. PCT/US2005/034345, issued Dec. 6, 2007, 7 pages.
Beckman et al., "Bridging Dimensions: Demultiplexing Ultrahigh-Density Nanowire Circuits", Science, vol. 310, No. 5747, Oct. 2005, pp. 465-468.
Bjork et al., "One-dimensional Steeplechase for Electron Realized", NanoLett, vol. 2, Jan. 2002, pp. 87-89.
Cao et al., "Growth and Properties of Semiconductor Core/Shell Nanocrystals with InAs Cores", J. Am. Chem. Soc., vol. 122, 2000, pp. 9692-9702.
Castellanos et al., "Electrohydrodynamics and Dielectrophoresis in Microsystems: Scaling Laws", J. Phys. D. Appl. Phys., vol. 36, 2003, pp. 2584-2597.
Dabbousi et al., "(CdSe)ZnS Core-Shell Quantum Dots: Synthesis and Characterization of a Size Series of Highly Luminescent Nanocrystallites", J. Phys. Chem. B., vol. 101, 1997, pp. 9463-9475.
Fan et al., "Manipulation Nanowires in Suspension by Ac Electric Fields", Appl. Phys. Lett., vol. 85, 2004, pp. 4175-4177.
Guru et al., "Chapter 10: Waveguides and Cavity Resonators in Electromagnetic Field Theory Fundamentals", PWS Publishing Company, Boston, MA, 1998, pp. 433-472.
Hu et al., "Electric-Field-Driven Accumulation and Alignment of Cdse and Cdte Nanorods in Nanoscale Devices", Nano Lett, vol. 6, 2006, pp. 2585-2591.
Jun et al., "Controlled Synthesis of Multi-Armed Cds Nanorod Architectures Using Monosurfactant System", J. Am. Chem. Soc., vol. 123, 2001, pp. 5150-5151.

Liu et al., "Sol-Gel Synthesis of Free-Standing Ferroelectric Lead Zirconate Titanate Nanoparticles", J. Am. Chem. Soc., vol. 123, Apr. 2001, pp. 4344-4345.
Lu et al., "Controlled Deposition of Nanotubes on Opposing Electrodes", Nanotech, vol. 16, No. 9, 2005, pp. 1765-1770.
Manna et al., "Synthesis of Soluble and Processable Rod-, Arrow-, Teardrop, and Tetrapod-Shaped Cdse Nanocrystals", J. Am. Chem. Soc., vol. 122, No. 51, Dec. 2000, pp. 12700-12706.
Manna et al., "Epitaxial Growth and Photochemical Annealing of Graded Cds/Zns Shells on Colloidal Cdse Nanorods", J. Am. Chem. Soc., vol. 124, No. 24, 2002, pp. 7136-7145.
Peng et al., "Epitaxial Growth of Highly Luminescent Cdse/Cds Core/Shell Nanocrystals With Photostability and Electronic Accessibility", J. Am. Chem. Soc., vol. 119, No. 30, Jul. 1997, pp. 7019-7029.
Peng et al., "Shape Control of CdSe Nanocrystals", Nature, vol. 404, Mar. 2000, pp. 59-61.
Puntes et al., "Colloidal Nanocrystal Shape and Size Control: The case of cobalt", Science, vol. 291, No. 5511, Mar. 2001, pp. 2115-2117.
Smith et al., "Electric-Field Assisted Assembly and Alignment of Metallic Nanowires", Appl. Phys. Lett., vol. 77, 2000, pp. 1399-1401.
Urban et al., "Synthesis of Single-Crystalline Perovskite Nanowires Composed of Barium Titanate and Strontium Titanate", J. Am. Chem. Soc., vol. 124, 2002, pp. 1186-1187.
International Search Report for International Application No. PCT/US07/23625, mailed on Jul. 11, 2008, 4 pages.
Written Opinion for International Application No. PCT/US07/23625, mailed on Jul. 11, 2008, 10 pages.
International Preliminary Report on Patentability received for PCT Application No. PCT/US10/036065 mailed on Dec. 8, 2011, 8 pages.
Agarwal et al., "Lasing in Single Cadmium Sulfide Nanowire Optical Cavities", Nano-Lett., American Chemical Society, vol. 5, Mar. 7, 2005, pp. 917-920.
Chen et al., "Large On-Off Ratios and Negative Differential Resistance in a Molecular Electronic Device", Science, American Association for the Advancement of Science, vol. 286, Nov. 1999, pp. 1550-1552.
Chen, R., et al., "Noncovalent Functionalization of Carbon Nanotubes for Highly Specific Electronic Biosensors", Proc. Natl. Acad. Sci. U.S.A., National Academy of Sciences, vol. 100, Apr. 2003, pp. 4984-4989.

\* cited by examiner

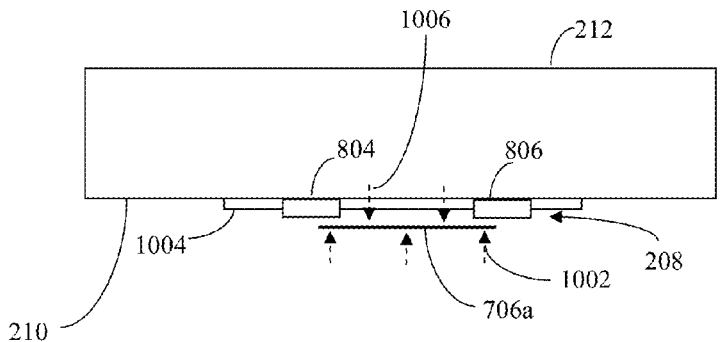

1102 — select a first solvent having properties that enable dielectrophoretic pinning of nanowires on electrodes of a substrate without the nanowires sticking to the substrate 1104 — select a second solvent having properties that enable the nanowires to lock to the substrate 1106 — flow a first suspension that includes the first solvent and the nanowires over the substrate to enable the nanowires to be pinned to the substrate 1108 — flow a second suspension that includes the second solvent over the substrate to enable the nanowires to lock to the substrate 1110 — dry the substrate

SHEAR STRESS $= \tau = \eta \frac{dv}{dy} = \eta \frac{v}{\delta}$

| $\delta$, mm | dv/dy, 1/s |
|---|---|
| 0.01 | 1000 |
| 0.1 | 100 |
| 1 | 10 |
| 10 | 1 |

← SHEAR RATE IN FLOW CELL IS 10-20 1/s

FIG. 44
4400

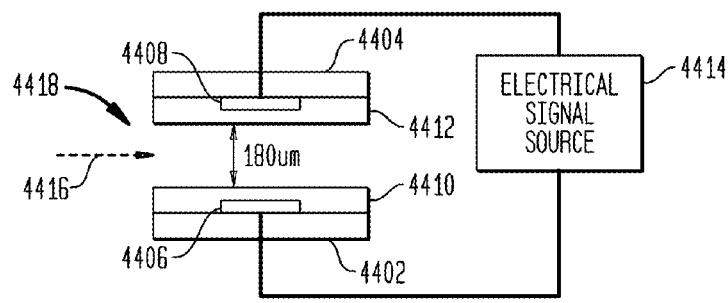

FIG. 45
4500

4502
FLOW A SUSPENSION THAT INCLUDES A PLURALITY OF NANOWIRES THROUGH AN ENCLOSED FLOW CHANNEL HAVING OPPOSING FIRST AND SECOND SURFACES, THE FIRST INCLUDING A FIRST ELECTRODE PAIR THAT INCLUDES A FIRST ELECTRODE AND A SECOND ELECTRODE, AND THE SECOND SURFACE INCLUDING A SECOND ELECTRODE PAIR THAT INCLUDES A THIRD ELECTRODE AND A FOURTH ELECTRODE

4504
GENERATE AN ALTERNATING CURRENT (AC) ELECTRIC FIELD WITH THE FIRST AND SECOND ELECTRODE PAIRS TO IMPOSE A NET FORCE IN A DIRECTION NORMAL TO THE FIRST AND SECOND SURFACES ON AT LEAST ONE NANOWIRE IN THE SUSPENSION

4800

4900

6200

6202
form a first electrode and a second electrode of an electrode pair to be coaxially aligned on a surface of a substrate, the first electrode having a first end and the second electrode having a second end that are adjacently positioned and separated by a first distance, the first end and the second end each being non-square shaped 6204
receive an electrical signal at the electrode pair to generate an electric field to associate at least one nanowire from a suspension with the electrode pair 6206
lock the at least one nanowire to the surface of the substrate

6302
flow a suspension that includes a plurality of nanowires through a flow channel having a first surface, the first surface including an electrode pair that includes a first electrode and a second electrode 6304
generate an AC electric field with the electrode pair to associate at least one nanowire of the suspension with the electrode pair 6306
generate a second electric field with at least one electrical conductor to attract excess nanowires from the first surface of the flow channel

FIG. 63

Id-Vg PLOTS FOR NANOWIRE TRANSISTORS

Vt DISTRIBUTION FOR NANOWIRE TRANSISTORS

METHODS AND SYSTEMS FOR ELECTRIC FIELD DEPOSITION OF NANOWIRES AND OTHER DEVICES

This application is a divisional application of U.S. patent application Ser. No. 13/322,117, filed on Nov. 22, 2011, which is the U.S. national phase of international application PCT/US2010/036065 filed May 25, 2010, which designated the U.S. and claims priority to U.S. Provisional Application No. 61/181,229, filed on May 26, 2009, each of which is incorporated by reference herein in its entirety.

BACKGROUND OF THE INVENTION

1. Field of the Invention

The present invention relates to nanostructures, and more particularly, to methods and systems for the deposition of nanostructures and electrical devices.

2. Background of the Invention

Nanostructures, such as nanowires, have the potential to facilitate a whole new generation of electronic devices. A major impediment to the emergence of this new generation of electronic devices based on nanostructures is the ability to effectively align and deposit the nanostructures on various surfaces, such as substrates. Electric fields enable the alignment of nanowires suspended in a liquid, but current deposition techniques pose stringent constraints on their scalability to large area substrates. Likewise, current techniques for depositing electrical devices, such as integrated circuits, dies, optical components, etc., do not scale well to large area substrates.

What are needed are systems and methods for achieving a high quality deposition of nanostructures and other electrical devices that are suitable for manufacturing arrays of nanostructure-enabled electronic devices.

SUMMARY OF THE INVENTION

Methods, systems, and apparatuses related to nanostructure deposition are provided. Techniques are provided for deposition of nanostructures to electrodes, including depositing a single nanostructure to an electrode pair, depositing a pair of nanostructures to an electrode pair, and/or depositing other desired numbers of nanostructures to an electrode pair. Furthermore, nanostructures may be deposited to any number of electrode pairs, including single electrode pairs, as well as to a plurality of electrode pairs organized in an array on a substrate panel.

For example, in a first implementation, a technique for deposition of nanostructures to the surface of a substrate is provided. A first solvent is selected having properties that enable dielectrophoretic pinning of nanowires on electrodes of a substrate without the nanowires sticking to the substrate. A second solvent is selected having properties that enable the nanowires to lock to the substrate. A first suspension that includes the first solvent and the nanowires is flowed over the substrate to enable the nanowires to be pinned to the substrate. A second suspension that includes the second solvent is flowed over the substrate to enable the nanowires to lock to the substrate. The substrate is dried.

In another implementation, a technique for deposition of nanostructures to the surface of a substrate is provided. The surface of the substrate is provided in a first orientation. The surface includes an electrode pair that includes a first electrode and a second electrode. A suspension that includes a plurality of nanowires is flowed over the surface of the substrate. An electric field is generated with the electrode pair to associate at least one nanowire from the suspension with the electrode pair. The surface of the substrate is flushed in the first orientation to remove excess nanowires. The substrate is rotated into a second orientation. The surface of the substrate is flushed in the second orientation to remove excess nanowires.

In another implementation, a deposition system includes an enclosed flow channel, an inlet port, and an electrical signal source. The enclosed flow channel has a first surface that includes an electrode pair that includes a first electrode and a second electrode. The inlet port is configured to provide a flow of a suspension into the channel. The suspension includes a plurality of nanowires. The enclosed flow channel is capable of being positioned in a first orientation to enable the suspension to flow over the first surface. An electrical signal source is coupled to the electrode pair that is configured to generate an electric field with the electrode pair to associate at least one nanowire from the suspension with the electrode pair. The inlet port provides a solution to flush the first surface of the enclosed flow channel in the first orientation to remove excess nanowires. The enclosed flow channel is configured to be rotatable into a second orientation. The inlet portion provides a solution to flush the first surface of the enclosed flow channel in the second orientation to remove excess nanowires.

In another implementation, a nanostructure deposition system is provided. The system includes a bounding surface, a transport mechanism, and a plurality of panel processing stages or zones. The bounding surface is configured to receive a target panel having a plurality of electrode pairs on a surface of the target panel. Each electrode pair is configured to receive at least one nanowire. The transport mechanism is configured to convey the target panel over the bounding surface at a predetermined velocity. Each panel processing zone is configured to perform a respective process to a portion of the surface of the target panel. The transport mechanism is configured to convey the target panel through the plurality of panel processing zones.

In another implementation, a technique for deposition of nanostructures is provided. A target panel having a plurality of electrode pairs on a surface of the target panel is received at a bounding surface. Each electrode pair is configured to receive at least one nanowire. The target panel is conveyed over the bounding surface at a predetermined velocity through a plurality of panel processing stages or zones. The target panel is processed at each panel processing zone of the plurality of panel processing zones. Each panel processing zone is configured to perform a respective process to a portion of the surface of the target panel.

In another implementation, a deposition system includes an enclosed flow channel, a dielectric material, an inlet port, and an alternating current (AC) electrical signal source. The enclosed flow channel has opposing first and second surfaces. The first surface includes a first electrode pair that includes a first electrode and a second electrode. The second surface includes a second electrode pair that includes a third electrode and a fourth electrode. The dielectric material coats the first electrode pair and the second electrode pair. The inlet port is configured to provide a flow of a suspension into the channel. The suspension including a plurality of nanowires. The AC electrical signal source is coupled to the first and second electrode pairs, and is configured to generate an AC electric field with the first and second electrode pairs to impose a net force in a direction normal to the first and second surfaces on at least one nanowire in the suspension.

In another implementation, a deposition system includes an enclosed flow channel, an electrical conductor, an inlet port, and an AC electrical signal source. The enclosed flow channel has a first surface. The first surface including an electrode pair that includes a first electrode and a second electrode. The inlet port is configured to provide a flow of a suspension into the channel. The suspension includes a plurality of nanowires. The AC electrical signal source is coupled to the electrode pair and the electrical conductor, and is configured to generate an AC electric field with the electrode pair and electrical conductor to impose a net force in a direction normal to the first surface on at least one nanowire in the suspension.

In another implementation, a technique for deposition of nanostructures to the surface of a substrate is provided. A suspension that includes a plurality of nanowires is flowed through an enclosed flow channel having opposing first and second surfaces. The first surface includes a first electrode pair that includes a first electrode and a second electrode, and the second surface includes a second electrode pair that includes a third electrode and a fourth electrode. An AC electric field is generated with the first and second electrode pairs to impose a net force in a direction normal to the first and second surfaces on at least one nanowire in the suspension.

In another implementation, a technique for deposition of nanostructures to the surface of a substrate is provided. A suspension that includes a plurality of nanowires is flowed through an enclosed flow channel having a first surface. The first surface includes an electrode pair that includes a first electrode and a second electrode. An electrical conductor is positioned in the enclosed flow channel. An AC electric field is generated with the electrode pair and electrical conductor to impose a net force in a direction normal to the first surface on at least one nanowire in the suspension.

In another implementation, a deposition system includes a substrate having a surface and an electrode pair. The electrode pair includes a first electrode and a second electrode that are coaxially aligned on the surface. The first electrode has a first end and the second electrode has a second end. The first end and the second end are adjacently positioned and separated by a first distance on the surface of the substrate. The electrode pair is configured to receive an electrical signal to generate an electric field to associate at least one nanowire with the electrode pair. The first end and the second end are each non-square shaped and are configured to enhance and guide nanowire positioning on the electrode pair.

In another implementation, a technique for deposition of nanostructures is provided. An electrical signal is received at a first electrode and a second electrode of an electrode pair that are coaxially aligned on a surface of a substrate to generate an electric field with the electrode pair to associate at least one nanowire from a suspension with the electrode pair. The first electrode has a first end and the second electrode has a second end. The first end and the second end are adjacently positioned and separated by a first distance on the surface of the substrate. The first end and the second end are each non-square shaped and are configured to enhance and guide nanowire positioning on the electrode pair. The at least one nanowire is locked to the surface of the substrate.

In another implementation, a deposition system includes a flow channel having a first surface, an inlet port, an electrode pair, and at least one electrical conductor. The inlet port is configured to provide a flow of a suspension into the channel. The suspension includes a plurality of nanowires. The electrode pair includes a first electrode and a second electrode on the first surface. The electrode pair is configured to receive a first electrical signal to generate a first electric field to associate at least one nanowire of the suspension with the electrode pair. The least one electrical conductor is configured to receive a second electrical signal to generate a second electric field to attract excess nanowires from the first surface of the flow channel.

In still another implementation, a technique for deposition of nanostructures to the surface of a substrate is provided. A suspension that includes a plurality of nanowires is flowed through a flow channel having a first surface. The first surface includes an electrode pair that includes a first electrode and a second electrode. An AC electric field is generated with the electrode pair to associate at least one nanowire of the suspension with the electrode pair. A second electric field is generated with at least one electrical conductor to attract excess nanowires from the first surface of the flow channel.

In still another implementation, a technique for deposition of nanostructures to the surface of a substrate is provided. A geometry of an electrode pair is configured to increase an operating window of a pinning voltage associated with the electrode pair. The electrode pair includes a first electrode and a second electrode on a surface of a flow channel. A suspension that includes a plurality of nanowires is flowed through the flow channel. A voltage having a value within the operating window is applied to the electrode pair to generate an AC electric field with the electrode pair to pin at least one nanowire from the suspension at the electrode pair.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

FIG. 10 shows forces acting upon a nanowire in a deposition system, according to an example embodiment.

FIG. 11 shows a flowchart providing a process for deposition of nanostructures, according to an embodiment.

FIG. 44 shows a side view of an enclosed flow channel that includes a substrate and a cover, according to an example embodiment.

FIG. 45 shows a flowchart providing a process for deposition of nanostructures, according to an embodiment.

FIG. 62 shows a flowchart providing example steps for deposition of nanostructures, according to example embodiments.

FIG. 63 shows a flowchart providing example steps for deposition of nanostructures, according to example embodiments.

Figure 1A:
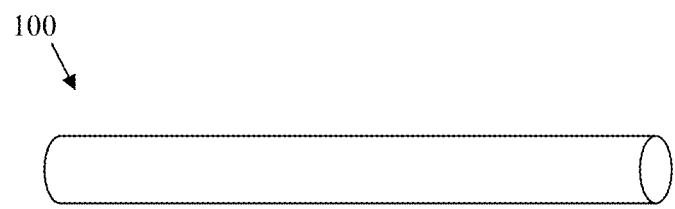
FIG. 1A is a diagram of a single crystal semiconductor nanowire.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

I. Introduction

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially mono crystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross-sectional dimension that is less than 500 nm, and preferably, equal to or less than less than about 100 nm, and has an aspect ratio (length:width) of greater than 10, preferably greater than 50, and more preferably, greater than 100. Exemplary nanowires for use in the practice of the methods and systems of the present invention are on the order of 10's of microns long (e.g., about 10, 20, 30, 40, 50 microns, etc.) and about 100 nm in diameter.

The nanowires of this invention can be substantially homogeneous in material properties, or in certain embodiments can be heterogeneous (e.g., nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g., over the central 20%, 40%, 50%, or 80% of the nanowire). A nanowire can be straight or can be e.g., curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P($BP_6$), B—Si, Si—C, Si—Ge, Si—Sn and Ge—Sn, SiC, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, (Cu, Ag)(Al, Ga, In, Tl, Fe)(S, Se, Te)$_2$, $Si_3N_4$, $Ge_3N_4$, $Al_2O_3$, (Al, Ga, In)$_2$ (S, Se, Te)$_3$, $Al_2CO$, and an appropriate combination of two or more such semiconductors.

The nanowires can also be formed from other materials such as metals such as gold, nickel, palladium, iridium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompasses the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom," "vertical," "horizontal," etc.) made herein are for purposes of illustration only, and that devices of the present invention can be spatially arranged in any orientation or manner.

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
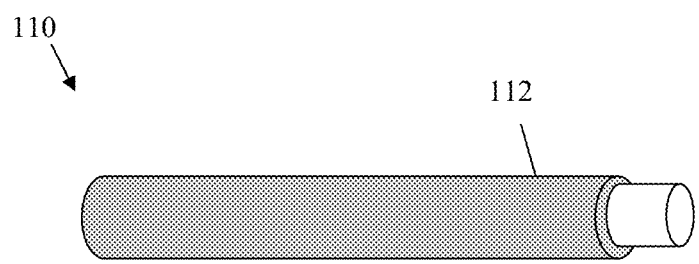
FIG. 1B is a diagram of a nanowire doped according to a core-shell (CS) structure.
Figure 1C:
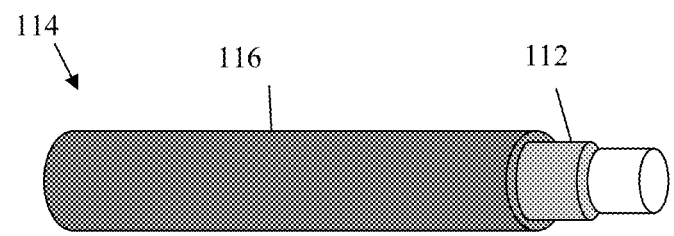
FIG. 1C is a diagram of a nanowire doped according to a core-shell-shell (CSS) structure.

FIG. 1B shows a nanowire 110 having a core-shell structure, with a shell 112 around the nanowire core. Surface scattering can be reduced by forming an outer layer of the nanowire, such as by the passivation annealing of nanowires, and/or the use of core-shell structures with nanowires. An insulating layer, such as an oxide coating, can be formed on a nanowire as the shell layer. Furthermore, for example, for silicon nanowires having an oxide coating, the annealing of the nanowires in hydrogen ($H_2$) can greatly reduce surface states. In embodiments, the core-shell combination is configured to satisfy the following constraints: (1) the shell energy level should be higher than the core energy level, so that the conducting carriers are confined in the core; and (2) the core and shell materials should have good lattice match, with few surface states and surface charges. Other more complex NW core-shell structures may also be used to include a core of single crystal semiconductor, an inner-shell of gate dielectric, and an outer-shell of conformal gate, such as shown in FIG. 1C. FIG. 1C shows a nanowire 114 having a core-shell-shell structure, with an inner shell 112 and outer shell 116 around the nanowire core. This can be realized by depositing a layer of TaAlN, WN, or highly-doped amorphous silicon around the Si/SiO$_x$ core-shell structure (described above) as the outer-gate shell, for example.

The valence band of the insulating shell can be lower than the valence band of the core for p-type doped wires, or the conduction band of the shell can be higher than the core for n-type doped wires. Generally, the core nanostructure can be made from any metallic or semiconductor material, and the one or more shell layers deposited on the core can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the one or more shell layers can comprise an oxide layer, a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials, which may in turn may be coated with one or more additional shell layers of the materials described above to form more complex core-shell-shell nanowire structures.

Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" Nature 404, 59-61; Puntes et al. (2001) "Colloidal nanocrystal shape and size control: The case of cobalt" Science 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" J. Am. Chem. Soc. 122, 8801-8802; Cui et al. (2001) "Diameter-controlled synthesis of single-crystal silicon nanowires" Appl. Phys. Lett. 78, 2214-2216; Gudiksen et al. (2001) "Synthetic control of the diameter and length of single crystal semiconductor nanowires" J. Phys. Chem. B 105, 4062-4064; Morales et al. (1998) "A laser ablation method for the synthesis of crystalline semiconductor nanowires" Science 279, 208-211; Duan et al. (2000) "General synthesis of compound semiconductor nanowires" Adv. Mater. 12, 298-302; Cui et al. (2000) "Doping and electrical transport in silicon nanowires" J. Phys. Chem. B 104, 5213-5216; Peng et al.

(2000) "Shape control of CdSe nanocrystals" Nature 404, 59-61; Puntes et al. (2001) "Colloidal nanocrystal shape and size control: The case of cobalt" Science 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" J. Am. Chem. Soc., 124, 1186; and Yun et al. (2002) "Ferroelectric Properties of Individual Barium Titanate Nanowires Investigated by Scanned Probe Microscopy" Nanoletters 2, 447.

Growth of branched nanowires (e.g., nanotetrapods, tripods, bipods, and branched tetrapods) is described in, e.g., June et al. (2001) "Controlled synthesis of multi-armed CdS nanorod architectures using monosurfactant system" J. Am. Chem. Soc. 123, 5150-5151; and Manna et al. (2000) "Synthesis of Soluble and Processable Rod-, Arrow-, Teardrop-, and Tetrapod-Shaped CdSe Nanocrystals" J. Am. Chem. Soc. 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" J. Am. Chem. Soc. 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" J. Am. Chem. Soc. 119, 7019-7029; Dabbousi et al. (1997) "(CdSe)ZnS core-shell quantum dots: Synthesis and characterization of a size series of highly luminescent nanocrysallites" J. Phys. Chem. B 101, 9463-9475; Manna et al. (2002) "Epitaxial growth and photochemical annealing of graded CdS/ZnS shells on colloidal CdSe nanorods" J. Am. Chem. Soc. 124, 7136-7145; and Cao et al. (2000) "Growth and properties of semiconductor core/shell nanocrystals with InAs cores" J. Am. Chem. Soc. 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" Nature 415, 617-620; Bjork et al. (2002) "One-dimensional steeplechase for electrons realized" Nano Letters 2, 86-90; Wu et al. (2002) "Block-by-block growth of single-crystalline Si/SiGe superlattice nanowires" Nano Letters 2, 83-86; and U.S. patent application 60/370,095 (Apr. 2, 2002) to Empedocles entitled "Nanowire heterostructures for encoding information." Similar approaches can be applied to growth of other hetero structures.

II. Example Embodiments for Deposition of Nanostructures

Embodiments for applying nanostructures, such as nanowires, and further electronic devices to surfaces are described in this section. Although embodiments are frequently described below in terms of "nanowires," such description is provided for purposes of illustration, and such embodiments are intended to be applicable to other types of nanostructures (e.g., nanotubes, etc.) and electronic devices.

In embodiments, one or more nanowires may be provided proximate to an electrode pair on a deposition surface. The electrode pair is energized, whereby the nanowires become associated with the electrode pair. Subsequently, the nanowires may be deposited from the electrode pairs to a destination surface, or may remain on the deposition surface for further processing.

The term "positioning" as used throughout refers to the alignment and association, as well as the deposition or coupling, of nanowires (and other nanostructures) onto a surface, for example, an electrode pair. Positioning includes nanowires that are both aligned and non-aligned. The term "aligned" nanowires as used throughout refers to nanowires that are substantially parallel or oriented in the same or substantially same direction of one another (e.g., the nanowires are aligned in the same direction, or within about 45° of one another). The nanowires of the present invention are aligned such that they are all substantially parallel to one another and substantially perpendicular to each electrode of an electrode pair (e.g., aligned parallel to an axis through both electrodes) (though in additional embodiments, they can be aligned parallel to an electrode). Positioning of nanowires onto an electrode pair includes positioning the nanowires such that the nanowires span the electrode pair. In embodiments in which the nanowires are longer than the distance separating two electrodes of an electrode pair, the nanowires may extend beyond the electrodes.

Techniques for providing nanowires for use in the embodiments described herein are well known in the art. For instance, in an embodiment, the nanowires may be provided in a suspension, which is a plurality of nanowires suspended in a liquid. In an embodiment, the liquid is an aqueous media, such as water or a solution of water, ions (including salts), and other components (e.g., surfactants). Additional examples of liquids suitable for preparing nanowire suspensions include, but are not limited, organic solvents, inorganic solvents, alcohols (e.g., isopropyl alcohol) (IPA), combinations of the same, etc.

As used herein the phrase "proximate to an electrode pair" as it relates to providing the nanowires means that the nanowires are provided or positioned such that they can be acted upon by an electric field generated at the electrode pair. This is a distance from the electrode pair such that they can be associated with the electrodes. In example embodiments, the nanowires are provided such that they are at distance of less than about 10 mm from the electrode pairs to be proximate to the electrode pair. In further examples, the nanowires may be provided such that they are less than about 100 µm, less than about 50 µm, or less than about 1 µm from the electrode pair to be proximate to the electrode pair.

Figure 2:
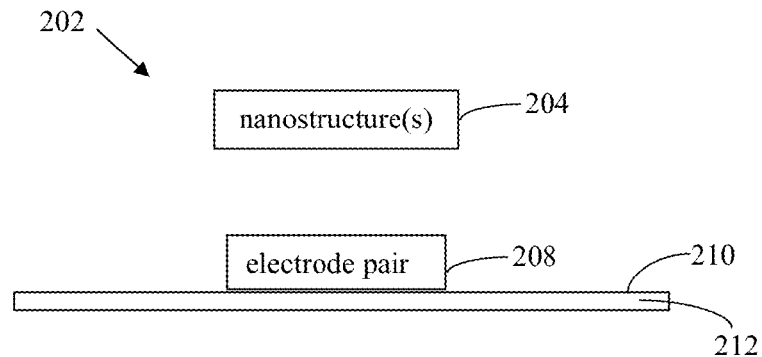
FIG. 2 shows a block diagram of a nanostructure deposition system, according to an example embodiment.

In embodiments, systems and/or apparatuses for nanostructure alignment and/or deposition are provided. For example, FIG. 2 shows a nanostructure deposition system 200, according to an example embodiment. As shown in FIG. 2, deposition system 200 includes a solution 202, nanostructure(s) 204, and a destination substrate 212. Substrate 212 has a surface 210, referred to as a "destination surface" for receiving nanostructure(s) 204. Electrode pair 208 is located on surface 210. Nanostructure(s) 204 are present in solution 202. Nanostructure(s) 204 are received by electrode pair 208 of surface 210 from solution 202, which may be a nanostructure ink (e.g., a nanowire ink), a nanostructure suspension (e.g., a nanowire suspension), etc. Nanostructure(s) 204 can include any of the nanostructure types mentioned elsewhere herein, including one or more nanowires. Further description of the components of deposition system 200 is provided further below.

Figure 3:
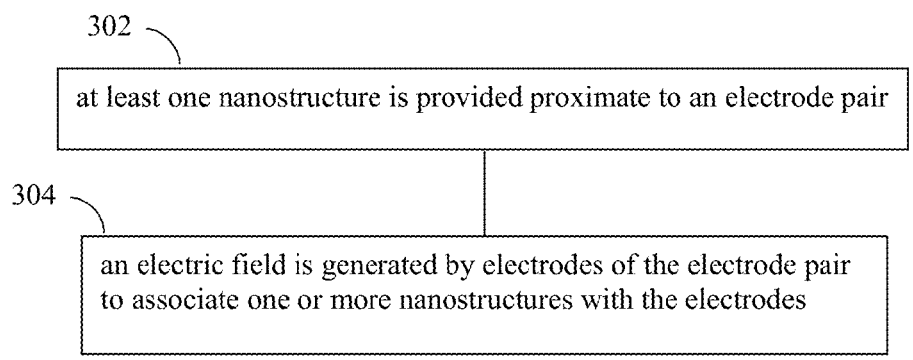
FIG. 3 shows a flowchart providing example steps for depositing nanostructures, according to example embodiments.

FIG. 3 shows a flowchart 300 providing example steps for depositing nanostructures, according to example embodiments. For example, nanostructure(s) 204 may be deposited from solution 202 to surface 210 according to flowchart 300. For illustrative purposes, flowchart 300 is described as follows with respect to FIGS. 2, 4, and 5, which show various block diagrams of embodiments. Other structural and operational embodiments will be apparent to persons skilled in the relevant art(s) based on the following discussion.

Flowchart 300 begins with step 302. In step 302, at least one nanostructure is provided proximate to an electrode pair. For example, as shown in FIG. 2, nanostructure(s) 204 are provided proximate to electrode pair 208. For instance, nanostructure(s) 204 may be present in solution 202, which flows over (or under) and in contact with electrode pair 208, to enable nanostructure(s) 204 to be positioned proximate to electrode pair 208. Alternatively, nanostructure(s) 204 may be provided proximate to electrode pair 208 in other ways.

Figure 4:
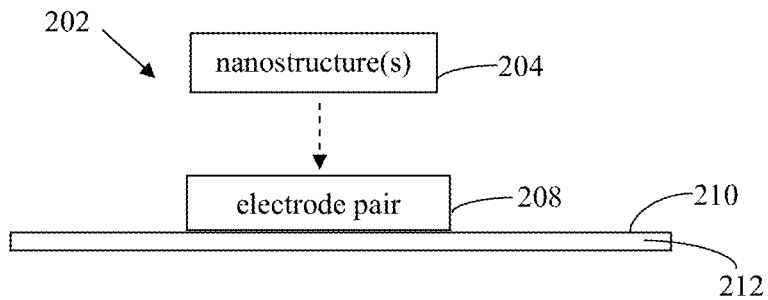
FIGS. 4 and 5 show block diagram views of the nanostructure deposition system of FIG. 2 during different phases of deposition, according to example embodiments.
Figure 5:
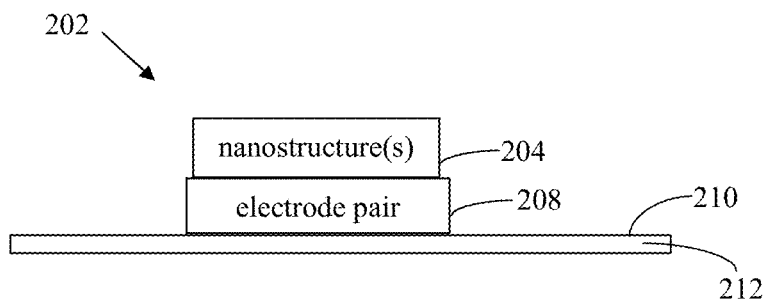

In step 304, an electric field is generated by electrodes of the electrode pair to associate one or more nanostructures with the electrodes. For instance, an electrical potential may be coupled to electrode pair 208 to generate an electric field. The electric field generated by electrode pair 208 may be used to associate nanostructure(s) 204 with electrode pair 208 that are proximately located to electrode pair 208. As shown in FIG. 4, nanostructure(s) 204 are attracted to electrode pair 208 due to the electric field. As shown in FIG. 5, nanostructures 204 are associated with electrode pair 208 (other nanostructures in solution 202 not shown in FIGS. 2, 4, and 5 may not be associated with electrode pair 208). In an embodiment, associated nanostructure(s) 204 are held suspended at a distance from surface 210 by the electric field. In another embodiment, associated nanostructure(s) 204 are held in contact with surface 210 by the electric field. Example embodiments for generating an electric field by an electrode pair to associate nanostructures are described in further detail below.

Substrate 212 may be a substrate or other structure onto which electrode pair 208 is formed (e.g., patterned, plated, etc.). Substrate 212 may be formed of any suitable material, such as a semiconductor wafer or dielectric material (e.g., a plastic or polymer, etc.). Example suitable materials include, but are not limited to Si, $SiO_2$, GaAs, InP, and other semiconductor materials described herein. Electrode pair 208 may include a first electrode and a second electrode. Exemplary materials for use as the first and second electrodes include, but are not limited to, Al (aluminum), Mo (Moly electrodes), Cu (copper), Fe (iron), Au (gold), Ag (silver), Pt (platinum), Cr/Au (chromium-gold), doped polysilicon, etc. Electrodes for use in the practice of embodiments can also further comprise an oxide coating or other layer on their surface, if desired. Any suitable orientation or pattern of first and second electrodes can be used.

Figure 6:
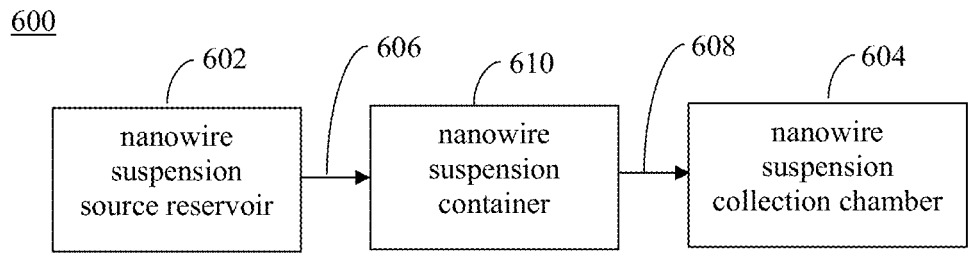
FIG. 6 shows a block diagram of a nanowire solution flow system, according to an example embodiment.

Nanostructures may be provided proximate to the first and second electrodes in a variety of ways according to step 302 of flowchart 300. In an embodiment, a container may receive a flow of solution 202 containing nanostructures. For instance, FIG. 6 shows a block diagram of a nanowire solution flow system 600, according to an example embodiment. As shown in FIG. 6, flow system 600 includes a nanowire suspension source reservoir 602, nanowire suspension container 610, and a nanowire suspension collection chamber 604. Nanowire suspension source reservoir 602 is a tank or other type of reservoir that contains a supply of a solution. Nanowires (and/or further nanostructures) may be introduced into solution in reservoir 602 to form the suspension, if desired. The solution may be any suitable type of liquid for containing nanowires, including water, isopropyl alcohol (IPA), other liquids described herein, any combination thereof, etc.

As shown in FIG. 6, nanowire suspension source reservoir 602 outputs a nanowire suspension flow 606 that is received by container 610. Nanowire suspension flow 606 may be supplied by reservoir 602 to container 610 by one or more flow channels, pipes, valves, etc. After enabling the suspension to interact with electrode pair 208, container 610 outputs a residual nanowire suspension flow 608 that is received by nanowire suspension collection chamber 604. Nanowire suspension collection chamber 604 is a tank or other type of reservoir. Residual nanowire suspension flow 608 received in chamber 604 may be filtered and/or supplied back to source reservoir 602 for recirculation through system 600, may have residual nanowires added to or recovered therefrom, may be discarded, etc.

Thus, in the embodiments described above, one or more nanostructures are provided by providing a suspension of nanostructures (e.g., a nanowire "ink") to electrode pair 208. As represented in FIG. 6, a nanowire suspension is provided by flowing a solution containing nanowires against an electrode pair on a surface. In an embodiment, as nanowires are provided, the suspension flow may help to align the nanowires in the direction of the flow.

Figure 7:
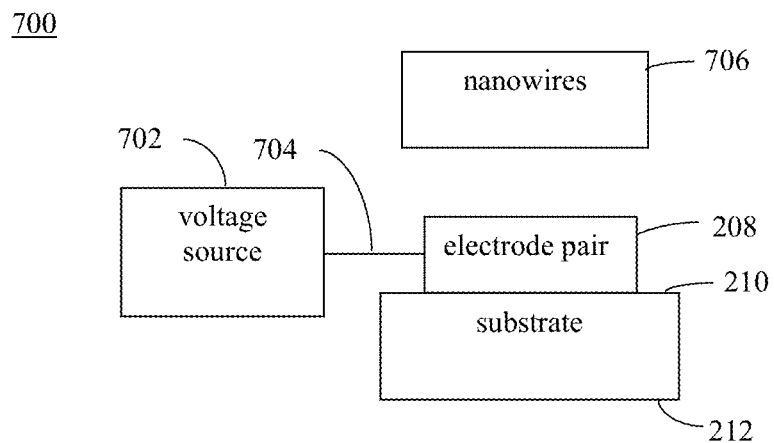
FIG. 7 shows an electric field generation system for a deposition system, according to an example embodiment.

An electric field may generated by electrodes of the electrode pair to associate one or more proximate nanostructures with the electrodes in a variety of ways according to step 304 of flowchart 300. For instance, FIG. 7 shows a nanowire deposition system 700 that can be used to perform step 304 of flowchart 300 (FIG. 3), according to an example embodiment. As shown in FIG. 7, system 700 includes a voltage source 702. Voltage source 702 is a signal/waveform generator coupled to electrode pair 208 by an electrical connection to provide an electrical signal 704. Voltage source 702 generates electrical signal 704 as a direct current (DC) and/or alternating current (AC) signal to cause electrode pair 208 to generate an electric field to associate one or more nanowires 706 with electrode pair 208.

Figure 8:
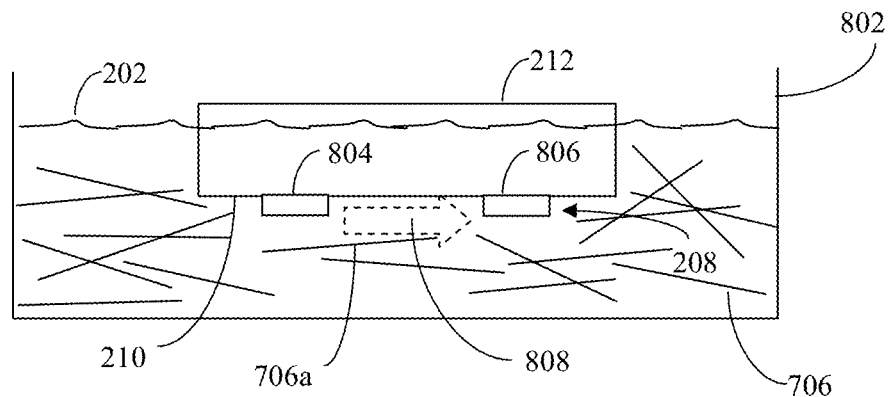
FIG. 8 shows a deposition system, where an electric field is generated to associate nanowires with an electrode pair, according to an example embodiment.

For instance, FIG. 8 shows an example deposition system 800, which is an example of deposition system 700 of FIG. 7. As shown in FIG. 8, system 800 includes a container 802, solution 202 (in and/or flowing through container 802), nanowires 706 (in solution 202), and substrate 212. In FIG. 8, substrate 212 is shown partially submerged (e.g., surface 210 facing downward) in solution 202, but in another embodiment, substrate 212 may be entirely submerged in solution 202 and/or may be oriented in other directions than shown in FIG. 8. An electric field 808, represented between first and second electrodes 804 and 806 by an arrow, is generated by application of a voltage to electrode pair 208 on substrate 212. Electric field 808 is generated between electrodes 804 and 806 of electrode pair 208 by energizing electrode pair 208 with electrical signal 704 to associate at least some of nanowires 706 with electrode pair 208. It should be noted that electric field 808 can be generated before, after, and/or during the period of nanowire producing/introduction into container 802. As used herein, the terms "electric field" and "electromagnetic field" are used interchangeably and refer to the force exerted on charged objects in the vicinity of an electric charge. As used herein, "energizing the electrode pair" refers to any suitable mechanism or system for providing an electric voltage/current to the electrodes such that an electric field is generated between electrodes of an electrode pair.

Energizing electrode pair 208 to generate electric field 808 can be performed during part or all of a nanowire alignment and deposition process, including step 304 of flowchart 300. In an example embodiment, electric field 808 is generated by coupling (e.g., using wires or other connection) first electrode 804 to a positive electrode terminal of voltage source 702, and coupling second electrode 806 to a negative electrode terminal of voltage source 702. When an electric current is switched on and supplied by electrical signal 704, the negative and positive terminals transfer charge to electrodes 804 and 806 positioned on surface 210, thereby generating electric field 808 between electrodes 804 and 806 of electrode pair 208. In embodiments, electric field 808 can be constant electric field, a pulsed electric field such as a pulsed AC electric field, or other electric field type.

The energizing of electrode pair 208 to create electric field 808 can also be caused by supplying an electromagnetic wave to electrode pair 208. As is well known in the art, waveguides of various dimensions and configurations (e.g., cylindrical, rectangular) can be used to direct and supply an electromagnetic wave (see e.g., Guru, B. S. et al., "Electromagnetic Field Theory Fundamentals," Chapter 10, PWS Publishing Company, Boston, Mass. (1998)). Operation frequencies of waveguides for use in the practice of embodiments are readily determined by those of skill in the art, and may be in the range of about 100 MHz to 10 GHz, about 1 GHz-5 GHz, about 2-3 GHz, about 2.5 GHz, or about 2.45 GHz, for example.

Figure 9:
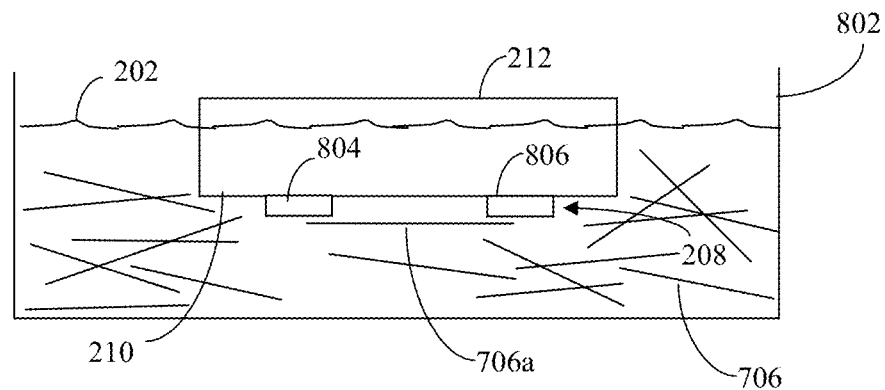
FIG. 9 shows the deposition system of FIG. 8, with an associated nanowire, according to an example embodiment.

As is further described below, as nanowires 706 encounter an AC electric field 808 generated between electrodes 804 and 806, a field gradient results. A net dipole moment is produced in proximate nanowires 706 (e.g., nanowire 706a in FIG. 8), and the AC field exerts a torque on the dipole, such that proximate nanowires align parallel to the direction of the electric field. For example, FIG. 9 shows nanowire 706a having been aligned by electric field 808 parallel to electric field 808 in association with electrode pair 208.

In embodiments, first and second electrodes 804 and 806 are separated by a distance that is less than, equal to, or greater than a long axis length of nanowires 706. Nanowires 706 of any length can be aligned and positioned using the methods described herein. In an embodiment, the distance between electrodes of an electrode pair is such that the nanowires extend just beyond an inner edge of one or both electrodes. In an embodiment, nanowires 706 extend just beyond an inner edge and into a middle of each electrode, with tens of nanometers to several microns overlapping the electrode material at the end of a nanowire 706. Nanowires 706 that are shorter than the distance between electrodes 804 and 806 may be able to couple to only one electrode in a pair (if they couple at all), and thus may be removed during subsequent removing phases if desired. Similarly, nanowires 706 that are substantially longer than the distance between electrodes 804 and 806 hang over/extend beyond one or more of electrodes 804 and 806, and may be removed during subsequent removing phases (e.g., because they have larger exposed surface area). Thus, this embodiment additionally provides a way to preferentially select nanowires 706 of a particular length from a suspension of a range of nanowire sizes, and align and deposit them onto an electrode pair 208. Embodiments may also associate and couple nanowires 706 that are "straight" rather than curved, bent, or crooked. Hence, such embodiments provide an added benefit of depositing preferably straight nanowires 706, rather than less preferred bent or crooked nanowires 706.

In addition to aligning the nanowires parallel to an AC electric field, the field gradient exerts a dielectrophoretic force on proximate nanowires 706, attracting them toward electrode pair 208. FIG. 10 shows a force 1002 attracting nanowire 706a towards electrode pair 208 of substrate 212. In an embodiment, force 1002 is a dielectrophoretic force. The gradient is highest at electrode pair 208, exerting an increasing attraction toward the electrodes. An electric double-layer is produced at the surface of each electrode of electrode pair 208, such that oppositely charged ions are present at each electrode. In the presence of electric field 808, the ions migrate away from each electrode and initially toward nanowire 706a hovering proximately nearby (e.g., above or below). As ions approach oppositely charged nanowire 706a, the ions are repulsed by the like charge and then directed back toward the respective electrode resulting in a circulating pattern of ions. Liquid that is present (i.e., the nanowire suspension, solution 202) is also circulated, generating an electroosmotic force that opposes the dielectrophoretic force attracting nanowire 706a to the electrodes. Thus, in an embodiment, a force 1006 shown in FIG. 10 may include an osmotic force.

Furthermore, in an embodiment, charge values of nanowires 706 and surface 210 affect association or pinning of nanowires to electrode pair 208. For example, FIG. 10 shows substrate 212 having associated nanowire 706a (additional nanowires not shown may also be associated). As shown in FIG. 10, surface 210 may have a layer 1004 that provides a surface charge to surface 210, such as an oxide layer. The charge polarity of layer 1004 can be selected to attract or repel nanowire 706a, as desired. For example, layer 1004 can provide a negative surface charge to surface 210 that results in a repulsive force on nanowire 706a, which may also have a negative surface charge (e.g., in isopropyl alcohol). Thus, force 1006 repelling nanowire 706a in FIG. 10 may include an electrostatic repulsive force that results from a same charge polarity of nanowire 706a and layer 1004.

As force 1002 and force(s) 1006 reach an equilibrium (or relative equilibrium), nanowire 706a is held in place such that it becomes associated with electrode pair 208 (e.g., even though nanowire 706a may be spaced apart from electrode pair 208 by a gap, not in contact with electrode pair 208 or surface 210). As used herein the terms "associated" and "pinned" are used to indicate that nanowires (such as nanowire 706a) are in such a state that the attractive and repulsive forces are at equilibrium, such that there is no or little net movement of the nanowires away from electrode pair 208 (i.e., normal or substantially normal to surface 210 and electrode pair 208). This is also called the "association phase" throughout. Nanowire 706a may be pinned or associated with nanowire 706a despite a flow of the nanowire suspension over electrodes 208 (e.g., in a direction perpendicular to force 1002), which exerts a drag on nanowire 706a, because the dielectrophoretic force attracts nanowire 706a to electrodes 208 in balance with the hydrodynamic force exerted on nanowire 706a due to the solution flow and the other repulsive forces between nanowire 706a and electrodes 208.

In the associated, or pinned state, the nanowires are aligned parallel to the electric field, but are sufficiently mobile along the electrode edges (i.e. in a plane just above the surface of the electrodes). Nanowires may be pinned at a distance from electrode pair 208. The amount of distance depends on a variety of factors, including a strength of the applied electric field 808, a frequency of electric field 808, a strength of charge of nanowires 706, a strength of charge of layer 1004, etc.

In the associated or pinned state, nanowires 706 are free to rearrange, migrate and/or align along the length of the electrodes 804 and 806. Nanowires 706 that are already substantially aligned with electric field 808 will tend to migrate along electrode pair 208 until contacting, and/or being repelled by, a nearest neighbor nanowire. Nanowires 706 that are not substantially aligned will tend to migrate such that they become aligned as they contact, and/or are repelled by, nearest neighbor nanowires, and an equilibrium between the various forces acting on nanowires 706 is reached. The lateral mobility (i.e., along electrode pairs 208, perpendicular to a direction of electric field 808) of nanowires 706 allows them to accommodate a chronological sequence of alignment and association events without giving rise to nanowire clumping. That is, as nanowires are continuously supplied to electrode pair 208 (i.e., from a suspension) additional nanowires are able to associate with the electrodes, as the nanowires that are previously associated are freely mobile such that they move out of the way to accommodate additional nanowires.

Subsequent to pinning or associating nanowire 706a with electrode pair 208, it may be desired to "lock" nanowire 706a on substrate 212 such that even if the electric field is removed, nanowire 706a remains on substrate 212. The solution flow may be reduced or completely stopped prior to locking, although this is not necessary. As described above, nanowire 706a may be repelled by surface 210 of substrate 212 (e.g., due to each being negatively charged), such that this electrostatic repulsion resists the dielectrophoretic force, which attracts nanowire 706a to surface 210. By increasing the voltage applied to electrode pair 208, and thereby increasing the electric field, the dielectrophoretic force becomes stronger, pulling nanowire 706a closer to surface 210 (against the electrostatic repulsion). At a critical distance, the van der Waals force, which is an attractive force between nanowire 706a and surface 210, becomes significant. The van der Waals forces are the intermolecular interactions that result when a spontaneous dipole in one molecule induces a dipole in a neighboring molecule causing a transient attraction between the two. The van der Waals force occurs at the atomic scale and is relatively weak. In nature, geckos and some insects use van der Waals interactions as a mode of adhesion. When nanowire 706a moves within a close distance (e.g., approximately 10 nm) to surface 710, the van der Waals force (with the dielectrophoretic force) overcomes the electrostatic repulsion between nanowire 706a and surface 710, and pulls nanowire 706a into contact with surface 210. At this point, nanowire 706a is considered to be "locked" to substrate 212 and/or electrode pair 208. Furthermore, at this point, the voltage applied to electrode pair 208 may be reduced to zero, removing the electric field (eliminating the dielectrophoretic force), and nanowire 706a remains adhering to surface 210 due to the van der Waals force.

Thus, in embodiments, nanostructures may be deposited on substrates using an electric field. Various system and process aspects may be modified, in embodiments, to enhance and/or improve aspects of nanostructure deposition. Further example embodiments for enhanced and/or improved nanostructure deposition are described in the following subsections. Such embodiments may be configured to deposit a single nanostructure (e.g., a single nanowire) to a corresponding electrode pair such that multiple nanostructures are not deposited to the electrode pair. Additionally or alternatively, embodiments may be configured to selectively deposit other numbers of nanostructure (e.g., two nanowires, three nanowires, etc.) to a corresponding electrode pair. Embodiments may be configured to deposit nanostructures to single electrode pairs on substrates and/or to a plurality of electrode pairs, such as electrode pairs in an electrode array on a substrate. Numerous embodiments related to the deposition of nanostructures are described herein. Although such embodiments may be described separately for purposes of illustration, such embodiments may be combined in any manner.

As will be understood by those having ordinary skill in the art, the systems and methods of the invention may involve a complex synergy of multiple competing parameters, as explained herein. The systems and methods contemplated by the invention include modification of these parameters to achieve the goals of the particular application. As explained below, major factors controlling nanowire deposition include the strength of the electric field, frequency, drive signal, solution flow rate and flow direction, the compositions and properties of the solvent, nanowires, and substrate; and competing forces in the system including dielectrophoretic, osmotic, electrophoretic, hydrodynamic, and gravitational forces. These and other parameters, as explained below, can be tailored to achieve the nanowire deposition requirements of a particular application. For example, multi-nanowire deposition will strongly depend on electric field strength relative to hydrodynamic drag, as well as the electrode width and applied voltage. As will be understood by those having ordinary skill in the art, the present invention encompasses system and method modifications to provide for the desired nanowire deposition, since such modifications may be necessary as certain system parameters will be unique for different applications of the invention.

Further parameters modified in certain embodiments of the invention include, for example, independent and relative charge values and polarity of nanowires, the nanowire solution, and the substrate surface; properties of the various solvents employed to allow for pinning and locking, including composition, pH level, flow rate, and flow direction; nanowire properties including composition, shape, size/dimensions, surface properties, polarity, polarizability, density, concentration in the solvent, mutual repulsion, and repulsion between nanowires and the substrate; electrode properties including quantity, geometry, shape, size/dimensions, spacing, uniformity, composition, and the pattern/arrangement of electrodes throughout the system. Novel parameters of the systems and methods of the invention will be explained in further detail below.

A. Multi-Solvent Techniques for Depositing Nanowires Using Dielectrophoresis

In an embodiment, a sequence of different solvents may be used during nanostructure deposition. Any number of one or more solvents may be applied during deposition. Each solvent may provide one or more properties that are advantageous in pinning the nanostructures to a surface, in locking the nanostructures to the surface, and/or in further aspects of the deposition process.

Nanowires suspended in a solvent may be made to orient and deposit onto electrodes on a substrate commensurate with nanowire dimensions. Electric field strength, drive signal, hydrodynamic dynamic forces, surface properties (dictated by the solvent), and nanowire properties are parameters that can be tuned to alter aspects of nanowire deposition. In one example of nanowire deposition to electrodes on a surface, the nanowires should cover over the electrodes during the deposition and be capable of being locked and stuck onto the surface. If the nanowires are sticky during deposition, such that the nanowires adhere randomly on the substrate, or do not lock to the substrate, the deposition process may not be successful.

In an embodiment, a sequence of solvents is used to deposit nanowires on a surface of a substrate. For example, FIG. 11 shows a flowchart 1100 providing a process for deposition of nanostructures, according to an embodiment. Other structural and operational embodiments will be apparent to persons skilled in the relevant art(s) based on the following discussion. Not all steps of flowchart 1100 are necessarily performed in all embodiments, and the steps of flowchart 1100 do not necessarily need to be performed in the order shown in FIG. 11.

Flowchart 1100 begins with step 1102. In step 1102, a first solvent is selected having properties that enable dielectrophoretic pinning of nanowires on electrodes of a substrate without the nanowires sticking to the substrate. Examples of a first solvent having properties that enable dielectrophoretic pinning of nanowires without sticking are described further below.

In step 1104, a second solvent is selected having properties that enable the nanowires to lock to the substrate. Examples of a second solvent having properties that enable nanowires locking are described further below In step 1106, a first suspension that includes the first solvent and the nanowires is flowed over the substrate to enable the nanowires to be pinned to the substrate. For example, the first suspension (including the first solvent selected in step 1102) may be flowed over a substrate in a similar manner as described further above to enable nanowire pinning.

In step 1108, a second suspension that includes the second solvent is flowed over the substrate to enable the nanowires to lock to the substrate. For example, the second suspension (including the second solvent selected in step 1104) may be flowed over a substrate in a similar manner as described further above to enable nanowire locking.

In step 1110, the substrate is dried. The substrate may be dried in any manner described elsewhere herein or otherwise known.

According to flowchart 1100, the first and second solvents are used in a nanostructure deposition process. The first solvent is flowed on the substrate to enable nanowires to be pinned to the substrate (step 1106). The properties of the first solvent (as selected in step 1102) that prevent the nanowires from sticking to the substrate may not allow the nanowires to lock onto the substrate during the deposition process. As such, during a drying process, without prior application of the second solvent, the nanowires may be moved from their desired locations, resulting in the nanowires being positioned improperly. To prevent the nanowires from moving (e.g., during the drying process), the second solvent may be selected (in step 1104) to have properties that enable the nanowires to lock to the substrate. The second solvent is used to replace the first solvent in the deposition process (in step 1108). The second solvent enables the nanowires to lock to the substrate.

For example, in an embodiment, nanowire solution flow system 600 shown in FIG. 6 may perform flowchart 1100. Referring to FIG. 6, nanowire suspension source reservoir 602 may be configured to provide suspension flow 606 to be a flow of nanowires suspended in the first solvent. For example, reservoir 602 may include a first solution source that provides the first solvent. Suspension flow 606 is received in nanowire suspension container 610, which may contain a substrate having electrodes for receiving nanowires (e.g., substrate 212). After pinning of nanowires to the substrate in container 610, nanowire suspension source reservoir 602 may be configured to provide suspension flow 606 to be a flow of nanowires suspended in the second solvent. For example, reservoir 602 may include a second solution source that provides the second solvent. Suspension flow 606 (containing the second solvent) is received in nanowire suspension container 610, and the nanowires are enabled to be locked to the substrate (e.g., through application of an electric field, etc., as described elsewhere herein).

For instance, in an embodiment, the first solvent may be mixture of IPA (isopropyl alcohol) and water in any relative proportion, including being anywhere in the range of 0.1-100% water ($H_2O$). For example, the first solvent may be a solution of 85% IPA and 15% water, which is used for deposition of nanowires in a deposition chamber (e.g., nanowire suspension container 610). The water included in the mixture with the IPA prevents the nanowires from sticking to the substrate. After a suitable number of nanowires are pinned to the electrodes, the deposition chamber may be rinsed of excess nanowires. After excess nanowires are rinsed from the deposition chamber, the nanowires may be locked to the surface by applying a high voltage. After the nanowires are locked to the surface, a second solvent of pure IPA (or other suitable second solvent) may be flushed through the deposition chamber. The deposition chamber may be configured to have fluid flow characteristics that enable relatively rapid removal of the first solvent. The second solvent of IPA may improve the adhesion and locking of the nanowires to the surface. The second solvent may subsequently be removed.

The first and second solvents may include one or more of various solutions, including water-alcohol mixtures, non-polar solvents, additives, etc. In an embodiment, a pure solvent with additive may be used (as the first solvent) to prevent sticking, which may be rinsed away after the nanowires are pinned (i.e., a polar solvent, a non-polar solvent, or alcohol with a surfactant). A concentration of the first and second solvents may be varied to select desired properties. For instance, solvents may be formed such that the nanowires act in a range of being strongly repelled from the substrate to being strongly attracted to the substrate. One or more chemicals can be added to solutions to form solvents configured across this range, including pH modifiers, salts, etc.

B. Techniques for Flushing Excess Nanowires after Deposition onto a Substrate

In an embodiment, gravity is leveraged to enable nanostructures such as nanowires, electronic devices such as chiplets, etc., to settle away from a deposition substrate to improve a rate and quality of the flushing of non-pinned nanostructures from the substrate.

For example, nanowire deposition may be performed by capturing the nanowire suspension or solution (also referred to as a "nanowire ink") onto a substrate using an electric field. In one implementation, deposition can be performed with the substrate below the nanowire ink such that the nanowires are enabled to settle downward toward the substrate surface. In this manner, gravity promotes a higher nanowire concentration near the surface, which speeds deposition and total loading of the electrodes. According to this configuration, however, nanowires can be difficult to flush from the surface, because the nanowires are very near the surface and the fluid velocity near the surface is very small. As such, a substrate flush stage can take 75% or more time of the entire deposition process. Any technique that enhances the substrate flush stage may greatly speed up the entire deposition process.

In an embodiment, an enclosed system is used for nanostructure deposition, where the deposition substrate makes up one of the larger walls of a high aspect (width/height) ratio channel. During deposition, the deposition substrate is on a bottom wall of the enclosed system/cell with electrodes exposed to a fluid/suspension that is forced to flow through the channel. Nanowires may be deposited directly from the fluid onto the electrodes via an AC electric field (dielectrophoresis). After the electrodes have been filled with nanowires, excess nanowires may be flushed from the cell. In one example flushing procedure, the system is flushed in a first flushing stage with the pure continuous phase constituent/constituents that make up the nanowire ink (e.g., a solvent with 85% IPA/15% H2O and no nanowires) in the regular configuration (same orientation as used for deposition). The flush time for the first flushing stage should be long enough such that a fluid element 10-20 $\mu$m from the surface traverses the entire channel length (approximately 10 minutes for a 100 mm long channel). Once the first flushing stage is complete, the flow in the channel is stopped and the system is inverted such that the deposition substrate makes up the upper boundary of the flow channel. Once inverted, nanowires near the surface will start to settle toward the center of the channel. After inverting, the flow is resumed for a second flushing stage, and the nanowires flush much more rapidly because the velocity greatly increases away from the wall. This procedure can reduce flush time by an order of magnitude.

Various parameters may be modified, including system geometry and size, nanowire type, ink solvent, deposition substrate. Embodiments may be implemented in a stamping system.

Figure 12A:
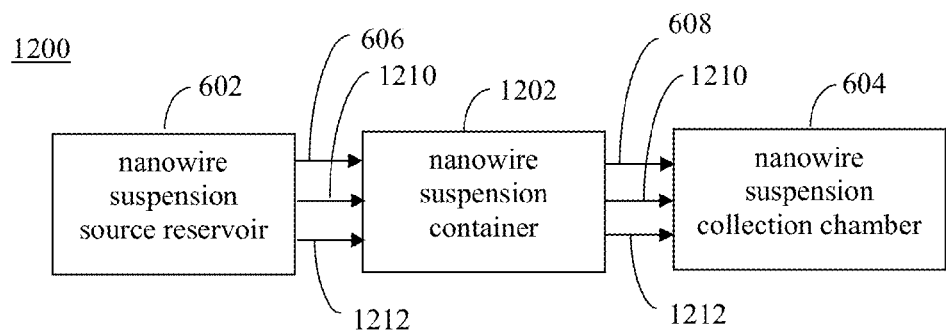
FIG. 12A shows a block diagram of a nanowire solution flow system that enables inverted flushing, according to an example embodiment.

For instance, FIG. 12A shows a block diagram of a nanowire solution flow system 1200 that enables inverted flushing, according to an example embodiment. Flow system 1200 is similar to flow system 600 of FIG. 6. As shown in FIG. 12A, flow system 1200 includes nanowire suspension source reservoir 602, an invertible nanowire suspension chamber or container 1202, and nanowire suspension collection chamber 604. Invertible nanowires suspension container 1202 may be oriented in more than one direction during a deposition process to assist in nanostructure deposition and flushing.

Figure 12B:
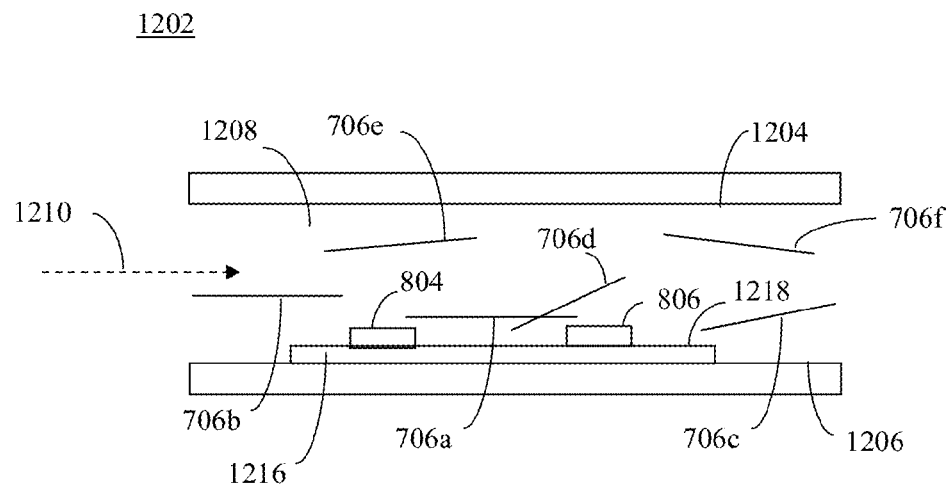
FIG. 12B shows a cross-sectional view of a portion of an invertible nanowire suspension container according to an example embodiment.
Figure 12C:
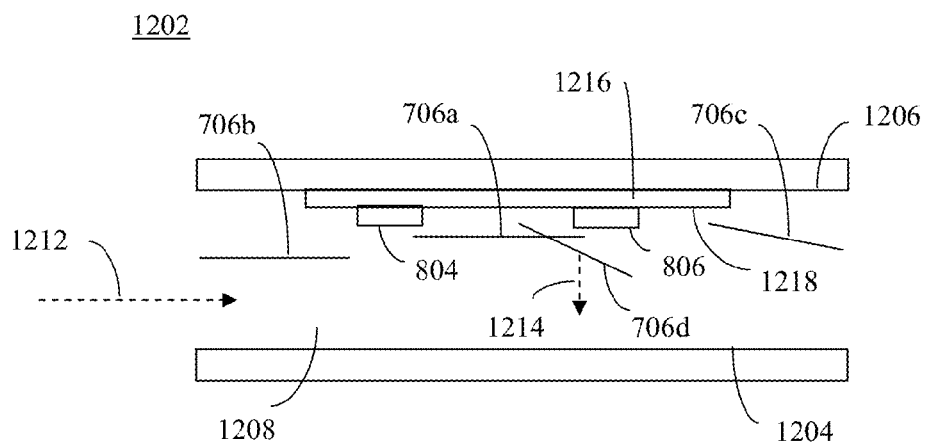
FIG. 12C shows the container of FIG. 12B in an inverted orientation relative to FIG. 12B, according to an example embodiment.

For instance, FIG. 12B shows a cross-sectional view of a portion of invertible nanowire suspension container 1202, according to an example embodiment. As shown in FIG. 12B, container 1202 includes a body having opposing first and second surfaces 1204 and 1206 that are separated by a gap that forms a channel 1208 through container 1202. A substrate 1216 is positioned on second surface 1206 in container 1202. Electrodes 804 and 806 are formed on a surface 1218 of substrate 1216. Container 1202 is oriented in a first orientation in FIG. 12B, such that first surface 1204 is above second surface 1206 (e.g., where gravity pulls in the direction from first surface 1204 towards second surface 1206). FIG. 12C shows container 1202 of FIG. 12B in an inverted orientation relative to FIG. 12B, such that second surface 1206 is above first surface 1204 (e.g., where gravity pulls in the direction from second surface 1206 towards first surface 1204).

Figure 13:
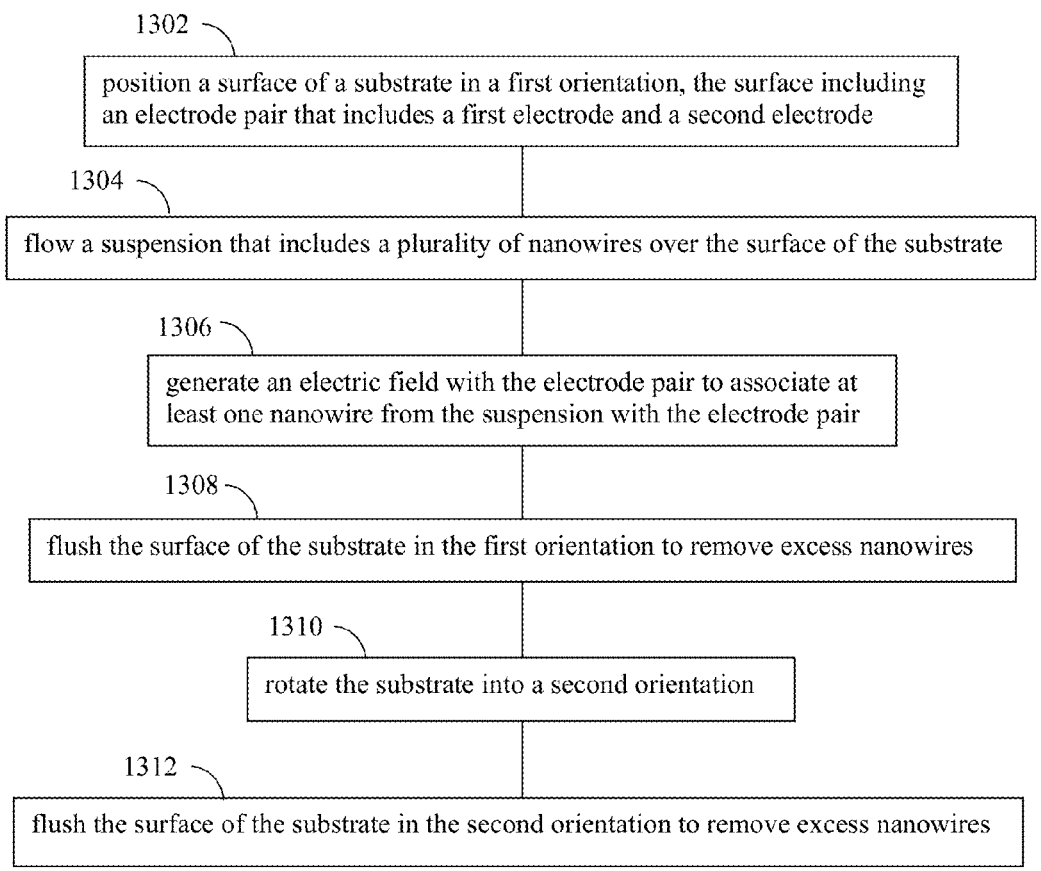
FIG. 13 shows a flowchart providing a process for deposition of nanostructures, according to an embodiment.

System 1200 of FIG. 12A (including container 1202 of FIGS. 12B and 12C) may perform nanostructure deposition and flushing in various ways. For instance, FIG. 13 shows a flowchart 1300 providing a process for deposition of nanostructures, according to an embodiment. Other structural and operational embodiments will be apparent to persons skilled in the relevant art(s) based on the following discussion. Not all steps of flowchart 1300 are necessarily performed in all embodiments, and the steps of flowchart 1300 do not necessarily need to be performed in the order shown in FIG. 13.

Flowchart 1300 begins with step 1302. In step 1302, a surface of a substrate is positioned in a first orientation, the surface including an electrode pair that includes a first electrode and a second electrode. For example, as shown in FIG. 12B, substrate 1216 resides on second surface 1206 inside container 1202, and therefore surface 1218 of substrate 1216 is oriented towards channel 1208. Electrodes 804 and 806 are on surface 1218 of substrate 1216. Although one pair of electrodes is shown on substrate 1216, any number of electrode pairs (and further features) may be formed on substrate 1216.

In step 1304, a suspension that includes a plurality of nanowires is flowed over the surface of the substrate. For instance, referring to FIG. 12A, nanowire suspension source reservoir 602 outputs nanowire suspension flow 606 that is received by container 1202. Nanowire suspension flow 606 includes nanowires, and is flowed over surface 1218 of substrate 1216.

In step 1306, an electric field is generated with the electrode pair to associate at least one nanowire from the suspension with the electrode pair. For instance, referring to FIG. 12A, an electric field may be generated with electrodes 804 and 806 in a manner as described above. Nanowires in the suspension of nanowire suspension flow 606 interact with electrodes 804 and 806, and one or more nanowires from the suspension become associated with electrodes 804 and 806.

Container 610 outputs a residual nanowire suspension flow 608 that is received by nanowire suspension collection chamber 604.

In step 1308, the surface of the substrate is flushed in the first orientation to remove excess nanowires. For instance, as shown in FIG. 12A, in a first flushing stage, a first flushing fluid 1210 is received from reservoir 602 that flows through container 1202 to nanowire suspension collection chamber 604 for collection. First flushing fluid 1210 flushes container 1202 to remove excess nanowires. For instance, referring to FIG. 12B, nanowire 706a may be associated with electrodes 804 and 806 (e.g., due to step 1306), and nanowires 706b-706f may be excess nanowires. First flushing fluid 1210 flows through channel 1208 of container 1202 in an attempt to flush at least some of nanowires 706b-706f from substrate 1216 and/or channel 1208. For instance, nanowires 706e and 706f, which are relatively centrally located in channel 1208 may be flushed from channel 1208 by first flushing fluid 1210, since the velocity in the center of channel 1208 is highest.

In step 1310, the substrate is rotated into a second orientation. For example, referring to FIG. 12A, container 1202 may be rotated into a second orientation, such as an inverted position from its previous orientation. Container 1202 may be rotated into the second orientation in any manner, including manually (e.g., by human intervention) or automatically, such as by motor action. For instance, container 1202 of FIG. 12B may be rotated into the orientation of container 1202 shown in FIG. 12C, which is an inverted orientation.

In step 1312, the surface of the substrate is flushed in the second orientation to remove excess nanowires. For instance, as shown in FIG. 12A, in a second flushing stage, a second flushing fluid 1212 is received from reservoir 602 that flows through container 1202 to nanowire suspension collection chamber 604 for collection. Second flushing fluid 1212 flushes container 1202 to remove excess nanowires that were not removed by first flushing fluid 1210. For instance, referring to FIG. 12C, nanowires 706e and 706f that were shown in FIG. 12B are no longer present (due to being flushed by first flushing fluid 121). Nanowire 706a is associated with electrodes 804 and 806 (e.g., due to step 1306), and nanowires 706b-706d are the remaining excess nanowires that are visible in FIG. 12C. Due to the inverting of container 1202 (relative to FIG. 12B), gravity acts upon nanowires 706b-706d to force them downward from substrate 1216 and second surface 1206 of container 1202 through the center of channel 1208 towards first surface 1204 of container 1202. For instance, as shown in FIG. 12C, a gravitational force 1214 acts on nanowire 706d. Second flushing fluid 1210 flows through channel 1208 of container 1202 in an attempt to flush at least some of nanowires 706b-706d in channel 1208. Nanowires 706b-706d may be more easily flushed from channel 1208 as they migrate towards the center of channel 1208 where the velocity of second flushing fluid 1210 is greatest.

With a closed deposition cell, flush time is controlled by the efficacy to flush nanowires from the entrance region and the velocity of nanowires at the surface. For example, Equation 1 below indicates particle (e.g., nanowire) velocity V for a distance y from the centerline of the channel:

$$V(y) = \frac{3Q}{2hw}\left(1 - \left(\frac{2y}{h}\right)^2\right) \qquad \text{Equation 1}$$

where
Q=the flow rate of fluid through the flow channel (e.g., mL/min), h=the gap distance or height of the flow channel (e.g., mm), and
w=the channel width (e.g., mm).

Figure 14:
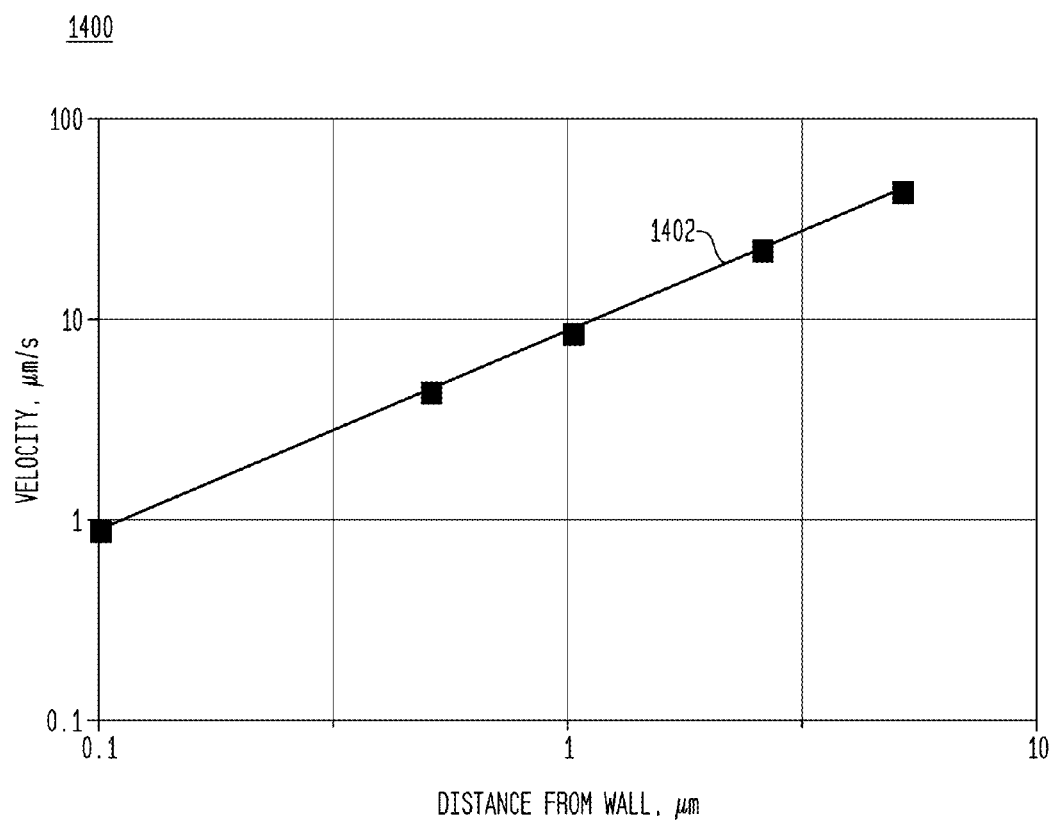
FIG. 14 shows a plot of velocity versus distance from a container wall.

The distance of the nanowire from the wall, d, is given by the relation d=h−y. For instance, FIG. 14 shows a plot 1400 of velocity versus distance from a container wall (e.g., second surface 1206). As a plot line 1402 of plot 1400 indicates, velocity increases as the distance from second surface 1206 increase. With regard to the example FIG. 14, some example system parameters were used to generate plot 1400:

Width of channel 1208=49 mm
Gap between first and second surfaces 1204 and 1206=0.5 mm
Length of channel 1208=80 mm
Flow rate of fluid through channel 1208=1.1 cm³/min A measured nanowire velocity of 5-20 μm/s corresponds to a flying height of 500 nm-1.8 μm from second surface 1206. A corresponding flush may take 1.5-4.5 hours, for example. In embodiments, nanowire suspension container 1202 may have any dimensions, as selected for a particular application.

By rotating the chamber 604 during step 1310 (e.g., 180°), unpinned nanowires at or near second surface 1206 tend to settle into channel 1208 where the velocity of second flushing fluid 1210 is the highest. For instance, a settling rate for nanowires 706 and/or other particles may be determined based on the nanowire dimensions.

$$V^2 = \frac{4Dg(\rho_{part} - \rho_{fluid})}{3C_d \rho_{fluid}} \qquad \text{Equation 2}$$

where
V=settling velocity (e.g., mm/sec),
D=particle diameter (e.g., nanowire length),
g=acceleration of gravity (e.g., 9.81 m/s²),
ρ part=density of particle (e.g., g/cm³),
ρ fluid=density of fluid (e.g., g/cm³), and
Cd=drag coefficient (dimensionless).

The drag coefficient Cd may be calculated as follows:

$$C_d = \frac{F/A}{\rho_{fluid}(V^2/2)} \qquad \text{Equation 3}$$

where
F=force on particle, and
A=area of particle surface (πr²L).

The force on particle F (for a perpendicular cylinder) may be calculated as follows:

$$F = \frac{4\pi\mu LV}{\ln(L/r) + 1/2} \qquad \text{Equation 4}$$

where
μ=fluid viscosity (Pascal-second),
L=length of nanowire, and
r=radius of nanowire.

For instance, for nanowires 706 ("cylinders") having diameters d=240 nm and lengths L=18 μm, such nanowires 706 have a volume of =0.81 μm³. For such nanowires 706, an equivalent sphere radius=1.24. A settling rate for an equivalent sphere=1.12 μm/s. As such, a settling rate for such a cylinder=0.25 μm/s (14 μm/min).

Figure 15:
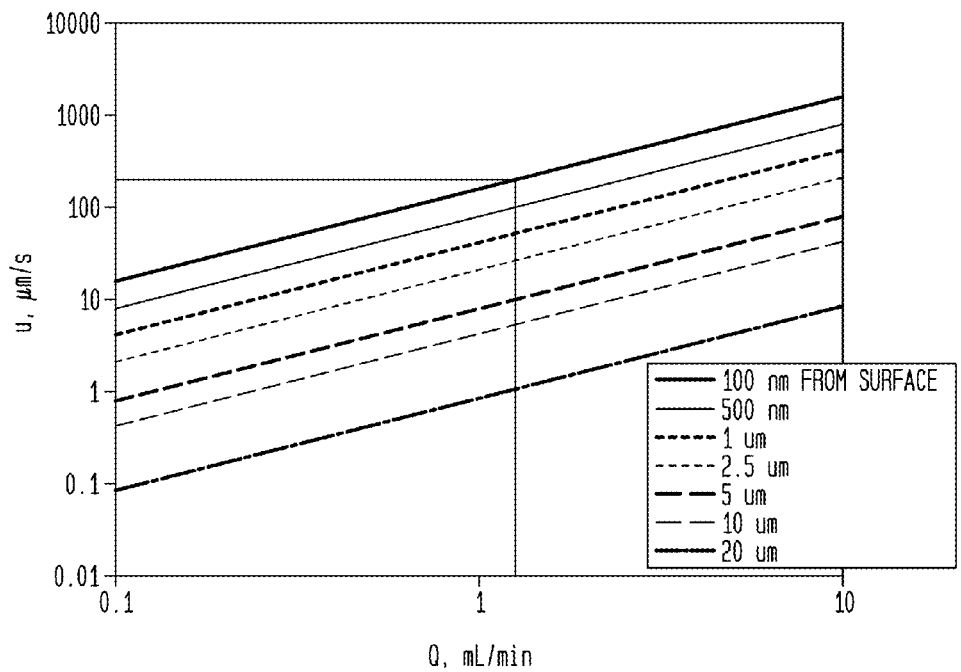
FIG. 15 shows a plot that illustrates a reduction in flush time that may be achieved according to example embodiments

FIG. 15 shows a plot 1500 that illustrates a reduction in flush time that may be achieved, according to example embodiments. Plot 1500 plots nanowire velocity u (Y-axis) in μm/sec versus flow rate Q (X-axis) in mL/min. Seven plot lines are plotted in plot 1500 for various distances from channel surface, showing that velocity increases towards the center of the channel. For instance, with regard to FIG. 15, after 1 minute of settling, nanowire velocities increase over an order of magnitude, decreasing the flush time from over 2 hours to less than 10 minutes.

An example inverted flush test is described as follows: A 25 minute deposition (at a 290 mV electrode voltage) was performed, with 30 minutes of inverted flush. The electrode voltage was increase to 350 mV during rotation of the container (an air bubble in the container did remove some nanowires). After inversion of the container, flush was performed at a same flow rate as was used during nanowire deposition, and a reduced electrode voltage was used to remove nanowire doubles (electrode voltage of 270 mV). A 10 minute IPA flush was used, and a lock and dry process was used (an 8 minute drain, and 10 minute $N_2$ dry). The total deposition and inverted flush process time was about 1.5 hours, as compared to 4 hours for a deposition process without inversion of the container.

Figure 16:
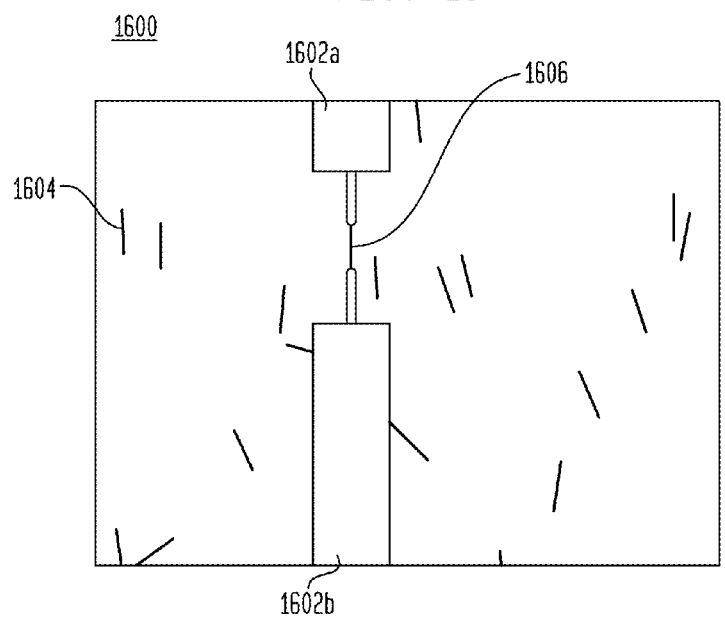
FIG. 16 shows a view of electrodes on a substrate in an inverted flush test prior to flushing, according to an example embodiment.
Figure 17:
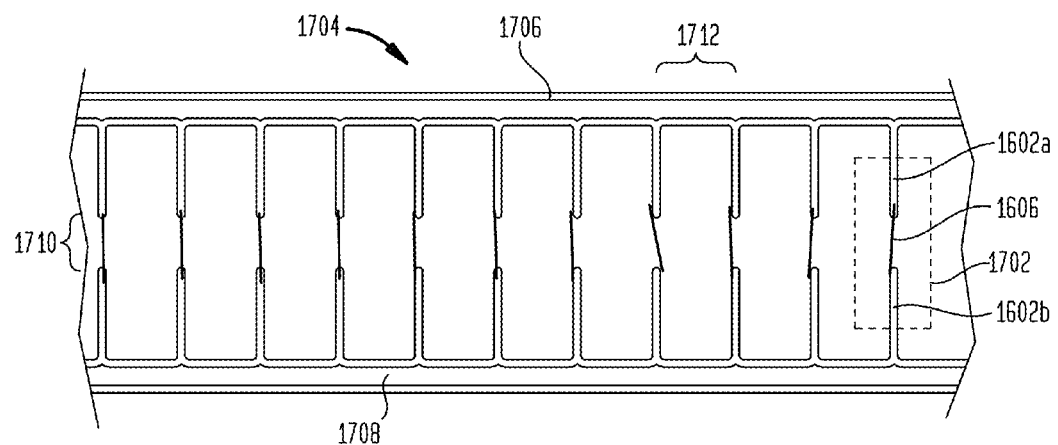
FIG. 17 shows a view of the substrate of FIG. 16 after flushing was performed, according to an example embodiment.

FIG. 16 shows an image 1600 of first and second electrodes 1602a and 1602b on a substrate in an inverted flush test prior to flushing, according to an example embodiment. Nanowires 1604 are shown in FIG. 16. A nanowire 1606 is shown associated with electrodes 1602a and 1602b. FIG. 17 shows an image 1700 of the substrate of FIG. 16 fifteen minutes after the flushing was performed (near a cell outlet), at a reduced level of zoom relative to FIG. 16. In FIG. 17, eleven electrode pairs 1702 are included in an electrode array 1704. Each of the electrode pairs 1702 include corresponding electrodes 1602a and 1602b, and an associated nanowire 1606 extending between the corresponding electrodes 1602a and 1602b. The eleven electrode pairs 1702 are arranged in a single file row in parallel with each other. Electrode array 1704 further includes a first conductor 1706 (e.g., a first "bus line"), and a second conductor 1708 (e.g., a second "bus line"). A first end of each electrode 1602a is connected to first conductor 1706, and a first end of each electrode 1604a is connected to second conductor 1706. Each nanowire 1606 extends between the second ends of a corresponding pair of electrodes 1602a and 1602b. The second ends of each pair of electrodes 1602a and 1602b are separated by an electrode gap or spacing 1710. Adjacent electrode pairs 1702 are separated by an electrode pair spacing 1712.

In another example, an inverted flush process may be performed for a duration of 1 hour and 30 minutes to deposit nanowires on a wafer surface and to flush away excess nanowires. During the process, a 30 minute deposition cycle (using a suspension having a nanowire density of $5 \times 10^6$ nanowires/mL) is performed, and a 10 minute flush is performed in the deposition configuration (e.g., nanowires are removed at the upper surface). A 5 minute conversion to the inverted configuration is performed, and a 20 minute inverted flush process (85% IPA/15% $H_2O$) is performed. A 10 minute inverted flush process with 100% IPA is next performed. A 5 minute lock and drain process is performed, as well as a 10 minute $N_2$ dry process. As a result, nanowire deposition uniformity is enhanced due to the rinse effectiveness, and the wafer surface is extremely clean.

Figure 18:
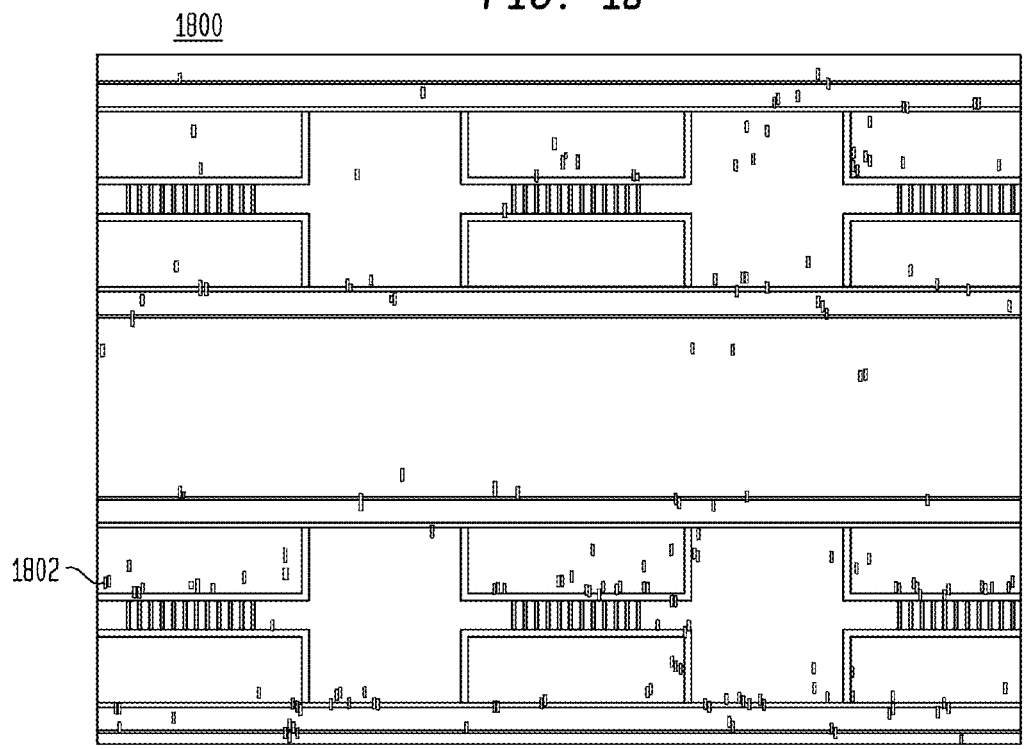
FIG. 18 shows an image of nanowires on a surface of a wafer that was flushed in a normal configuration.
Figure 19:
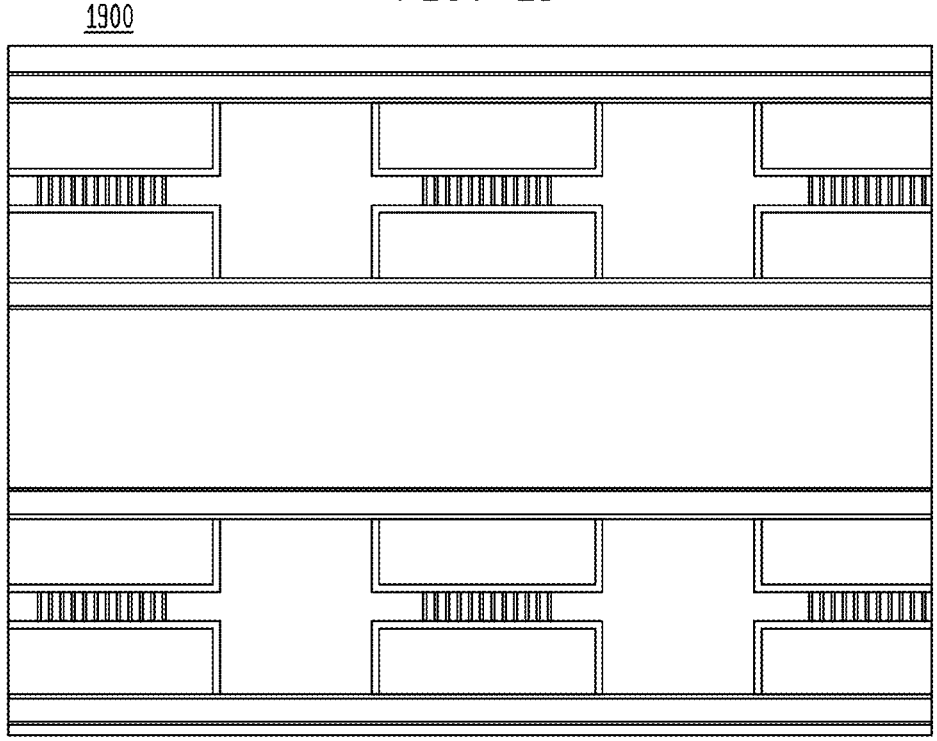
FIG. 19 shows an image of nanowires on a surface of a wafer that was flushed in an inverted configuration, according to an example embodiment.

FIG. 18 shows an image 1800 of a plurality of electrode arrays on a surface of a wafer that was flushed in a normal configuration for 3 hours. As shown in FIG. 18, numerous stray nanowires 1802 are present on the wafer surface that are not associated with electrodes. FIG. 19 shows an image 1900 of the plurality of electrode arrays on the surface of the wafer of FIG. 18, after being flushed in an inverted configuration for 30 minutes, according to an example embodiment. As shown in FIG. 19, few to no stray nanowires are present across the wafer surface. Wafers flushed in the inverted configuration are significantly cleaner than wafers flushed in a deposition orientation (non-inverted).

In another example, an inverted flush process may be performed for a duration of 2 hours and 40 minutes to deposit nanowires on a wafer surface and to flush away excess nanowires. During the process, a one hour deposition cycle (using a suspension having a nanowire density of $5 \times 10^6$ nanowires/mL) is performed, and a 10 minute flush is performed in the deposition configuration (remove NWs at upper surface). A 5 minute conversion to the inverted configuration is performed, and a 1 hour inverted flush process (using 85% IPA/15% $H_2O$) is performed. A 10 minute inverted flush with 100% IPA is next performed. A 5 minute lock and drain process is performed, as well as a 10 minute $N_2$ dry process. As a result, the inverted flush time was greater than was greater than in the prior example because the electrode density was greater in the current example, which reduces settling. The inverted flush process significantly improved deposition uniformity over conventional techniques.

C. Electrode Configurations for Nanowire Deposition

As described above, nanostructure deposition may be performed by capturing nanowires that are in solution onto a substrate using an electric field. It is noted that the type and configuration of the electrodes used to generate the electric field can have a significant impact on the deposition process. The deposition system used to deposit the nanowires may have non-uniformities that can affect the quality of deposition (i.e., may have hydrodynamic non-uniformities). Thus, it is desirable to understand and maximize the window of operation in a nanostructure deposition system to ensure that deposition is uniform across the substrate.

In embodiments, electrode geometries are provided that are configured to enable nanostructures to be deposited from solution to the electrodes in a selected manner. For example, the electrode geometry may be configured to cause a single nanowire to be deposited to the electrodes, or greater numbers of nanowires to be deposited to the electrodes (e.g., two nanowires, three nanowires, etc.). A substrate may include a plurality of electrode pairs having the same geometry or different geometries. For example, electrodes having different geometries may be present to leverage the differing behaviors of the different electrode geometries for deposition purposes. Because nanowires may be attracted to different electrode geometries based on various factors, a substrate may be fabricated with different electrode patterns that cause different styles of nanowires to be deposited in specific locations. Furthermore, the electrode material and film stack (e.g., a dielectric may be used to coat an electrode) may be varied to vary nanostructure deposition attributes (e.g., numbers of nanowires deposited on an electrode pair, deposition location, etc.).

For instance, in an embodiment, a system (e.g., container 610 of FIG. 6 or container 1202 of FIG. 12) that includes a high aspect ratio flow channel may be used for deposition. A deposition substrate may be present in the system that forms or is positioned on one of the larger walls of the flow channel. The system may or may not be enclosed, and is configured such that shear forces are uniform in at least one dimension across the deposition substrate. As described elsewhere herein, nanowires may be drawn from a bulk liquid that flows through the channel onto electrodes of the substrate by dielectrophoretic forces. For nanowire deposition to occur, the dielectrophoretic force is greater in the direction tangential to the substrate surface (the direction of fluid drag) than the fluid drag on the nanowires, or the nanowires will be swept from the electrodes. A number of nanowires that are pinned on a single electrode pair depends on factors such as the nanowire size, the shear force, the voltage applied to the electrodes, the frequency of the voltage, and the electrode geometry. The frequency of the voltage applied to the electrodes is set to be high enough for dielectrophoresis to occur.

Figure 20:
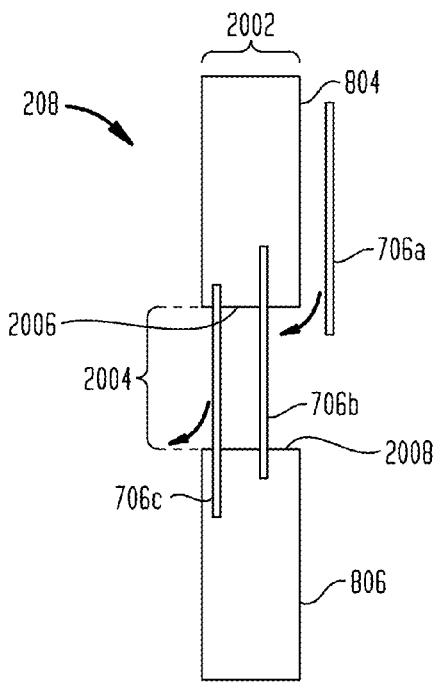
FIG. 20 shows an electrode pair formed on a substrate, according to an example embodiment.

For instance, FIG. 20 shows an electrode pair 208 formed on a substrate, according to an example embodiment. Electrode pair 208 includes a first electrode 804 and a second electrode 806. As shown in FIG. 20, each of electrodes 804 and 806 has a width 2002, and an electrode spacing 2004 (or a gap, a distance) is present between ends 2006 and 2008 respectively of electrodes 804 and 806 (ends 2006 and 2008 are shown as square shaped in the example of FIG. 20). Three nanowires 706a-706c are shown in FIG. 20, for illustrative purposes. Nanowire 706a is shown approaching electrodes 804 and 806. Nanowire 706b is shown pinned to electrodes 804 and 806. Nanowire 706c is shown being displaced from electrodes 804 and 806 by nanowire 706b. Any one or more of the electrode width 2002, electrode spacing 2004, flow channel height, nanowire surface charge, nanowire polarizability (charge from E-field), and solution properties may be varied to enhance deposition of nanowires 706.

In one embodiment, spacing 2004 may be set for single nanowire deposition such that at least 2.5 µm of a single nanowire length overlaps each of electrodes 804 and 806. In such an embodiment, spacing 2004 may be configured to be the length of a nanowire minus 5 µm. This configuration may avoid defects such as two nanowires offset in a linear chain configuration bridging the electrodes. Thus, for a 10 µm nanowire length for nanowires in the deposition solution, spacing 2004 may be set to 5 µm (or less) to enable a nanowire to span spacing 2004 and to overlap each of electrodes 804 and 806 by 2.5 µm.

With regard to electrode width 2002, as electrode width 2002 increases, a single nanowire deposition window decreases. In one example embodiment, when it is desired to deposit a single nanowire to electrodes 804 and 806, a maximum value for electrode width 2002 may be about 2 µm. As width 2002 is decreased, the value of the applied electrode voltage increases, and premature locking of nanowires to electrodes 804 and 806 becomes more likely, as well as an increased possibility of electrode corrosion.

Figure 21:
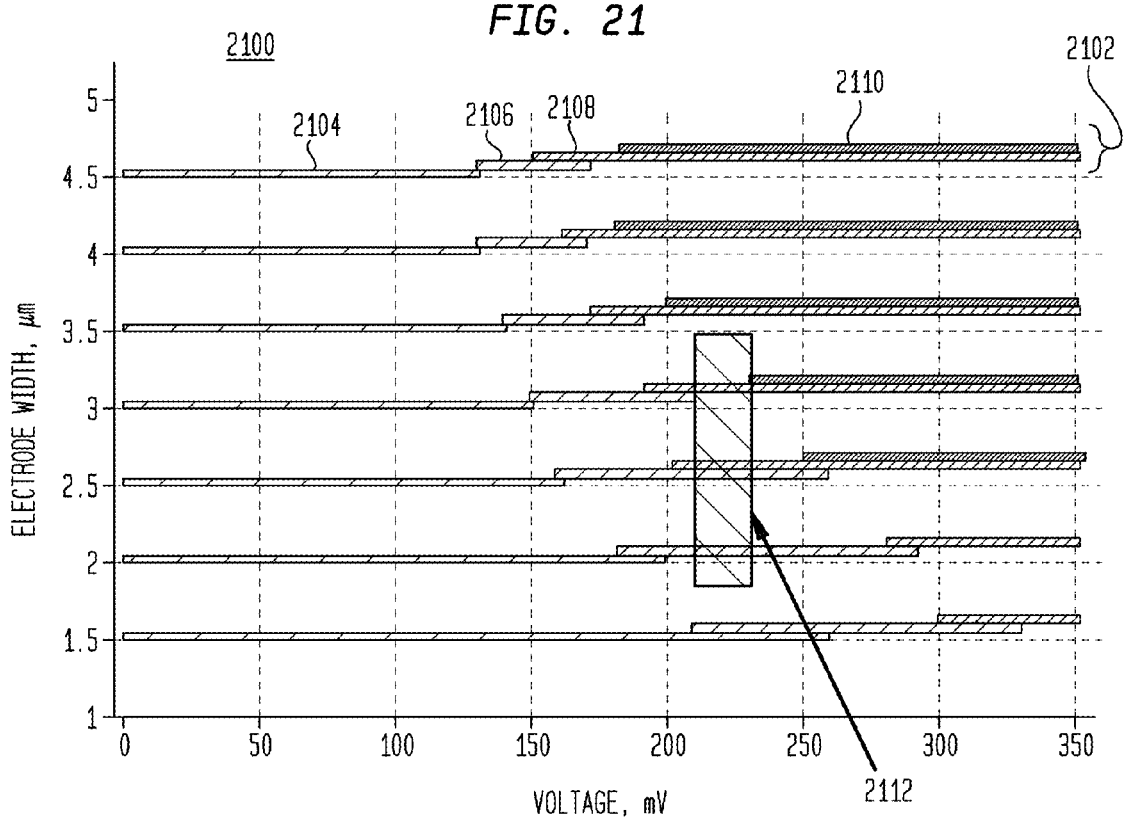
FIG. 21 shows a plot of various windows of electrode voltage for different values for electrode width, according to embodiments.

FIG. 21 shows a plot 2100 of various windows of electrode voltage for different values for electrode width 2102, according to embodiments. FIG. 21 shows various values for nanowires per electrode for various values of electrode width (µm) versus deposition window voltage (in Volts), including a plot line for each of seven values of electrode width (1.5, 2, 2.5, 3, 3.5, 4, and 4.5, all in µm). For an example plot line 2102 shown in FIG. 21 for an electrode width of 4.5 µm, a first range 2104 is shown where no nanowires have become pinned to the electrode pair, a second range 2106 is shown where one nanowire has become pinned to the electrode pair, a third range 2108 is shown where two nanowires have become pinned to the electrode pair, and a fourth range 2110 is shown where three nanowires have become pinned to the electrode pair. Thus, with respect to plot line 2102, if a single nanowire is desired to be deposited per electrode pair having an electrode width of 4.5 µm, an electrode voltage in the range of approximately 130-150 mV may be applied. If one or two nanowires is/are desired to be deposited per electrode pair having an electrode width of 4.5 µm, an electrode voltage in the range of approximately 150-170 mV may be applied. If two nanowires are desired to be deposited per electrode pair having an electrode width of 4.5 µm, an electrode voltage in the range of approximately 170-180 mV may be applied, etc. As will be understood by those having ordinary skill in the art, these ranges relate to a particular system embodiment having particular characteristics. However, the present invention also encompasses system and method modifications to provide for the desired nanowire deposition, since such modifications will be necessary as certain system parameters will be unique for different applications of the invention. For example, if the nanowire length is modified or the flow rate at which the nanowire solution is introduced into the system is modified, the critical pinning voltage values might require modification to achieve the desired nanowire deposition. Thus, the electric field created by the charged electrodes can be scaled with the change in flow rate to achieve the desired nanowire deposition, for example, by modifying the voltage applied to the electrodes.

Furthermore, as indicated by plot 2100, a 20 mV window 2112 (an electrode voltage in the range of approximately 210-230 mV) is present for having either one or two nanowires deposited per electrode pair for electrode widths in the range of 2-3 µm. Window 2112 provides a range of electrode widths where either single or double nanowires are stable on electrodes for a given voltage range. Thus, electrodes can be configured to enable deposition of both single and double nanowires on a substrate.

Figure 22:
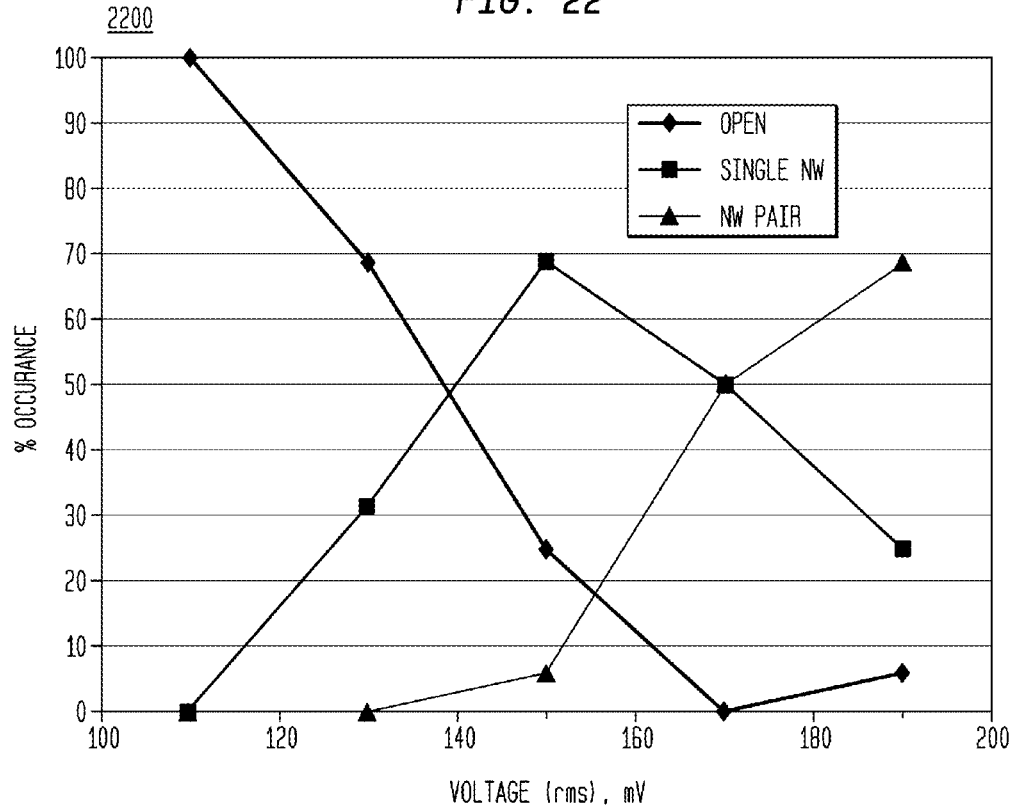
FIG. 22 shows a plot of percentage occurrence for each of zero, one, and two nanowires being deposited, according to an example embodiment.
Figure 23:
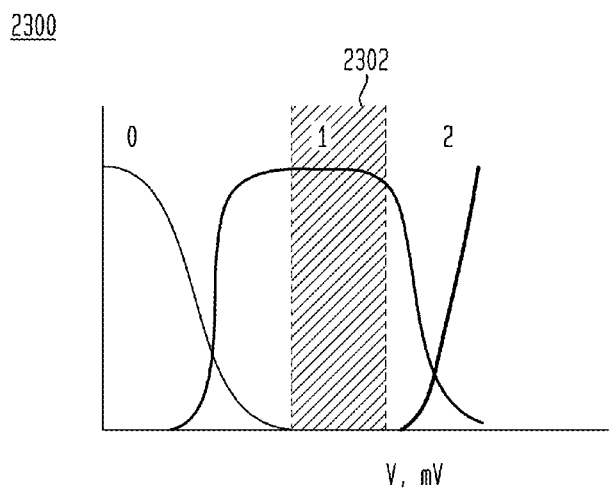
FIG. 23 shows a plot of a deposition distribution, where in an electrode voltage window, a single nanowire is deposited to the electrodes with high likelihood of occurrence.

FIG. 22 shows a plot 2200 related to nanowire deposition behavior. Plot 2200 includes a plot of percentage occurrence for each of zero nanowires being deposited, a single nanowire being deposited, and two nanowires being deposited. Plot 2200 includes three plot lines, with a plot line corresponding to each of zero nanowire deposition, single nanowire deposition, and two nanowire deposition. A nanowire distribution on the electrodes was determined 5 minutes after voltage set-point change (500 Hz electrode voltage; flow rate of IPA=4 mL/min). As shown in FIG. 22, for the electrode voltage range of 100-190 mV there are no electrode voltage ranges where a single nanowire is deposited with very high percentage of occurrence to the electrodes relative to the zero nanowire deposition plot line and/or the nanowire pair deposition plot line. In contrast, FIG. 23 shows a plot 2300 of an ideal deposition distribution, where in a window 2302 of electrode voltage, a single nanowire is deposited to the electrodes with high likelihood of occurrence.

Figure 24:
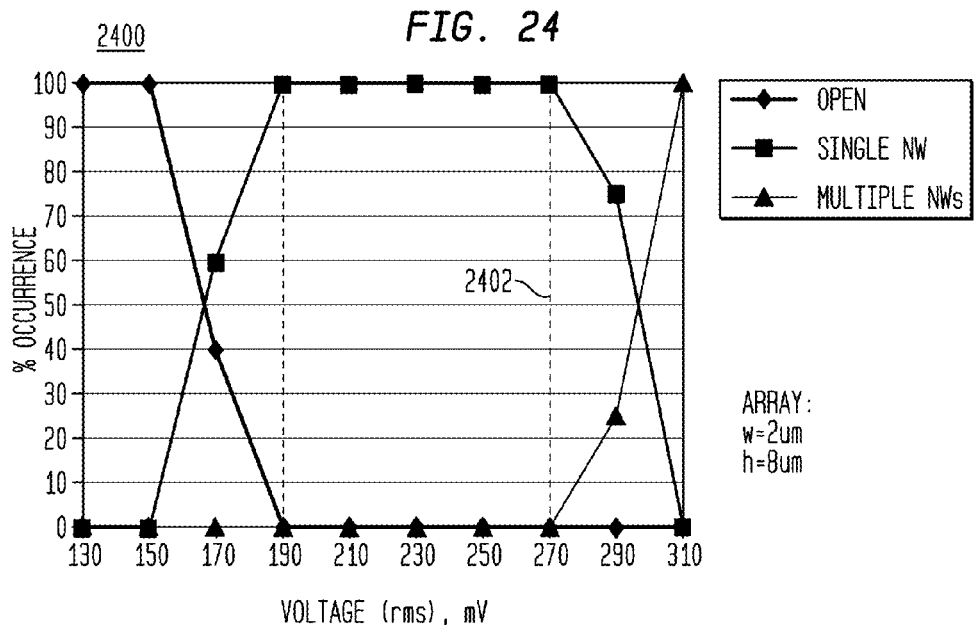
FIG. 24 shows a plot related to nanowire deposition behavior, according to an example embodiment.

In one example experiment for deposition of nanowires, nitride coated planar nanowires were deposited. A substrate coated with 50-nm PECVD (plasma enhanced chemical vapor deposition) oxide was used, and the substrate was cleaned with an oxygen ($O_2$) plasma for 5 minutes prior to use. An electrode voltage was scanned from low to high levels. FIG. 24 shows a plot 2400 related to nitride planar nanowire deposition behavior for electrode widths of 2 µm and flow channel height of 8 µm. Similarly to plot 2200, plot 2400 includes three plot lines, with a plot line corresponding to each of zero nanowire deposition, single nanowire deposition, and two nanowire deposition. For plot 2400, nanowire distribution on the electrodes was determined 1 minute after voltage set-point change (1 kHz electrode voltage; flow rate of IPA=3.5 mL/min). Plot 2400 shows a relatively wide electrode voltage window 2402 of 80 mV (190-270 mV) where a single nanowire is deposited with very high percentage of occurrence to the electrodes relative to the zero nanowire deposition plot line and/or the nanowire pair deposition plot line.

Figure 25:
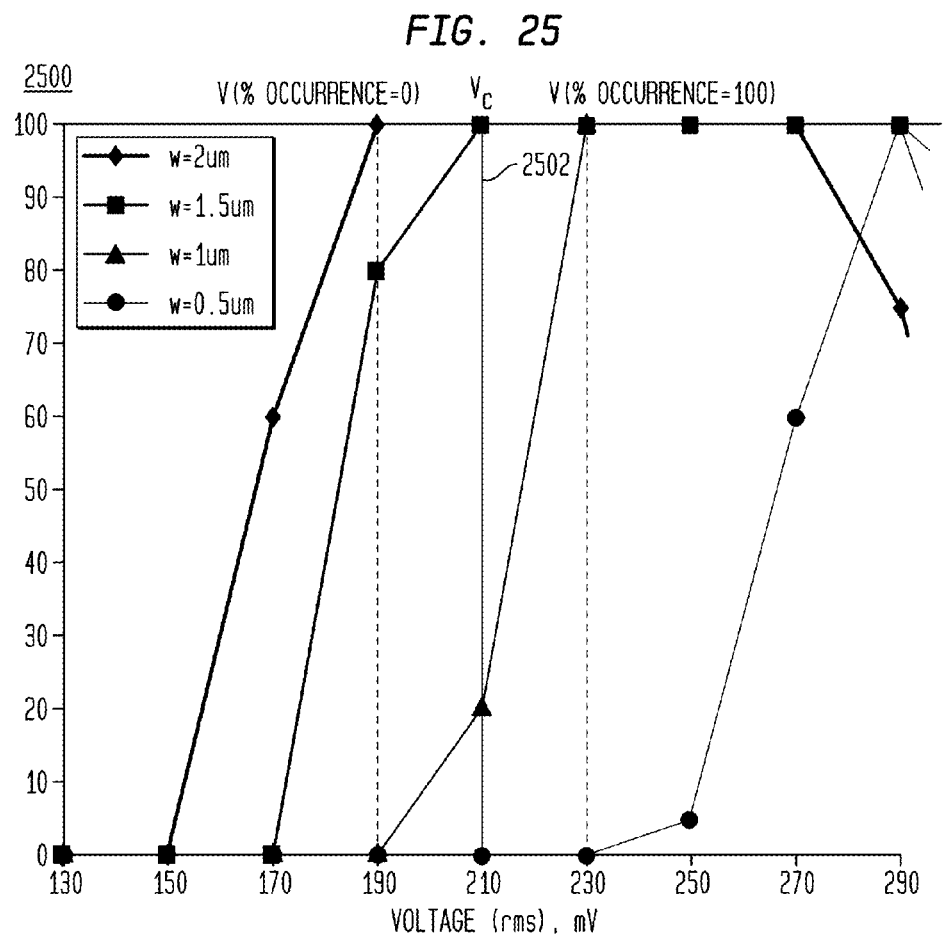
FIGS. 25 and 26 show plots related to single nanowire deposition behavior for a range of electrode widths, according to example embodiments.
Figure 26:
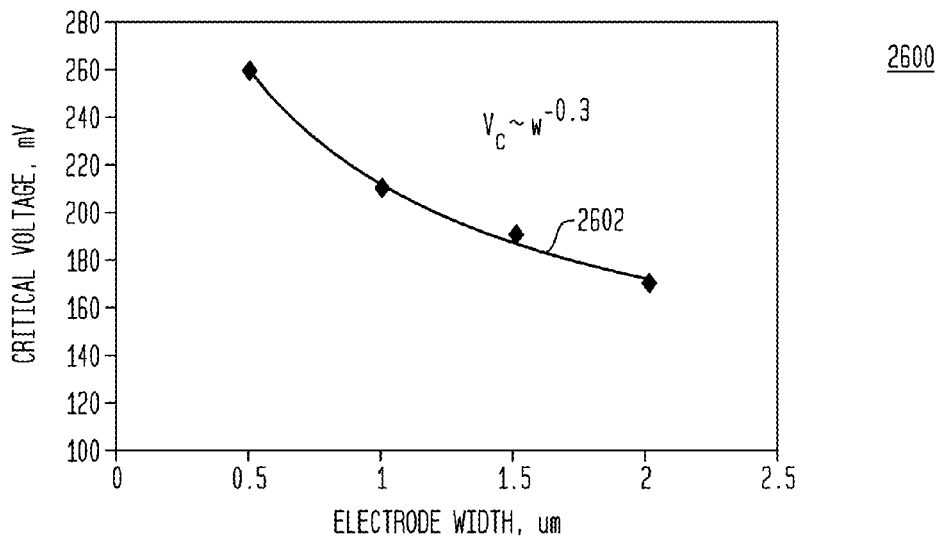

FIGS. 25 and 26 show plots 2500 and 2600 related to single nitride planar nanowire deposition behavior for electrode widths ranging across 0.5 µm, 1 µm, 1.5 µm, and 2 µm, and for a flow channel height of 800 µm. Plot 2500 shows a plot line for each of the four electrode widths of percentage of occurrence versus electrode voltage. A critical voltage, Vc, may be determined as a voltage value midway between voltage values at which an occurrence is 0% and at which the occurrence is 100% for a 1-µm wide electrode. For instance, as shown in FIG. 25, a critical voltage 2502 was determined at 210 mV for single nanowire deposition, based on ½ (the electrode voltage at 0% occurrence of 190 mV+the electrode voltage at 100% occurrence of 230 mV), for the electrode width of 1 µm. The critical voltage may be determined for each electrode width to roughly indicate an electrode voltage at which single nanowire deposition is 50% likely. The planar nanowire deposition distribution on the electrode was determined 1 minute after a voltage set-point change (1 kHz electrode voltage; flow rate of IPA=3.5 mL/min). Plot 2600 of FIG. 26 shows a plot line 2602 for critical voltage (mV) versus electrode widths (µm) ranging from 0 to 2.5 µm. Plot 2600 indicates the Vc is non-linear with electrode width.

Figure 27:
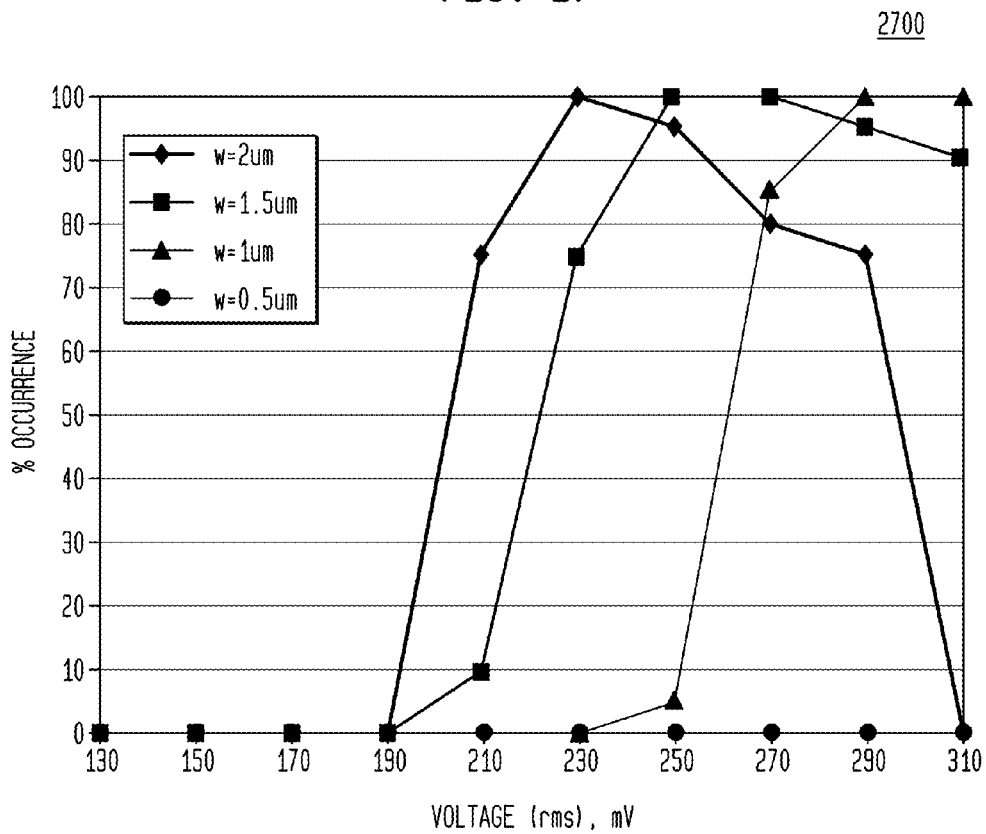
FIGS. 27 and 28 show plots related to nanowire deposition behavior indicating effects of electrode width, according to example embodiments.

FIG. 27 shows a plot 2700 related to planar nanowire deposition behavior: effect of electrode width (flow channel height=10 µm). Plot 2700 shows a plot line for each of the four electrode widths (0.5 µm, 1 µm, 1.5 µm, and 2 µm) of percentage of occurrence of single nanowires versus electrode voltage (mV, rms). For plot 2700, planar nanowire deposition distribution on the electrode was determined 1 minute after voltage a set-point change (1 kHz electrode voltage; flow rate of IPA=3.5 mL/min).

Figure 28:
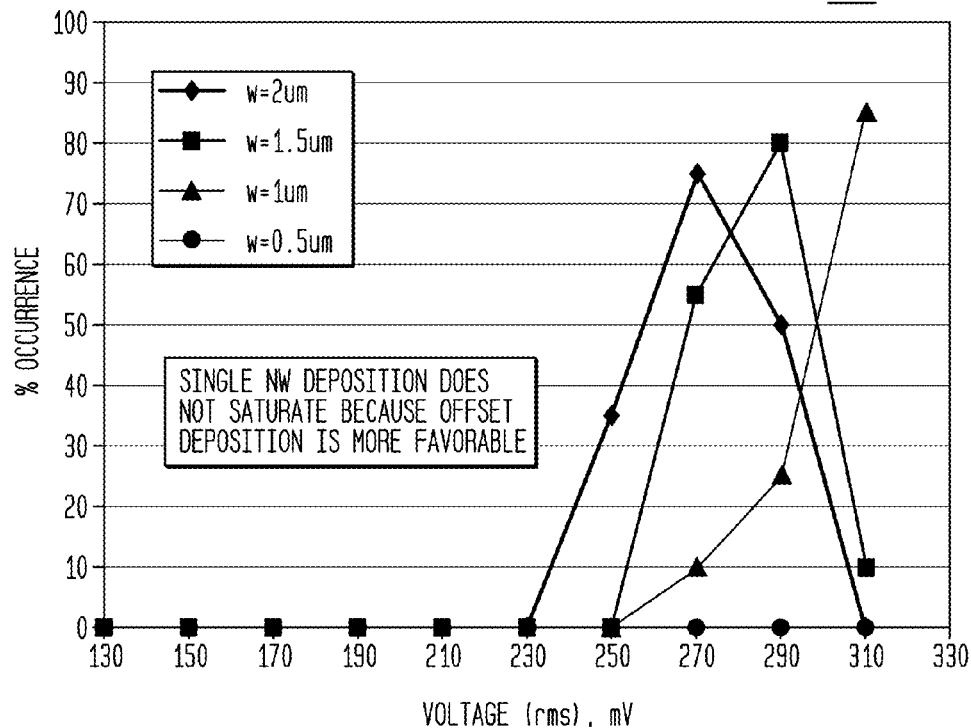

FIG. 28 shows a plot 2800 related to planar nanowire deposition behavior: effect of electrode width (electrode gap=12 µm). Plot 2800 shows a plot line for each of the four electrode widths (0.5 µm, 1 µm, 1.5 µm, and 2 µm) of percentage of occurrence versus electrode voltage (mV, rms). For plot 2800, planar nanowire deposition distribution on the electrode was determined 1 minute after a voltage set-point change (1 kHz electrode voltage; flow rate of IPA=3.5 mL/min). Plot 2800 indicates that single nanowire deposition does not saturate (e.g., nanowire deposition does not reach a value of 100% occurrence for any range of electrode voltage) because offset deposition (two nanowires connected end-to-end) is more favorable (e.g., due to the increased electrode gap).

Figure 29:
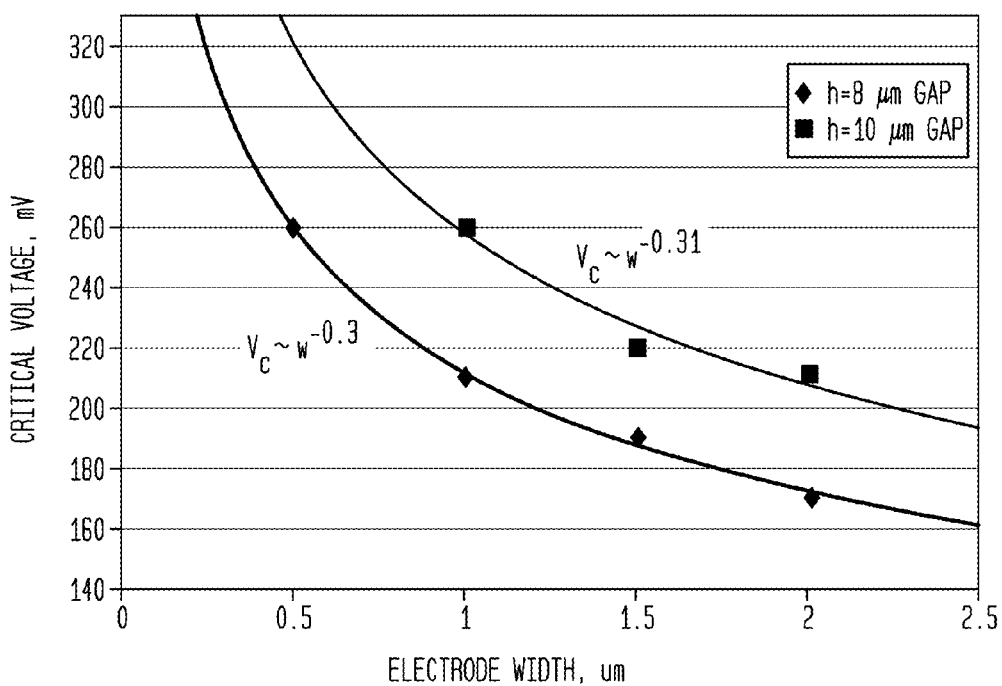
FIG. 29 shows a plot of a critical voltage versus electrode width, according to an example embodiment.

FIG. 29 shows a plot 2900 of critical voltage Vc (mV) versus electrode width (µm). Plot 2900 includes a first plot line for an electrode gap of 8 µm and a second plot line for an electrode gap of 10 µm. For plot 2900, the planar nanowire deposition distribution on the electrode was determined 1 minute after a voltage set-point change (1 kHz electrode voltage; flow rate of IPA=3.5 mL/min). Plot 2900 indicates that with increased electrode gap (distance between electrode tips), critical voltage tends to be increased.

Figure 30:
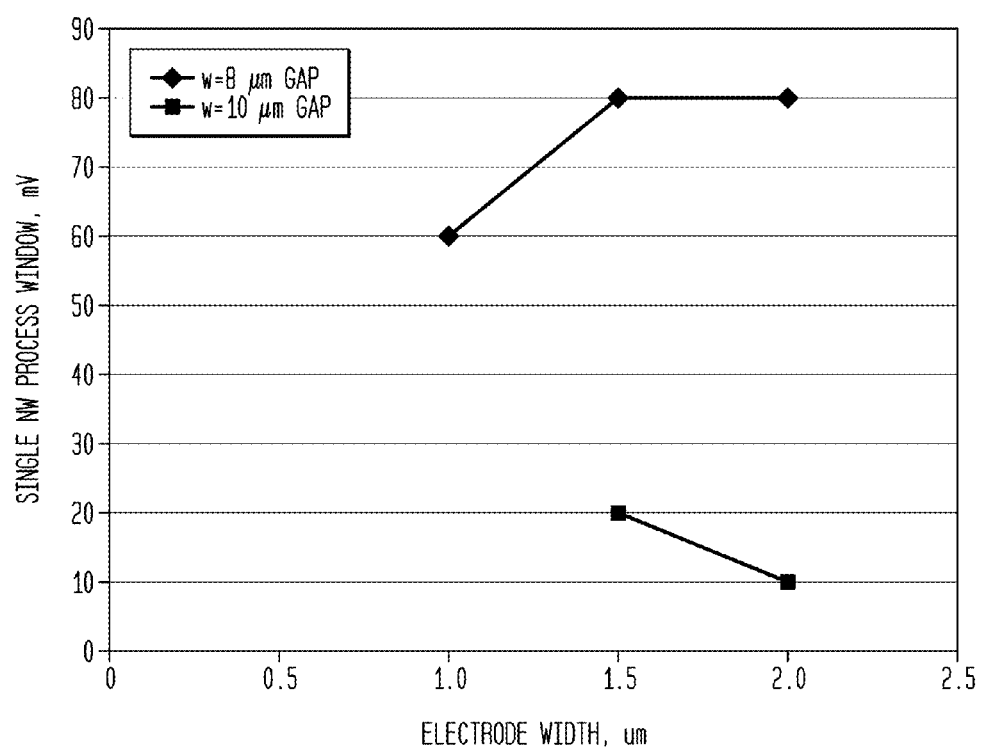
FIG. 30 shows a plot of a single nanowire process window (SNPW) versus electrode voltage, according to an example embodiment.

FIG. 30 shows a plot 3000 related to a single nanowire process window (SNPW), where the SNPW is a voltage range for 100% occurrence of single nanowires. Plot 3000 plots the SNPW (mV) versus electrode width (µm). Plot 3000 includes a first plot line for an electrode gap of 8 µm and a second plot line for an electrode gap of 10 µm. For plot 3000, planar nanowire deposition distribution on the electrode was determined 1 minute after a voltage set-point change (1 kHz electrode voltage; flow rate of IPA=3.5 mL/min). Plot 3000 indicates that a single nanowire process window is smaller for larger electrode gaps because offset nanowire deposition is more favorable.

D. Techniques for Deposition of Nanowires on Large Panels

As described above, in example deposition configurations, AC electric fields can be used to deposit nanowires from solution onto surfaces of substrates. Electrode pairs may be patterned onto the substrates, and an AC field can be applied to the electrode pairs. Nanowires align parallel to the electric field with a nanowire centerline centered between the electrodes of the electrode pairs. When a liquid containing nanowires is flowed over a substrate, hydrodynamic drag and dielectrophoretic attraction can be balanced so that one or more nanowires are pinned on each electrode pair. One example process may deposit nanowires on substrates having a size in the order of 100 mm by 100 mm in the time scale of 1 hour, but it is desired to scale this process to larger substrates (e.g., 3000 mm by 3000 mm) in a time scale of minutes or better.

In embodiments, a continuous linear process with multiple processing zones is used to deposit nanostructures on a large substrate. For example, in an embodiment, nanowire deposition techniques are scaled upward to enable deposition to large panels. A substrate (e.g., glass or any other substrate material mentioned herein) may be fed into a deposition system with a continuous linear velocity. In the deposition system, one or more stages or zones exist that are each configured to perform a particular process (e.g., a nanostructure deposition zone, a locking and drying zone, a rinse zone, a repair zone, a metrology zone, etc.). One or more of the zones can optionally be repeated if necessary. For example, if nanowires are removed from a substrate in a repair zone, the substrate may be fed into a second deposition zone and a rinse zone.

Figure 31:
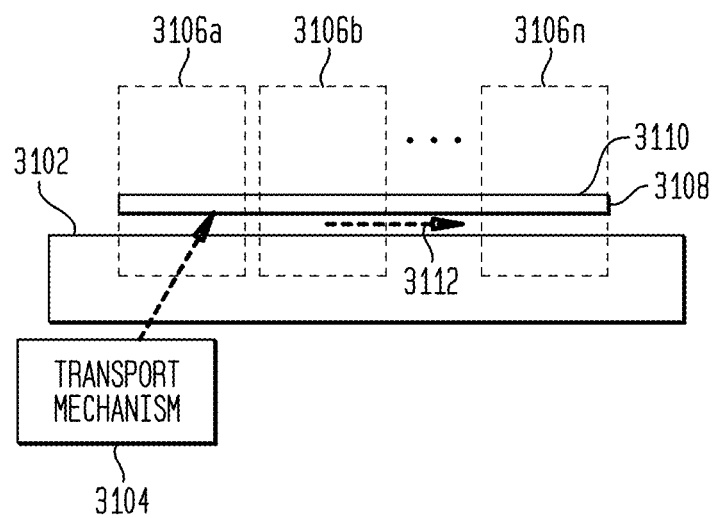
FIG. 31 shows an example block diagram of a nanostructure deposition system, according to an embodiment.

FIG. 31 shows an example block diagram of a nanostructure deposition apparatus/system 3100, according to an embodiment. As shown in FIG. 31, system 3100 includes a bounding surface 3102, a transport mechanism 3104, a plurality of panel processing zones 3106a-3106n, and a target panel 3108. Bounding surface 3102 is configured to receive target panel 3108. Target panel 3108 has a plurality of electrode pairs (e.g., electrode pairs 208) on a surface 3110 of target panel 3108. Electrode pair is configured to receive at least one nanowire. Transport mechanism 3104 is configured to convey target panel 3108 over bounding surface 3102 at a predetermined velocity. Each of panel processing zones 3106a-3106n is configured to perform a respective process to a portion of surface 3110 of target panel 3108, as described herein. Transport mechanism 3104 is configured to convey target panel 3108 through the plurality of panel processing zones 3106a-3106n.

Figure 32:
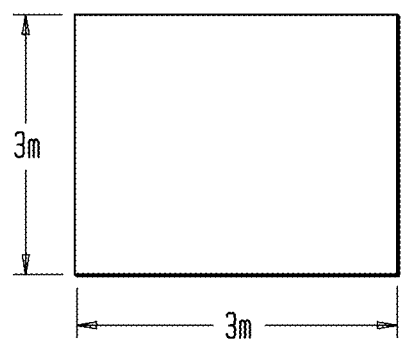
FIG. 32 shows an example panel onto which nanostructures may be deposited using the deposition system of FIG. 31, according to an embodiment.

In one embodiment, deposition system 3100 may be configured to handle a panel throughput of 1 panel per 5 minutes, which corresponds to a panel velocity of 10 mm/sec. In other embodiments, deposition 3100 may be configured to accommodate other panel throughput values and velocities. FIG. 32 shows an example panel 3200 onto which nanostructures may be deposited using deposition system 3100, according to an embodiment. Panel 3200 is an example of panel 3108 shown in FIG. 31. Panel 3200 is shown in FIG. 32 as being 3 meters by 3 meters in area, but in alternative embodiments may have any other size.

In an example embodiment, target panel 3108 may be translated over bounding surface 3102 having a uniform gap (e.g., approximately 1 mm) between target panel 3108 and bounding surface 3102. The gap between target panel 3108 and bounding surface 3102 may be uniform or may vary. As the top of target panel 3108 translates in one direction into deposition system 3100, target panel 3108 progressively enters different zones 3106, so that deposition may be occurring on one part of target panel 3108 (e.g., in a deposition zone) while another part of target panel 3108 is being rinsed (e.g., in a rinse zone).

Figure 33:
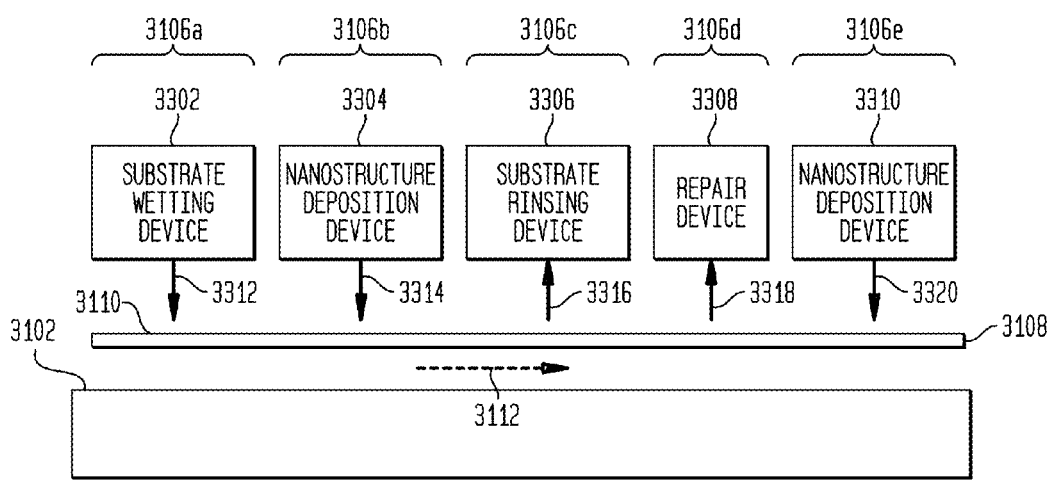
FIG. 33 shows a block diagram of panel processing zones of the deposition system of FIG. 31, according to an example embodiment.

For instance, FIG. 33 shows a block diagram of panel processing zones 3106a-3106d of deposition system 3100, according to an example embodiment. As shown in FIG. 33, first panel processing zone 3106a includes a substrate wetting device 3302, second panel processing zone 3106b includes a nanostructure deposition device 3304, third panel processing zone 3106c includes a substrate rinsing device 3306, fourth panel processing zone 3106d includes a repair device 3308, and fifth panel processing zone 3106e includes an (optional) second nanostructure deposition device 3310.

In the example of FIG. 33, first panel processing zone 3106a is a substrate wetting zone. Substrate wetting device 3302 of first panel processing zone 3106a may be configured to wet surface 3110 of target panel 3108 with a deposition solvent 3312. Second panel processing zone 3106b is a nanostructure deposition zone. Nanostructure deposition device 3304 of second panel processing zone 3106b is configured to perform deposition of nanostructures 3314. Here, ports of nanostructure deposition device 3304 for nanowire injection can be located at different distances from target panel 3108, such as 10 µm from surface 3110, to ensure that a majority of nanowires supplied are within range to be attracted by electrodes on surface 3110 of target panel 3108. This allows for a very high concentration of nanowires to be added locally (e.g., in a narrow band by the surface) to ensure complete and rapid loading of the electrodes.

In the example of FIG. 33, third panel processing zone 3106c is a rinse zone. Substrate rinsing device 3306 of third panel processing zone 3106c is configured to rinse the nanostructures deposited on target panel 3108. For rinse, a vertical velocity may be used. Fluid 3316 may be withdrawn from surface 3110 of target panel 3108 and/or from bounding surface 3102 while target panel 3108 is being moved. In an embodiment, substrate rinsing device 3306 may include a plurality of hexagonally packed tubes that have a long axis perpendicular to target panel 3108 that are used to withdraw fluid 3316. The ends of the tubes may be spaced from surface 3110 of target panel 3108 (e.g., 10 to 100 µm) but may extend from a bottom surface of a rinse machine for a length of 500 µm-1 mm. To generate a vertical velocity to remove excess nanowires from target panel 3108, fluid 3316 may be removed from the system through the tubes. By having the tubes near surface 3110, liquid from surface 3110 doesn't have to travel as far to leave the system, so a much lower withdraw rate can be used. This enables rinse to be performed without removing all nanowires from surface 3110. By using a tube bank, fluid being dragged by target panel 3108 does not have to pass through a restriction, which could undesirably dislodge nanowires from the panel due to high shear forces.

Fourth panel processing zone 3106d is a repair zone. Repair device 3308 of fourth panel processing zone 3106d is configured to remove bad nanostructures 3318 (e.g., defective nanowires, nanowires poorly coupled to electrodes, etc.) from target panel 3108. Fifth panel processing zone 3106e may be optionally present to deposit nanostructures at the locations where bad nanostructures 3318 were removed. In FIG. 33, fifth panel processing zone 3106e includes a second nanostructure deposition device 3310 configured to deposit nanostructures 3320 in such locations.

In embodiments, various features of deposition system 3100 may be varied, including materials, dimensions, orientations (vertical, horizontal, etc.), zone widths, micro-patterning, fluid port layout, etc.

According to a conventional deposition process, nanowire deposition takes approximately one hour. Such a conventional process typically relies on convection (approximately 1.5 hr for fluid near the surface to transit the length of the cell) and settling. Such a current process is not scalable because the surface velocity and settling time are slow. A conventional rinse process relies on convection (approx. 1.5 hr for fluid near the surface to transit the length of the cell) and settling, with a settling rate in the order of 5-10 µm/min.

Figure 34:
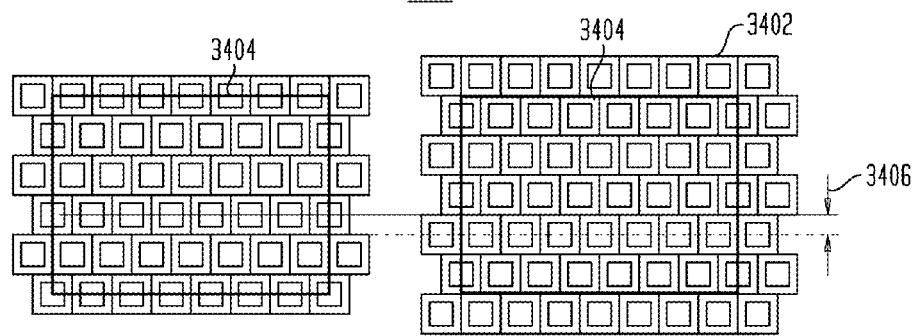
FIG. 34 illustrates a deposition system that is a current deposition process rescaled to reduce process time.

FIG. 34 illustrates a deposition system 3400 that is a current deposition process rescaled to reduce process time. In system 3400, deposition of nanostructures on panel 3404 occurs in the rectangular deposition cells 3402, so the deposition process must be performed two times (two cycles) to deposit nanostructures across the entire substrate. For instance, a first deposition cycle is performed by the set of cells 3402 shown on the left side of FIG. 34. Panel 3404 is then shifted by distance 3406, and a second deposition cycle is performed by the set of cells 3402 shown on the right side of FIG. 34. If each cell 3402 had 100% efficiency, then only a single deposition cycle would be required. However, there is an outer periphery of each cell 3402 where deposition is not performed, and thus two deposition cycles are used. For a 3 meter by 3 meter panel, an example target process time is 5 minutes (2.5 minutes per deposition cycle) for a 2 stage deposition.

Figure 35:
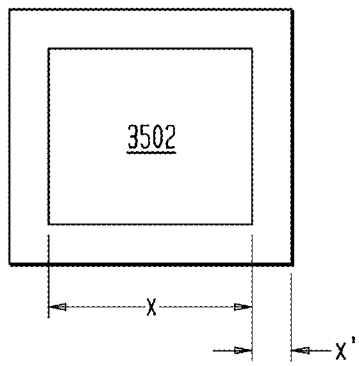
FIG. 35 shows a deposition cell, according to an example embodiment.

FIG. 35 shows a deposition cell 3500, indicating a central region 3502 of cell 3500 where deposition occurs (e.g., the "sweet spot"), having an area of x by x. The periphery of cell 3500 where deposition does not occur has a width x'. Cell 3500 may be miniaturized to provide an array of cells 3500 for deposition across panel 3404. Such a process may be limited by a flow rate of nanowires at the panel surface ~20 µm/sec. A process time for complete deposition may be around 2 minutes. The deposition process and rinse process may each take approximately the same amount of time. In such a configuration, a dimension X of cell 3500 may be calculated as follows:

$$X = x + x' = t^* v = 60 \text{ s}(20 \text{ µm/s}) = 1200 \text{ µm}. \quad \text{Equation 5}$$

Thus, in this example, a size of cell 3500 may be approximately 1.2 mm×1.2 mm, for a number of cells 3500 of 6.25× $10^6$ cells per three meter square panel.

Figure 36:
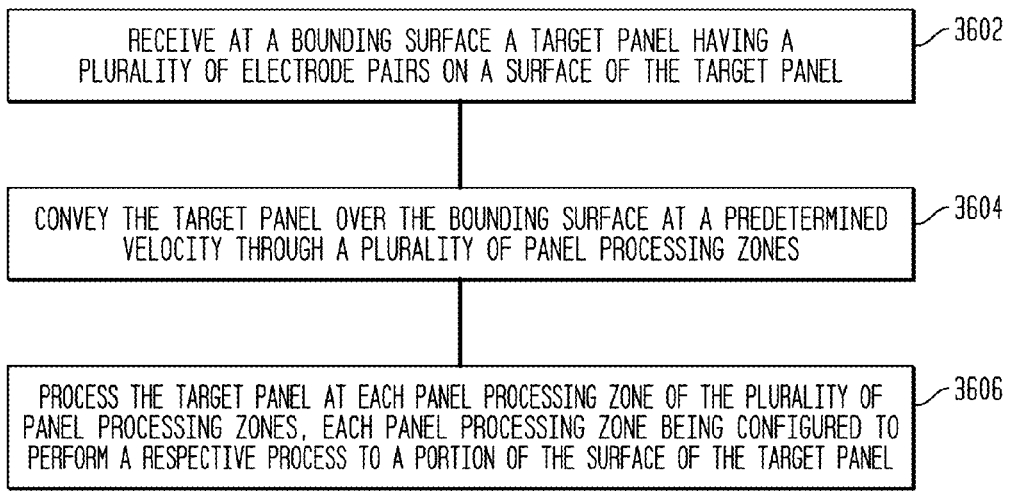
FIG. 36 shows a flowchart providing a process for deposition of nanostructures, according to an embodiment.

FIG. 36 shows a flowchart 3600 providing a process for deposition of nanostructures, according to an embodiment. For example, in an embodiment, flowchart 3600 may be performed by nanostructure deposition system 3100 shown in FIG. 31. Other structural and operational embodiments will be apparent to persons skilled in the relevant art(s) based on the following discussion.

Flowchart 3600 begins with step 3602. In step 3602, a bounding surface receives a target panel having a plurality of electrode pairs on a surface of the target panel. For instance, as shown in FIG. 31, bounding surface 3102 receives target panel 3108. Target panel 3108 has a plurality of electrode pairs on surface 3110. Target panel 3108 may be received at an entry point of system 3100 (e.g., on the left side of system 3100 in FIG. 31, at first panel processing zone 3106a).

In step 3604, the target panel is conveyed over the bounding surface at a predetermined velocity through a plurality of panel processing zones. For instance, as shown in FIG. 31, target panel 3108 is conveyed over bounding surface 3102 by transport mechanism 3104. For instance, target panel 3108 may be conveyed through system 3100 from left to right in FIG. 31, in the direction of arrow 3112. Transport mechanism 3104 may be any type of transport mechanism suitable for transporting target panel 3108 over bounding surface 3102, including stepper motor, a conveyor system, etc.

In step 3606, the target panel is processed at each panel processing zone of the plurality of panel processing zones, each panel processing zone being configured to perform a respective process to a portion of the surface of the target panel. For example, as shown in FIG. 31, as target panel 3108 is transported through system 3100 in the direction of arrow 3112, portions of target panel 3108 sequentially enter first-nth panel processing zones 3106a-3106n to be correspondingly processed. For instance, referring to FIG. 33, a first portion of target panel 3108 may first be processed in zone 3106a (e.g., by substrate wetting device 3302), may next be processed in zone 3106b (e.g., by nanostructure deposition device 3304), may next be processed in zone 3106c (e.g., by substrate rinsing device 3306), may next be processed in zone 3106d (e.g., by repair device 3308), may next be processed in zone 3106e (e.g., by nanostructure deposition device 3310), and may be processed in subsequent zones, when present. Subsequent portions of target panel 3108 are processed in a similar manner, and different portions of target panel 3108 may be processed in different zones 3106 simultaneously.

Figure 37:
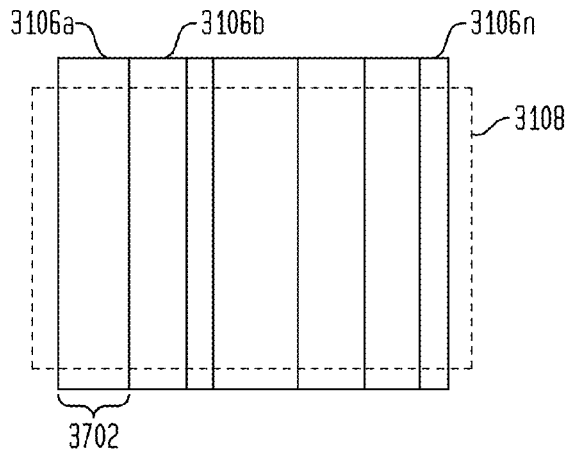
FIG. 37 shows a deposition system that includes a plurality of panel processing zones, according to an example embodiment.

Zones 3106 may have different processing times, depending on their widths and the velocity of target panel 3108. For instance, FIG. 37 shows a deposition system 3700 similar to deposition system 3100 of FIG. 31 that includes first-nth panel processing zones 3106a-3106n. As shown in FIG. 37, each of first-nth panel processing zones 3106a-3106n has a corresponding width that may be different than the widths of others of first-nth panel processing zones 3106a-3106n. For example, first panel processing zone 3106a is indicated as having a width 3702. Depending on the value of width 3702, a portion of target panel 3108 has a corresponding processing time in first panel processing zone 3106. For instance, Table 1 below shows various processing times "t" for first panel processing zone 3106 for various values of width 3702 "w" (for an example velocity "v" of target panel), where t=w/v:

TABLE 1

| t | w | v |
|---|---|---|
| 1 sec | 10 mm | 10 mm/sec |
| 10 sec | 100 mm | 10 mm/sec |
| 100 sec | 1000 mm | 10 mm/sec |

Figure 38:
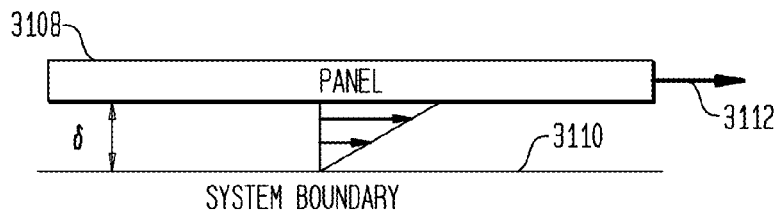
FIG. 38 illustrates linear process shear, where a motion of a target panel versus a bounding surface creates shear and influences a velocity profile.

FIG. 38 illustrates linear process shear, where a motion of target panel 3108 versus bounding surface 3102 creates shear and influences a velocity profile, which affects the deposition process. As indicated in FIG. 38, a shear stress τ may be calculated according as follows:

$$\tau = \eta \frac{dv}{dy} = \eta \frac{v}{\delta}$$ Equation 6 where

δ=the gap between target panel 3108 and bounding surface 3102, and

η=the dynamic viscosity of the solution.

Various values for shear stress for various gap values are shown in Table 2 below:

TABLE 2

| δ in mm | shear stress dv/dy in 1/sec |
|---|---|
| 0.01 | 1000 |
| 0.1 | 100 |
| 1 | 10 |
| 10 | 1 |

As indicated in Table 2, shear stress increases as the gap between target panel 3108 and bounding surface 3102 decreases.

Figure 39:
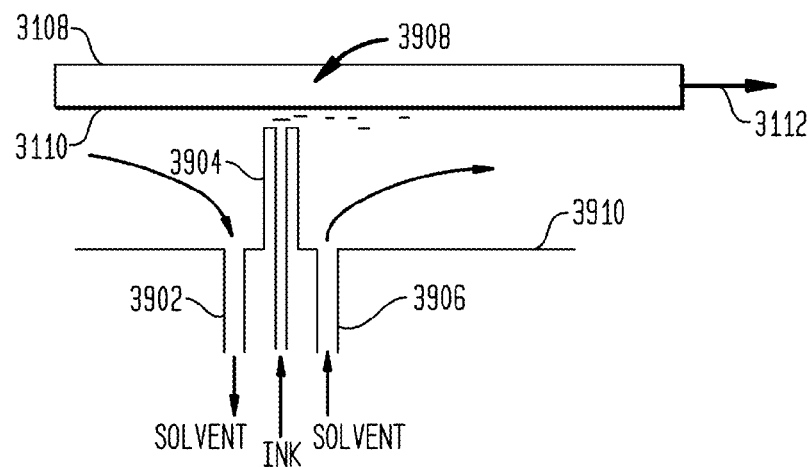
FIGS. 39 and 40 illustrate side views of example nanowire deposition techniques, according to embodiments.
Figure 40:
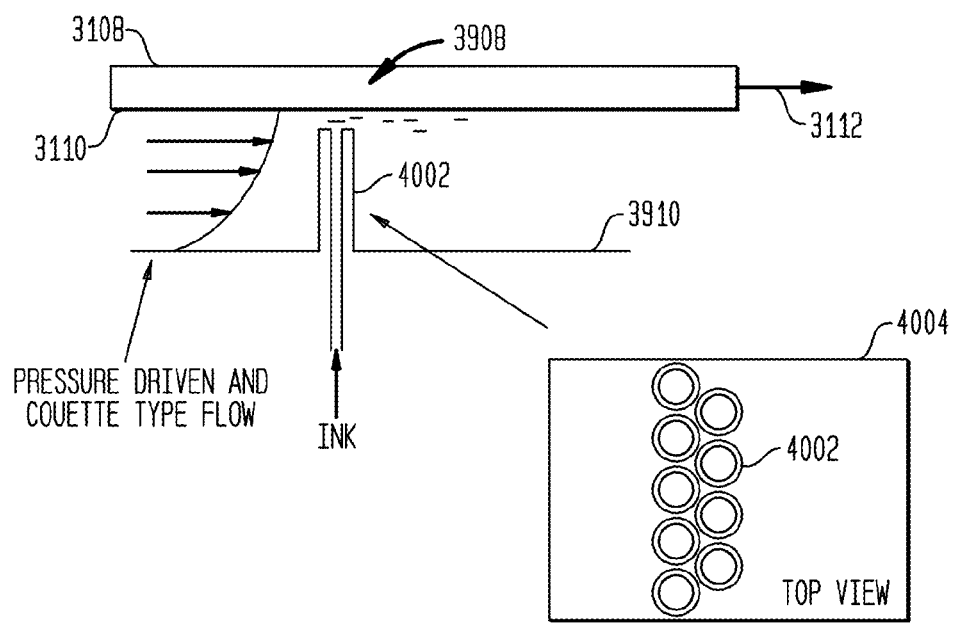

FIGS. 39 and 40 illustrate side views of example nanowire deposition techniques, according to embodiments. For example, the nanowire deposition techniques shown in FIGS. 39 and 40 may be performed by one or both of nanostructure deposition devices 3304 and 3310 shown in FIG. 33, in embodiments. As shown in FIG. 39, a surface 3910 is adjacent to surface 3110 of target panel 3108. Surface 3910 may be bounding surface 3102 or other surface (e.g., surface of nanostructure deposition devices 3304 and 3310). As shown in FIG. 39, surface 3910 includes a first port 3902, a second port 3904, and a third port 3906. First and third ports 3902 and 3906 are shown flush with surface 3910, and second port 3904 is shown as a tube that protrudes from surface 3910, although in embodiments, any of ports 3902, 3904, and 3906 may be flush with or protrude from surface 3910. Furthermore, any number of each of ports 3902, 3904, and 3906 may be present, including a plurality of one or more of ports 3902, 3904, and 3906.

First port 3902 is a solvent removing port. As indicated by the arrow in FIG. 39, solution is received in port 3902 to be removed from the deposition system from between surfaces 3110 and 3910. Second port 3904 is a nanowire ink injection port. Port 3904 provides nanowires 3908 into the solution between surfaces 3110 and 3910 for deposition onto electrodes on surface 3110 (e.g., by application of an electric field, as described above). Port 3904 may be tube shaped to be positioned proximate to substrate 3110, to inject nanowires 3908 into the solution near substrate 3110. The nanowire ink may have any concentration, including a relatively high concentration of nanowires to solution. In this manner, loading of the electrodes of surface 3110 may occur relatively rapidly. Furthermore, by localizing the nanowire ink, and subsequent rinse cycle may be performed more rapidly and/or efficiently. Third port 3906 is a solvent injecting port. As indicated by the arrow in FIG. 39, solution is provided from port 3906 to be inserted between surfaces 3110 and 3910.

In the embodiment of FIG. 40, surface 3910 is adjacent to surface 3110 of target panel 3108. Surface 3910 includes a port 4002, which is shown as a tube that protrudes from surface 3910, although in embodiments, port 4002 may alternatively be flush with surface 3910. Port 4002 is a nanowire ink injection port. Port 4002 provides nanowires 3908 into the solution between surfaces 3110 and 3910 for deposition onto electrodes on surface 3110 (e.g., by application of an electric field, as described above). Port 4002 may be tube shaped to be positioned proximate to substrate 3110, to inject nanowires 3908 into the solution near substrate 3110. In this manner, loading of the electrodes of surface 3110 may occur relatively rapidly. Furthermore, by localizing the nanowire ink, and subsequent rinse cycle may be performed more rapidly and/or efficiently.

In an embodiment, in FIG. 40, solution may be provided between surfaces 3110 and 3910 according to a pressure driven and Couette type flow. Port 4002 may be included in a tube bank 4004 that includes a plurality of ports 4002 (a top view of tube bank 4004 is shown in FIG. 40). As shown in FIG. 40, tube bank 4004 includes two rows of ports 4002 that are arranged in a staggered pattern (e.g., first and second rows of ports 4002 that are offset from each other). Tube bank 4004 may be provided to provide a plurality of insertion locations for nanowires 3908 across surface 3110 at ports 4002. For instance, tube bank 4004 may aid in avoiding stream line expansion and contraction at ports 4002. For instance, the solution may pass by the tubes without being forced through a narrow path.

For an effective rinse, excess nanowires are removed from cell (vertically) and/or have to attain a velocity higher than the substrate (relative to the substrate). Unless the excess nanowires can be moved to a position of 100-1000 μm from the substrate (a point where the velocity difference between the substrate and nanowires is greater than the speed of the substrate), the shear stress will be too large for deposition. Thus, an effective rinse aims at creating a vertical velocity profile while not exceeding critical pinning force.

Figure 41:
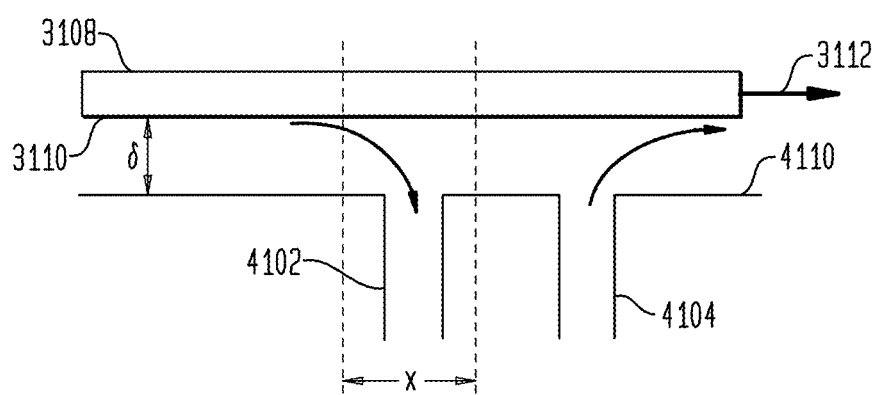
FIG. 41 illustrates a side view of an example nanowire rinse technique, according to an embodiment.

FIG. 41 illustrates a side view of an example nanowire rinse technique, according to an embodiment. For example, the nanowire rinse technique shown in FIG. 41 may be performed by substrate rinsing device 3306 shown in FIG. 33, in an embodiment. As shown in FIG. 41, surface 4110 is adjacent to surface 3110 of target panel 3108. Surface 4110 may be bounding surface 3102 or other surface (e.g., surface of nanostructure deposition devices 3304 and 3310). As shown in FIG. 39, surface 4110 includes a first port 4102 and a second port 4104. First and second ports 4102 and 4104 are shown flush with surface 4110, although in embodiments, ports 4102 and 4104 may protrude from surface 4110.

First port 4102 is a solvent removing port. As indicated by the arrow in FIG. 41, solution is received in port 4102 to be removed from the deposition system from between surfaces 3110 and 4110. Second port 4104 is a solvent injecting port. As indicated by the arrow in FIG. 41, solution is provided from port 4104 to be inserted between surfaces 3110 and 4110. A vertical velocity used to move a nanowire from surface 3110 to port 4102 is primarily dependent on the substrate velocity. For a 1 mm gap between surfaces 3110 and 4110, the vertical velocity may be on the order of t=x/v=0.5 mm/10 mm/s=0.05 s, where x is a horizontal distance over which excess nanowires are to be removed, and v is the velocity of target panel 3108. The vertical velocity $V_y=\delta/t=1$ mm/0.05 s=20 mm/s (e.g., nearly 1000 times greater than the velocity of a nanowire on surface 3110 held at the critical pinning force).

Figure 42:
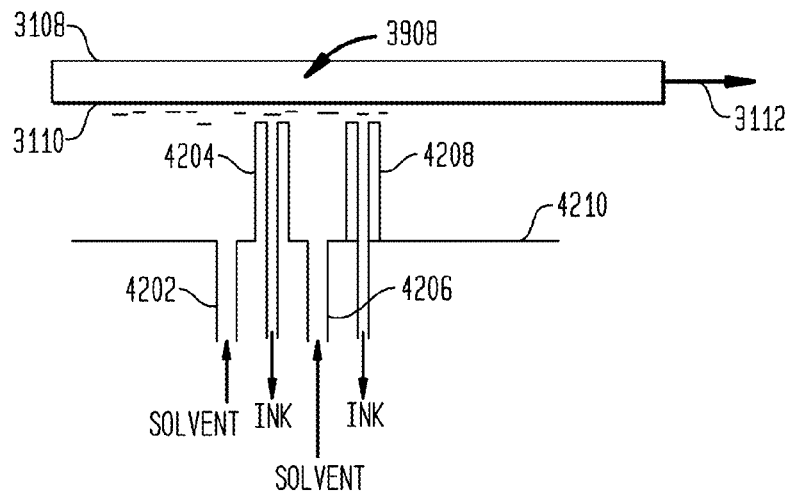
FIGS. 42 and 43 illustrate side views of example nanowire rinse techniques, according to embodiments.
Figure 43:
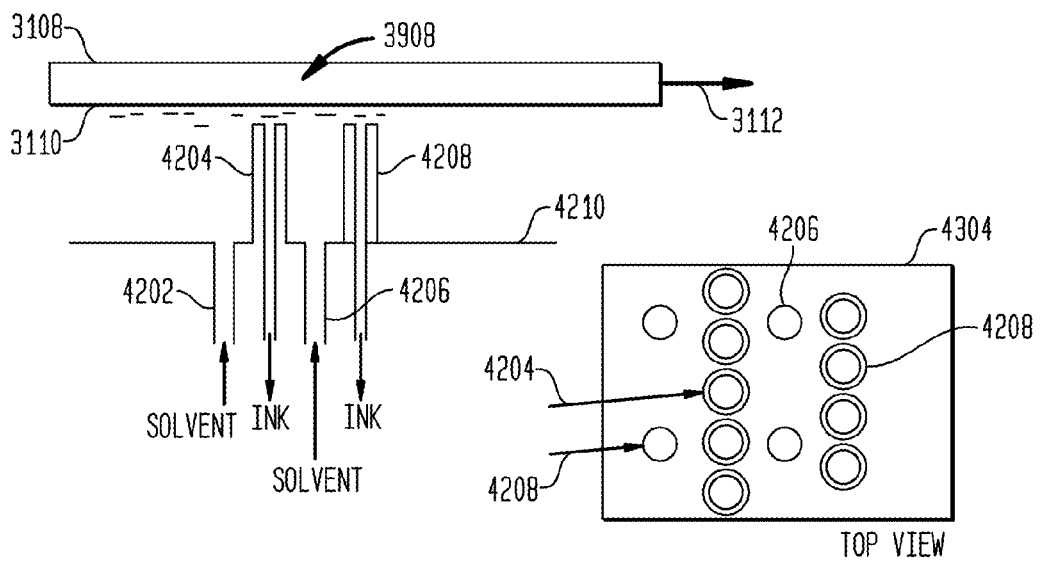

FIGS. 42 and 43 illustrate side views of example nanowire rinse techniques, according to embodiments. For example, the nanowire rinse techniques shown in FIGS. 42 and 43 may be performed by substrate rinsing device 3306 shown in FIG. 33, in embodiments. As shown in FIG. 42, a surface 4210 is adjacent to surface 3110 of target panel 3108. Surface 4210 may be bounding surface 3102 or other surface (e.g., a surface of substrate rinsing device 3306). As shown in FIG. 42, surface 4210 includes a first port 4202, a second port 4204, a third port 4206, and a fourth port 4208. First and third ports 4202 and 4206 are shown flush with surface 4210, and second and fourth ports 4204 and 4208 are shown as tubes that protrude from surface 4210, although in embodiments, any of ports 4202, 4204, 4206, and 4208 may be flush with or protrude from surface 4210.

First port 4202 is a solvent injecting port. Solution is provided from port 4202 to be inserted between surfaces 3110 and 4210. Second port 4204 is a nanowire ink removal port. Port 4204 receives nanowires 3908 from solution between surfaces 3110 and 4210. Port 4204 may be tube shaped to have an opening that is positioned adjacent to substrate 3110 (e.g., within a range of 10-100 μm), to remove nanowires 3908 closely located to substrate 3110. By localizing port 4204 near surface 3110, sufficient but reduced vertical flow is enabled to remove excess nanowires 3908 near surface 3110. Third port 4206 is a solvent injecting port. Solution is provided from port 4206 to be inserted between surfaces 3110 and 4210. Similarly to port 4204, fourth port 4208 receives nanowires 3908 from solution between surfaces 3110 and 4210, and is tube shaped to have an opening that is positioned adjacent to substrate 3110.

The embodiment of FIG. 43 is configured similarly to the embodiment of FIG. 42, where surface 4210 includes first-fourth ports 4202, 4204, 4206, and 4208. In the embodiment of FIG. 43, ports 4202, 4204, 4206, and 4208 are included in a tube bank 4304 that includes a plurality of each of ports 4202, 4204, 4206, and 4208 (a top view of tube bank 4304 is shown in FIG. 43). As shown in FIG. 43, tube bank 4304 includes four rows of ports corresponding to ports 4202, 4204, 4206, and 4208 that are arranged in a staggered pattern. Two of ports 4202 are shown in the first row, five of ports 4204 are shown in the second row, two of ports 4206 are shown in the third row, and four of ports 4208 are shown in the fourth row, although in an embodiments, any numbers of ports 4202, 4204, 4206, and 4208 may be included in any particular row. The second and fourth rows are staggered relative to each other (e.g., the second and fourth rows of ports 4204 and 4208 are parallel and offset from each other). Tube bank 4304 may be provided to provide a plurality of solution insertion locations and nanowire removal locations. For instance, tube bank 4304 may enhance nanowire removal near surface 3110 due to including tubes having openings near surface 3110, and by keeping shear stress low by allowing flow around the tubes. Solvent is injected by ports 4202 and 4206 to maintain continuity. In one embodiment, the vertical velocity may be reduced by elevating the tubes to provide a 100 μm gap between the openings of ports 4204 and 4208 and surface 3110 (for a channel gap of 1 mm).

E. Techniques for Moving Particles Toward and Away from Surfaces

As described above, a dielectrophoretic nanowire deposition process for macroelectronics applications may require that the nanowires be deposited to be quite close to the substrate (typically within a distance that is one or two times the electrode gap). This proximity is usually achieved by a) gravitational settling, or b) a high concentration of nanowires in solution. After the nanowires have deposited at the electrode gaps, a flush process may be used to remove excess nanowires. Near the substrate, the flow may be much slower than the average velocity, decreasing to at or near zero velocity at the substrate. This can result in a very slow flush, unless the excess nanowires can be moved normal to the substrate into the higher velocity flow. This may also be accomplished with gravitational settling by inverting the substrate and flow chamber.

An alternative process is desired that can produce forces stronger than gravity to accelerate the motion of nanowires toward and away from the substrate, as this would speed up the deposition process. In addition, a process which did not require inverting the substrate may be scalable to large (>1 m²) substrates.

As such, in an embodiment, electrostatic forces are used to move particles toward or away from surfaces as part of a process of depositing the particles on the surface. For instance, by charging nanowires and exposing the electrodes to the solvent, the charged nanowires will move normal to the substrate in a DC field. However, this process will inject ions from the electrodes and solvent into the solvent, which may cause contamination and/or deposition problems.

In embodiments, a substrate-normal force on the nanowires is increased, with improved scalability and reduced ionic contamination. In an embodiment, a first pair of electrodes may be positioned on a substrate and one electrode or a second pair of electrodes may be positioned on an opposed flow chamber wall to produce an electric field. The substrate electrodes are used for dielectrophoretic deposition of nanowires from solution. Each pair of electrodes may be isolated from the solvent by a dielectric material. Electrostatic forces on the nanowires are produced by the electric field between the two sets of electrodes. If a DC field is applied, ions in the solution will quickly screen the field, and little net motion will occur. An AC waveform may be used, and may be tailored to produce a desired motion of the nanowires. In an embodiment, the electrophoretic force is the generated force that produces movement of the nanowires. By using an asymmetric AC field (e.g., the rise time is different from the fall time and/or the time at the high voltage is different from the time at the low voltage) a net force is imposed on the nanowires. For instance, this may be due to the different timescales of motion of the screening ions and the nanowires, or different timescales of the voltage rise and the screening.

In another embodiment, a dielectrophoretic force is utilized. A non-uniform field (non-uniform in at least one direction) is generated. For example, an electrode or other type of electrical conductor such as a wire or rod can be translated parallel to the substrate (and perpendicular to the axis of the rod). An electric field between the electrodes and the rod is non-uniform, and nanowires are attracted to the high-gradient regions of the field. The non-uniformities in the field are near the rod and near the deposition electrodes. If the rod is small and sufficiently close to the substrate electrodes, the rod-gradient exceeds the substrate gradients, and the nanowires are pulled away from the substrate, as desired.

The AC field between the substrate electrodes (the first pair) and the flow-channel electrode (the second pair) can be superimposed on a dielectrophoretic deposition field between the substrate electrodes. The flow-channel electrode is not necessarily on the channel wall. The flow-channel electrode can be inside or outside the channel. The wire or rod described above could instead be a screen or other form, as long as the field gradients near this electrode were greater than near the substrate. Instead of translating parallel to the substrate, the electrode could be fixed in space and coverage of the substrate could be accomplished by an electrode layout that was aligned to the substrate electrodes and had features on the same pitch.

Vertical control of nanowires in this manner may be used to reduce deposition time. Nanowires may be moved in a first direction (e.g., upward or downward) normal to the deposition substrate to move the nanowires towards electrodes on the substrate to aid deposition and pinning, and/or may be moved in a second direction normal to the deposition substrate to move the nanowires away from the electrodes on the substrate. In one example, nanowire vertical control was performed on a substrate covered with TEOS tetraethyl orthosilicate). Any asymmetric pulse between E-field and the cover metal enabled nanowire vertical control.

Embodiments may be configured in various ways. For example, FIG. 44 shows a side view of enclosed flow channel 4400 that includes a substrate 4402 and a cover 4404 (e.g., a second substrate or a surface of the flow container/chamber). In the example of FIG. 44, flow channel 4400 has opposing first and second surfaces formed by substrate 4402 and cover 4404. Substrate 4402 includes a first electrode pair 4406 that includes a first electrode and a second electrode, and cover 4404 includes an electrical conductor 4408, which may be a single electrode or a second electrode pair that includes a third electrode and a fourth electrode, a wire, a rod, or a screen, for example. A dielectric material 4410 coats first electrode pair 4406, and a dielectric material 4412 coats second electrode pair 4408. An inlet port 4418 is configured to provide a flow of a suspension 4416 into channel 4400. Suspension 4416 includes a plurality of nanowires. An electrical signal source 4414 is coupled to first and second electrode pairs 4406 and 4408 that is configured to generate an AC electric field with first and second electrode pairs 4406 and 4408 to impose a net force in a direction normal to the surfaces of substrate 4402 and cover 4404 on at least one nanowire in suspension 4416.

FIG. 45 shows a flowchart 4500 providing a process for deposition of nanostructures, according to an embodiment. For example, in an embodiment, flowchart 4500 may be performed in flow channel 4400 shown in FIG. 44. Other structural and operational embodiments will be apparent to persons skilled in the relevant art(s) based on the following discussion.

Flowchart 4500 begins with step 4502. In step 4502, a suspension that includes a plurality of nanowires is flowed through an enclosed flow channel having opposing first and second surfaces, the first surface including a first electrode pair that includes a first electrode and a second electrode, and the second surface including a second electrode pair that includes a third electrode and a fourth electrode. For example referring to FIG. 44, suspension 4416 includes nanowires, and is flowed through channel 4400. Channel 4400 includes a first surface—a substrate 4402 that includes electrode pair 4406—and a second surface—a cover 4404—that includes electrode pair 4408. In this manner electrode pair 4408 is positioned in channel 4400. In another embodiment, another type of electrical conductor, such as a wire or rod may be positioned in channel 4400 instead of electrode pair 4408.

In step 4504, an alternating current (AC) electric field is generated with the first and second electrode pairs to impose a net force in a direction normal to the first and second surfaces on at least one nanowire in the suspension. For instance, referring to FIG. 44, electrical signal source 4414 may be coupled to electrode pair 4406 and electrode pair 4408 to generate an AC electric field. The AC electrical field may impose a net force in a direction normal to the surfaces of substrate 4402 and cover 4404 (e.g., perpendicular to the direction of the arrow representing suspension 4416 in FIG. 44) on at least one nanowire in suspension 4416.

For instance, in one example, electrical signal source 4414 may apply a triangle pulse signal pulse to generate the AC electric field. A Tesla (Al/TEOS (200 nm/40 nm)) substrate was used as substrate 4402, a Tenri wafer (Al/TEOS (400 nm/100 nm)) was used as cover 4404, and a spacing between the substrate and cover of 180 µm was used.

Figure 46:
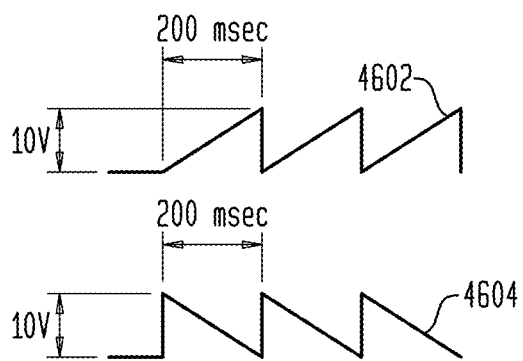
FIGS. 46 and 47 show AC waveforms that may be used in example deposition embodiments.
Figure 47:
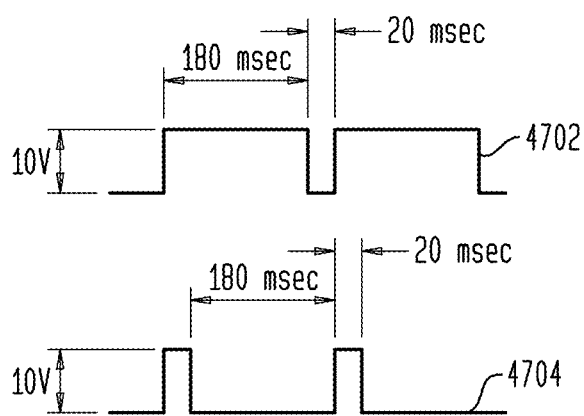

FIGS. 46 and 47 show AC waveforms that may be used in example embodiments, such as the Tesla substrate example. FIG. 46 shows first and second waveforms 4602 and 4604 that may be used to control movement of nanowires during deposition, for example. First waveform 4602 is shown being a saw tooth pulse waveform with a triangular rising edge and sharply falling trailing edge, with a 200 msec period and 10 V amplitude. Second waveform 4604 is shown as being a reverse saw tooth pulse waveform with a sharply rising edge and a triangular falling edge, with a 200 msec period and 10 V amplitude. As indicated in FIG. 46, first waveform 4602 may be configured to force the nanowires downward (e.g., for a first period of time), and second waveform 4604 may be configured to force the nanowires upward (e.g. for a second period of time). It is noted that the parameters shown in FIG. 46 for first and second waveforms 4602 and 4604 are provided for purposes of illustration, and are not intended to be limiting.

For instance, a pulse between E-field (V3) may be a sine pulse off=400 Hz, and Vpp=1V. According to a procedure, the nanowires may be filled, the nanowires may be forced downward (V1) without liquid flow. Nanowire deposition may occur (V3) with weak liquid flow. Flashing of nanowires (V2 and V3) may be performed with liquid flow.

In another example of the FIG. 44, rectangular AC waveforms may be used, as shown in FIG. 47. FIG. 47 shows first and second waveforms 4702 and 4704 that may be used to control movement of nanowires during deposition, for example. First waveform 4702 is shown being a rectangular pulse waveform with a 180 msec high cycle length, a 20 msec low cycle length, and a 10 V amplitude. Second waveform 4604 is shown as being a rectangular pulse waveform with 20 msec high cycle length, a 180 msec low cycle length, and a 10 V amplitude. As indicated in FIG. 47, first waveform 4702 may be configured to force the nanowires downward (e.g., for a first period of time), and second waveform 4704 may be configured to force the nanowires upward (e.g. for a second period of time). It is noted that the parameters shown in FIG. 47 for first and second waveforms 4702 and 4704 are provided for purposes of illustration, and are not intended to be limiting.

F. Electrode Geometry Configured to Increase Operating Window for Single Nanowire Deposition As described above, nanowire deposition may be performed by capturing nanowires in solution onto a substrate using an electric field. The configuration of the electrodes used to generate the electric field can have a large impact on the operating window for electrode voltage and solution flow rate. For example, as the voltage is increased above 0 V, a critical voltage will be reached where the dielectrophoretic force on the nanowires will be equivalent to the shear stress of the flowing liquid resulting in pinning of the nanowires between the electrodes. At higher voltages multiple nanowires can pin on a single electrode. Multiple nanowires on an electrode may not be desirable and the voltage range between pinning of single and multiple wires can be very important, since variation on shear stress, electrode geometry, and voltage occurs across the wafer. As such, it is desirable to be able to control system parameters, such as electrode width, and spacing between electrodes of an electrode pair, the electrode voltage, and/or other parameters, to increase a size of the electrode voltage operating window that is used to pin single nanowires (or other desired numbers of nanowires). The wider the range of the electrode voltage that may be applied to consistently pin a single nanowire (or other desired number of nanowires), the more simplified and reliable that device fabrication becomes.

In embodiments, improved electrode geometries are provided that are configured to maximize a voltage range (an operating window) where single nanowires (or other desired numbers of nanowires) are pinned to electrodes.

The number of nanowires that are deposited on a particular electrode is dependent on the forces present in the deposition system. For instance, the dielectrophoretic force, hydrodynamic drag, a mutual repulsion between the nanowires, and repulsion between the nanowires and the substrate are factors. Two factors that promote multiple nanowires on a single electrode pair are the electric field strength relative to the hydrodynamic drag (a strong electric field or small drag will favor multiple nanowires) and the width of the electrodes. When two nanowires pin on an electrode pair, they interact with each other. The repulsion between the two nanowires causes them to separate. Because the electric field decays rapidly past the edge of an electrode, if a nanowire moves too far past the edge of an electrode, it will detach and be swept away by the solution flow due to hydrodynamic forces. Two nanowires can remain in a metastable state where two nanowires are pinned on an electrode for some period of time. After a long enough time, a large enough local fluctuation will typically cause one of the nanowires to detach. If the electrodes are wide, many nanowires can exist on a single electrode pair in a stable state. As the electrode width decreases to less than 3 µm, only single nanowires can be pinned to an electrode pair under specific operating conditions (voltage and flow rate). However, there is a relationship between the electrode width and voltage to preferentially pin single or multiple nanowires. As the electrode width decreases, high voltages can be applied without pinning multiple nanowires. The electrode thickness is important as well. Thinner electrodes generally provide a larger operating window.

For example, in one implementation, nanowires were pinned in a solution mixture of 85% IPA/15% $H_2O$ on an aluminum electrode pair that varied in thickness between 200 nm and 50 nm. For this electrode pair, the voltage range for single nanowire trapping decreased from 100 mV to 20 mV after increasing the electrode thickness from 50 nm to 200 nm. The thinner electrodes provide a larger operating window for single nanowire trapping. The operating window may be largest for the two dimensional case, where the electrode thickness is very thin. In one embodiment, to approach this, a damascene structure may be fabricated. In such as structure, the electrodes are imbedded in a low dielectric constant film. For instance, electrodes may be formed on a substrate. The low dielectric constant film may be applied to the substrate between the electrodes, to fill the space between the electrodes, such that the thickness of the film is the same as the thickness of the electrodes (i.e., the surfaces of the electrodes and the firm are co-planar or flush with each other). Alternatively, electrodes may be formed on a substrate, and the low dielectric constant film may be applied to the substrate and over the electrodes, to fill the space between the electrodes and cover the electrodes. The film may be etched to remove a top layer of the firm such that the surfaces of the electrodes become exposed, and the surfaces of the electrodes and of the film are co-planar or flush with each other.

Figure 48:
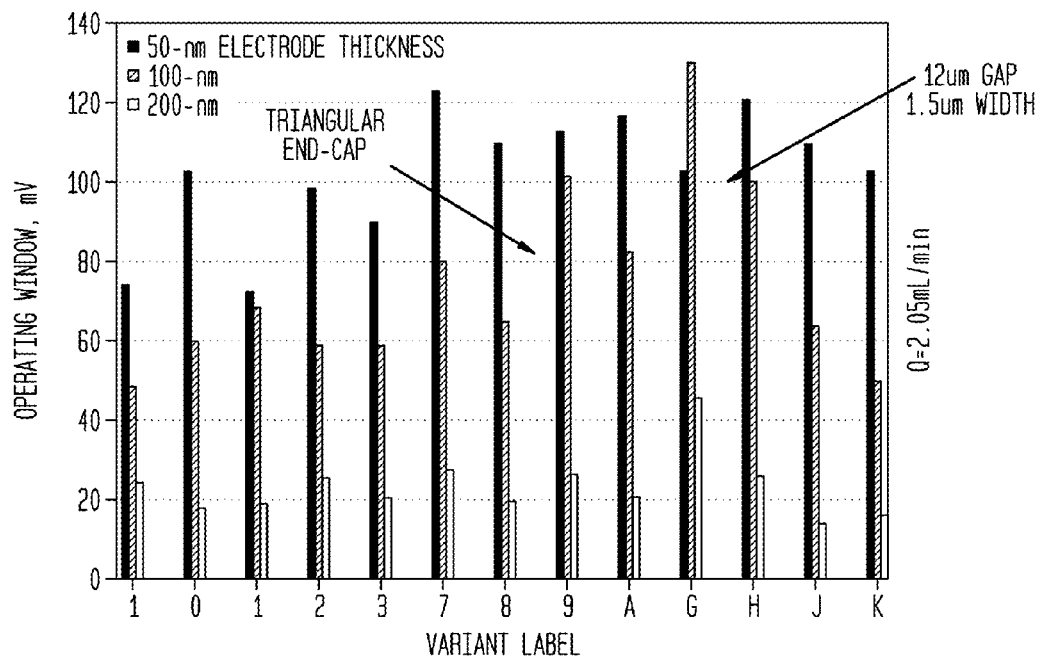
FIG. 48 shows an example plot of operating window versus variant label for a SLA matrix, illustrating an effect of electrode thickness, according to an example embodiment.

FIG. 48 shows an example plot 4800 of operating window (mV) for a plurality of variants, according to an example embodiment. Each variant is a corresponding electrode pair geometry configuration, having a particular electrode shape (e.g., triangular, circular, rectangular, etc.), a particular electrode width, a particular spacing between electrodes of the electrode pair, etc. Furthermore, for each variant, three different electrode thicknesses—50 nm, 100 nm, and 200 nm—are plotted to illustrate an effect of electrode thickness. The operating window is the voltage range in which single nanowire pinning on an electrode pair occurs. As indicated by plot 4800, as electrode thickness decreases, the operating window for single nanowire pinning generally increases. For instance, for variant 9, which has triangular electrode ends, the 50 nm electrode thickness results in an approximately 112 mV operating window, the 100 nm electrode thickness results in an approximately 100 mV operating window, and the 200 nm electrode thickness results in an approximately 27 mV operating window. However, for variant G, which has a 12 µm gap between electrodes of the electrode pair, and a 1.5 µm electrode width, the 50 nm electrode thickness results in an approximately 102 mV operating window, the 100 nm electrode thickness results in an approximately 130 mV operating window, and the 200 nm electrode thickness results in an approximately 46 mV operating window.

Figure 49:
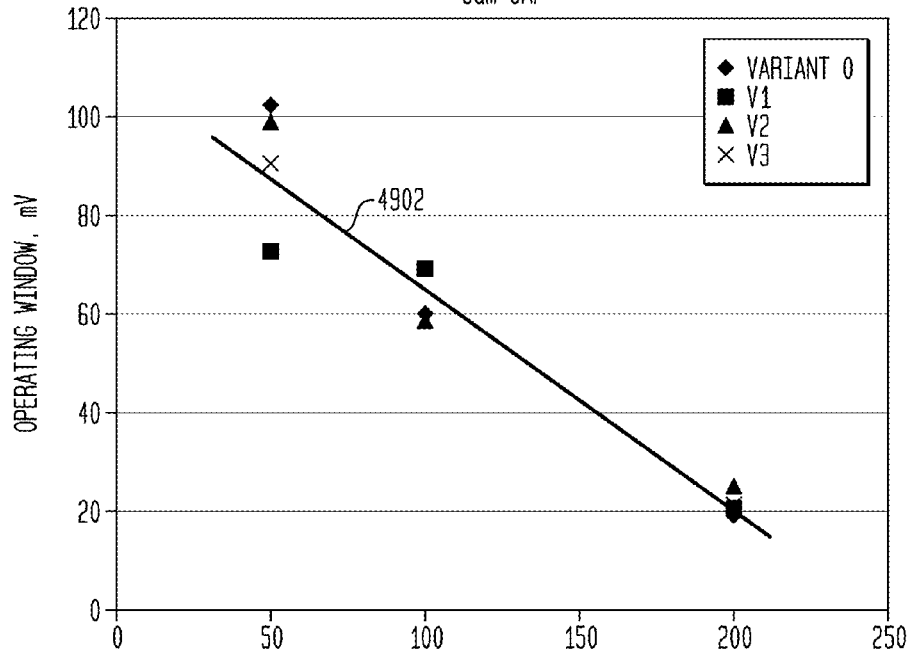
FIGS. 49 and 50 show plots of operating window versus electrode thickness, according to an example embodiment.
Figure 50:
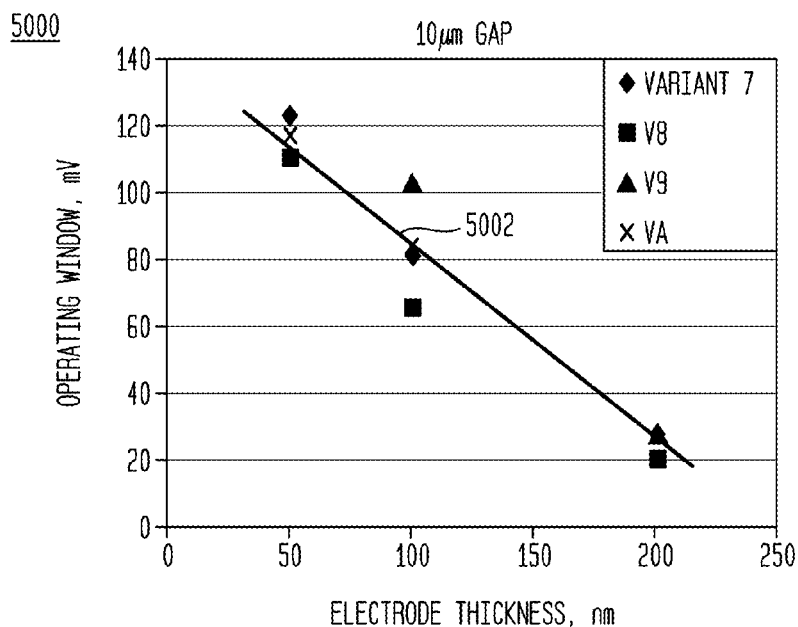

FIGS. 49 and 50 show plots 4900 and 5000 of operating window (mV) versus electrode thickness (nm) for four variants for an 8 μm gap (plot line 4902) and a 10 μm gap (plot line 5002), respectively, according to example embodiments. As shown in FIGS. 49 and 50, operating window decreases with increasing electrode thickness, and increases with decreasing electrode thickness. Exemplary causes for the effect include (1) the electrostatic repulsion between nanowires and/or between nanowires and substrate may influence nanowire stability near the electrode edges, and (2) the electric field at electrode edges increases (aspect ratio relative to gap).

Figure 51:
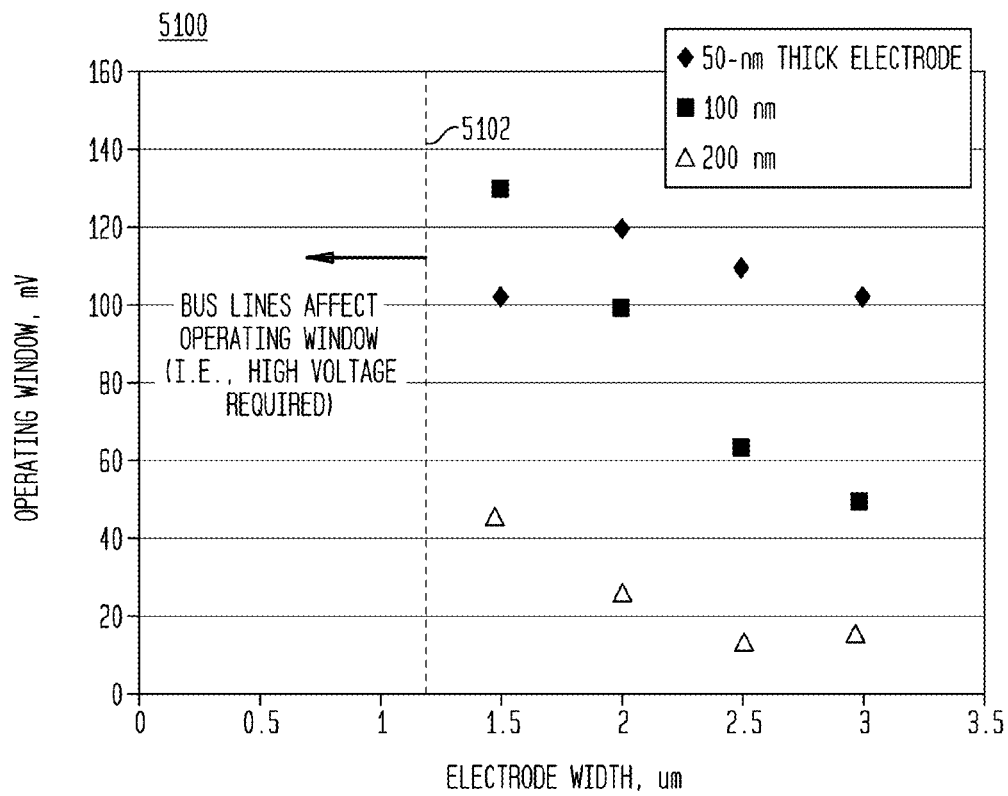
FIG. 51 shows an example plot of operating window versus electrode width, according to an example embodiment.

FIG. 51 shows an example plot 5100 of operating window (mV) versus electrode width (μm), showing an effect of electrode width, according to an embodiment. Three different electrode thicknesses—50 nm, 100 nm, and 200 nm—are plotted to illustrate an effect of electrode thickness. As indicated by plot 5100, as electrode thickness increases, the operating window decreases. Furthermore, as electrode width decreases, the operating window increases. It is noted that as electrode width decrease beyond about 1.2 μm (e.g., to the left of dotted line 5102), the electrical connectors (e.g., "bus lines") that connect together adjacent electrodes begin to have an undesired effect on operation (e.g., nanowires become attracted to undesired areas on the bus lines).

Thus, in embodiments, by providing thinner electrodes, the operating window (electrode voltage range) may be increased. A flat, two-dimensional electrode configuration (e.g., a Damascene structure) may be desirable to provide flat electrodes.

Furthermore, large operating windows were observed various electrode geometries, including 10 μm and 12 μm gaps (spacing between electrodes of an electrode pair), 1.5 μm and 2 μm electrode widths, and triangular electrode end-caps.

Still further, the spacing between adjacent electrode pairs has an effect on operating window. For more closely spaced electrode pairs (e.g., 4 μm distance between adjacent electrode pairs), a stronger electric field is present, resulting in a lower pinning electrode voltage being needed. However, the operating window in such as configuration is reduced. To create a larger operating window, the electrode pairs may be spaced further apart (e.g., an 8 μm or greater distance between adjacent electrode pairs).

It is noted that the electric field from the bus lines is non-negligible at higher voltages. For larger electrode gaps (between electrodes in an electrode pair) and decreasing electrode widths, higher pinning electrode voltages may be needed. As such, an increased distance (e.g., 5-10 μm) between the bus lines may be desirable to counteract the higher pinning electrode voltages.

G. Electrode Geometry Configured for Analogous Deposition of Nanowires on Arrays and Isolated Electrodes As described above, nanowire deposition may be performed by capturing nanowires in solution onto electrodes of a substrate using an electric field. The configuration of the electrodes used to generate the electric field can have a large impact on the deposition process. For example, closely spaced electrodes in an electrode array can influence the electric field of the nearest electrode neighbors. For electrode arrays, the voltage used to pin a nanowire can be less than that used for an isolated electrode pair depending on the spacing between the adjacent electrodes. Having both electrode arrays and isolated electrodes pairs with the same dimensions on the same wafer can result in deposition problems. This is because the dielectrophoretic force is different between the single electrode pair and the electrode array. Thus, at some operating voltages there will be single nanowires (which may be a desired amount of nanowires) deposited on isolated electrode pairs, while two nanowires are deposited on the electrode arrays, which is problematic.

Figure 52:
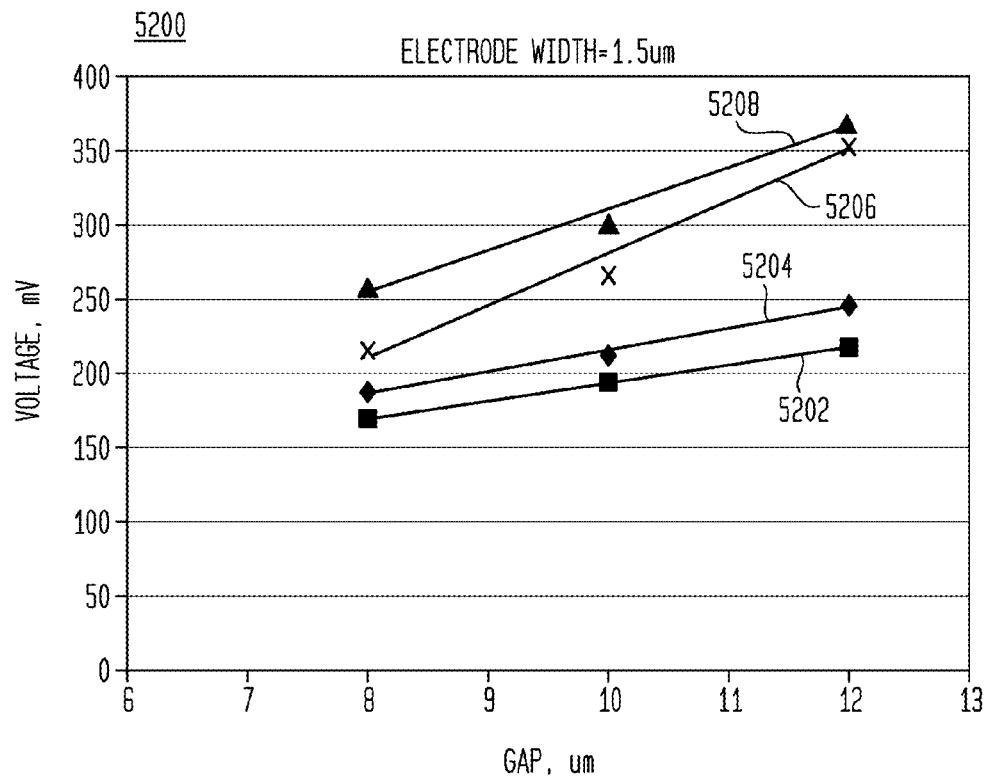
FIGS. 52-56 show plots that illustrate effects of the electrode gap (distance between electrode ends), electrode width, and electrode thickness on pinning voltage, according to example embodiments.

In embodiments, different electrode geometries may be used on a substrate for depositing of nanowires in closely space arrays and/or isolated electrode pairs, enabling nanowires of different sizes or for electrode patterns that require different spacings between adjacent electrodes to be deposited at the same operational voltage. For instance, in embodiments, the dielectrophoretic trapping response as a function of electrode geometry may be utilized. FIGS. 52-56 show respective plots that illustrate effects of the electrode gap (distance between the ends of the electrodes in an electrode pair), electrode width, and electrode thickness on the electrode voltage used for nanowire pinning For example, FIG. 52 shows a plot 5200 of pinning voltage (mV) versus gap size (μm) for an electrode width of 1.5 μm, illustrating an effect of electrode gap on pinning voltage. As shown in FIG. 52, plot 5200 includes a first plot line 5202, a second plot line 5204, a third plot line 5206, and a fourth plot line 5208. First plot line 5202 is a plot of pinning voltage for pinning a single nanowire on an electrode pair versus the electrode gap for an electrode pair in an array of electrode pairs spaced apart from each other by 4 μm. Second plot line 5204 is a plot of pinning voltage for pinning a single nanowire versus the electrode gap for an electrode pair in an array of electrode pairs spaced apart from each other by 8 μm. Third plot line 5206 is a plot of pinning voltage for pinning two nanowires on an electrode pair versus the electrode gap for an electrode pair in an array of electrode pairs spaced apart from each other by 4 μm. Fourth plot line 5208 is a plot of pinning voltage for pinning two nanowires versus the electrode gap for an electrode pair in an array of electrode pairs spaced apart from each other by 8 μm.

For each of plot lines 5202-5208, the pinning voltage increases with increasing electrode gap distance. Furthermore, as indicated by plot 5200, the required pinning voltage increases from first plot line 5202 (for a single nanowire on the more closely spaced electrode pairs), to second plot line 5204 (for a single nanowire on the less closely spaced electrode pairs), to third plot line 5206 (for two nanowires on the more closely spaced electrode pairs), to fourth plot line 5208 (for two nanowires on the less closely spaced electrode pairs). Thus, the required pinning voltage generally increases as the spacing between adjacent electrode pairs increases.

Figure 53:
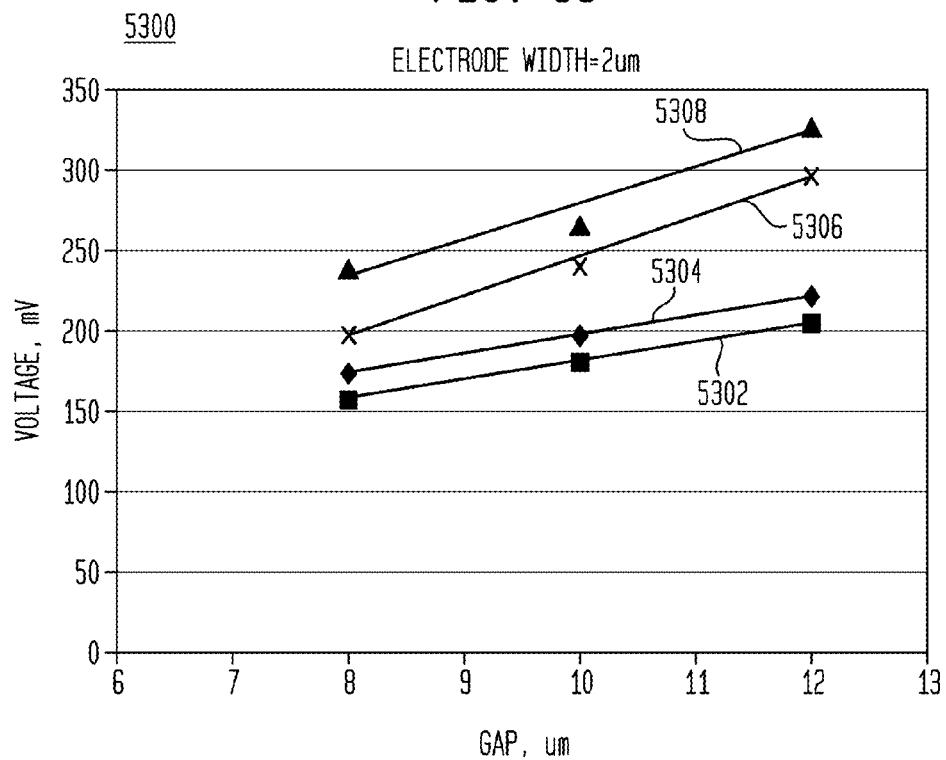

FIG. 53 shows a plot 5300 of pinning voltage (mV) versus gap size (μm) for an electrode width of 2 μm, illustrating an effect of electrode gap on pinning voltage. Plot 5300 includes first-fourth plot lines 5302, 5304, 5306, and 5308, which correspond to plot lines 5202, 5204, 5206, and 5208 of plot 5200 in FIG. 52. Plot lines 5302-5308 show similar effects to those of plot lines 5202-5208 of plot 5200, where pinning voltage increases with increasing electrode gap distance and with increasing electrode pair spacing. Furthermore, plot lines 5302-5308 of FIG. 53 are shifted lower in pinning voltage relative to plot lines 5202-5208 of FIG. 53, indicating that the pinning voltage decreases with increasing electrode width.

Figure 54:
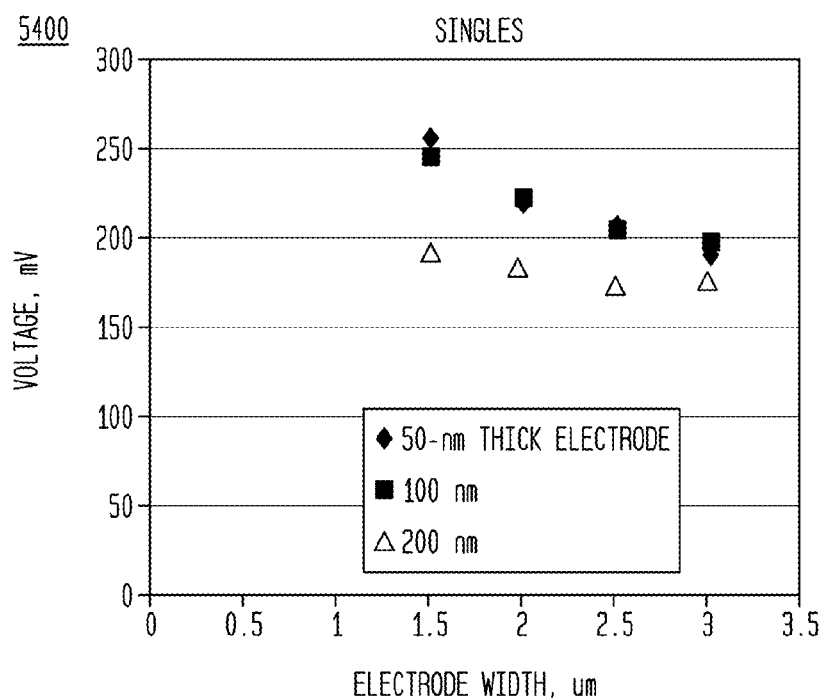
Figure 55:
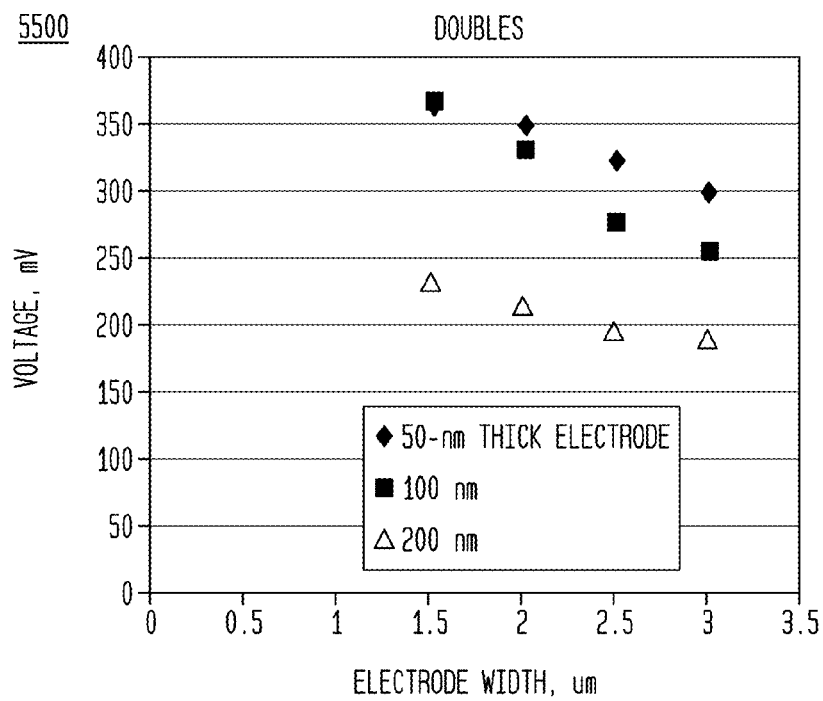

FIGS. 54 and 55 show respective plots 5400 and 5500 of pinning voltage (mV) versus electrode width (μm) for single nanowire and double nanowire pinning. Three different electrode thicknesses—50 nm, 100 nm, and 200 nm—are plotted in each of plots 5400 and 5500 to illustrate an effect of electrode thickness. As shown in FIGS. 54 and 55, pinning voltage increases with decreasing electrode width, and increases with decreasing electrode thickness. Furthermore, pinning two nanowires (plot 5500) generally requires a higher pinning voltage than pinning single nanowires (plot 5400).

Figure 56:
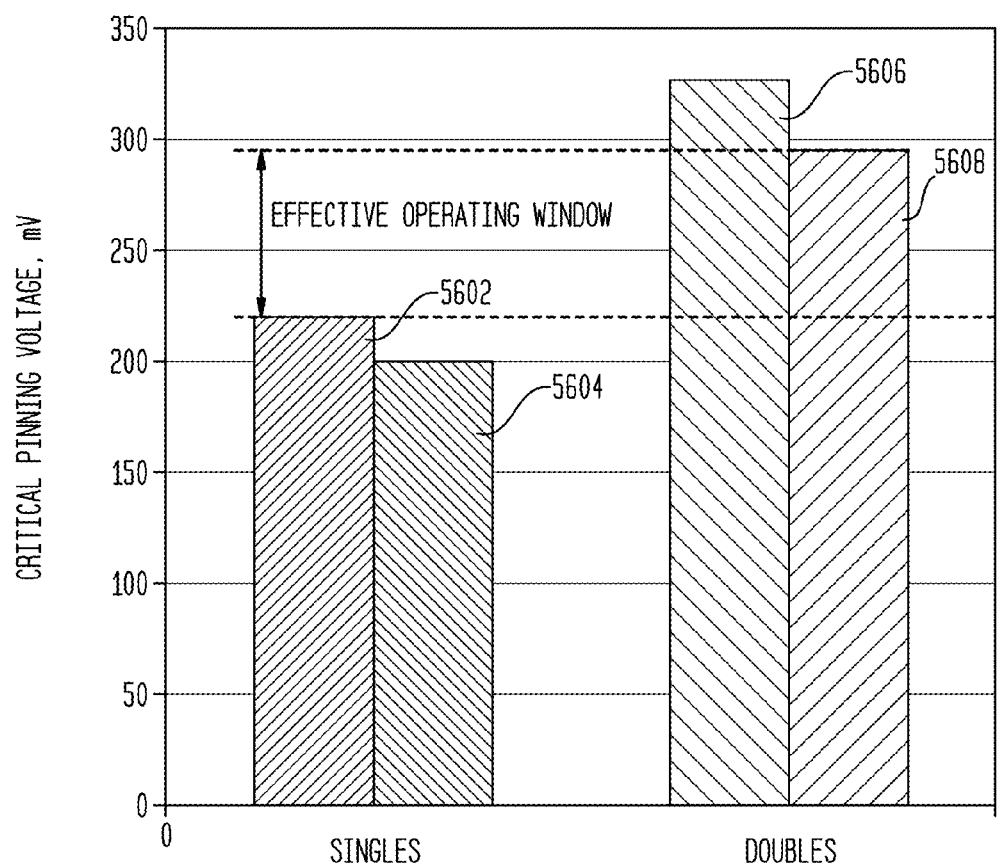

FIG. 56 shows a plot 5600 of critical pinning voltage (mV) for single nanowire pinning and double nanowire pinning, showing differences between closely spaced electrode pairs (e.g., spaced 4 nm in an array) and isolated electrode pairs (e.g., spaced 8 nm or more from other electrode pairs). In plot 5600, a plot bar 5602 indicates a critical pinning voltage of about 220 mV for single nanowire pinning to an isolated electrode pair, a plot bar 5604 indicates a critical pinning voltage of about 200 mV for single nanowire pinning to electrode pairs in an array, a plot bar 5606 indicates a critical pinning voltage of about 330 mV for double nanowire pinning to an isolated electrode pair, and a plot bar 5608 indicates a critical pinning voltage of about 300 mV for double nanowire pinning to electrode pairs in an array. As indicated by plot 5600, an effective electrode voltage operating window between single and double nanowire pinning of about 80 mV is present (300 mV-220 mV). The operating window may be increased in various ways, such as by increasing the electrode pair spacing in the array (to increase the critical pinning voltage indicated by plot bar 5608), by increasing the electrode gap for electrode pairs of the array (to increase the critical pinning voltage indicated by plot bar 5608), by decreasing the isolated electrode pair electrode gap (to decrease the critical pinning voltage indicated by plot 5602), etc.

As such, the electrode pinning voltage decreases with increasing electrode width and/or with decreasing electrode gap. As such, the electrode width may be modified to adjust the required electrode voltage for pinning one or more nanowires. For instance, the electrode width may be increased to decrease the required pinning voltage, or may be decreased to increase the required pinning voltage. However, the electrode width is a less flexible parameter when attempting to trap a specific number of nanowires at an electrode because both the pinning voltage and the equilibrium number of nanowires per electrode changes. A wider electrode can accommodate a larger number of pinned nanowires relative to a narrower electrode. A narrower electrode can accommodate a lower number of pinned nanowires. Furthermore, the electrode gap may also be modified to adjust the required electrode voltage for pinning one or more nanowires. For instance, the electrode gap may be increased to increase the required pinning voltage, or may be decreased to decrease the required pinning voltage. As such, the electrode width and/or electrode gap are parameters of an electrode geometry that may be modified to adjust the required electrode voltage for pinning one or more nanowires.

For instance, plot lines 5202 and 5206 of FIG. 52, which relate to electrode arrays having closely spaced electrode pairs, have lower required pinning voltages relative to plot lines 5204 and 5208, which relate to isolated electrode pairs (for a same number of pinned nanowires). Because electrode arrays having closely spaced electrode pairs require a lower pinning voltage than an isolated electrode pair, the electrode gap of the isolated electrode pair may be decreased to cause the isolated electrode pair to have a decreased pinning voltage that matches the pinning voltage of the electrode array (e.g., a first electrode pair may be configured to have a first geometry to match a minimum pinning voltage associated with the first electrode pair with a minimum pinning voltage associated with a second electrode pair having a second, different geometry). This way, a same voltage can be applied to the isolated electrode pair and the electrode pairs of the electrode array to pin nanowires thereto. This permutation and other permutations of electrode geometry can be used to deposit a specified number of nanowires at each electrode pair regardless of the electrode layout. It is noted that electrode thickness may be modified, although typically it is constant and a significant amount of processing is performed to locally alter electrode thickness.

H. Electrode Geometry Configured for Controlled Nanowire Locking to Substrate after Deposition As described above, nanowire deposition may be performed by capturing nanowires in solution onto a substrate using an electric field. The configuration of the electrodes used to generate the electric field can have a large impact on the locking process after deposition. For instance, an incorrect electrode geometry can result in misalignment of the nanowires.

Example embodiments are provided for improved electrode geometry and pinning voltage to improve nanowire alignment to be parallel and centered on electrodes during locking of nanowires to substrate. For instance, the locking of dielectrophoretically pinned nanowires to substrates may be improved. In an embodiment, nanowires lock with small alignment variation on thin electrodes with triangular tips. At high voltages used for locking there can be a very sharp gradient at the electrode edges. Wider electrodes may lock nanowires at either of the edges of the electrodes instead of the center. Sharp corners and edges for the electrodes can have a very large effect on the field. The field tends to be concentrated at edges. Thus, the ends of the electrodes may be shaped to generate electric field gradients that cause deposited nanowires to be attracted to desired electrode locations. Furthermore, the electrode material and film stack (a dielectric could coat the electrode), electrode geometry, solvents, and/or types of nanowires used for deposition may be varied to control nanowire locking location.

Figure 57:
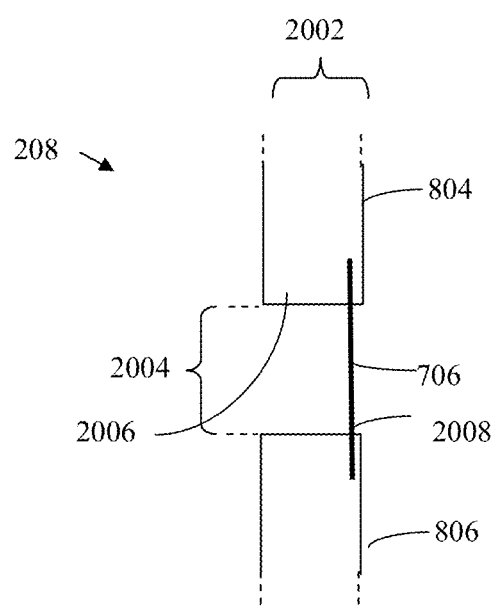
FIG. 57 shows an electrode pair formed on a substrate, according to an example embodiment.

For instance, FIG. 57 shows an electrode pair 208 formed on a substrate, according to an example embodiment. Electrode pair 208 includes first electrode 804 and second electrode 806. First electrode 804 has a rectangular end 2006 and second electrode 806 has a rectangular end 2008. As shown in FIG. 57, each of electrodes 804 and 806 has a width 2002, and an electrode spacing 2004 (or a gap, a distance) is present between ends 2006 and 2008 respectively of electrodes 804 and 806. A nanowire 706 is shown in FIG. 57 as pinned to electrodes 804 and 806. Due to the rectangular shape of electrodes 804 and 806, nanowire 706 has migrated and pinned at a right edge of electrodes 804 and 806 in FIG. 57. Furthermore, when rectangular electrodes 804 and 806 are used, double nanowire deposition has a high percentage (e.g., around 20% in some configurations). In one example configuration using rectangular electrodes, nanowires were locked to the electrodes using a 30 Vpp amplifier. A max locking voltage used was 16 Vrms. As the voltage was increased, the nanowires started migrating toward the edges of the electrodes, similarly to as shown in FIG. 57.

Figure 58:
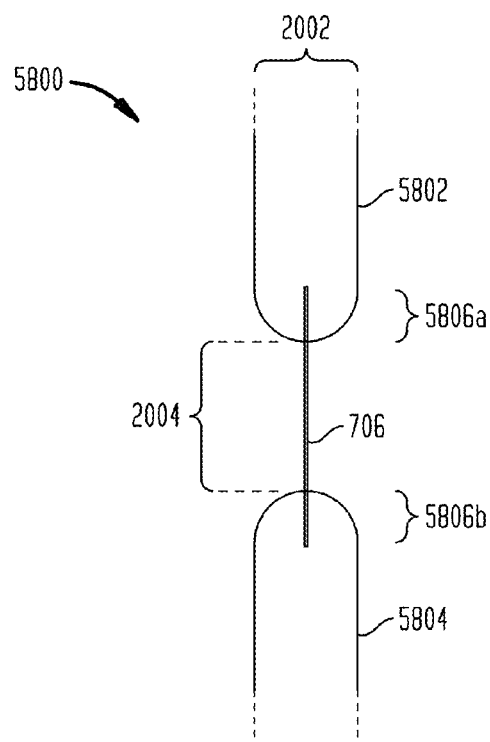
FIG. 58 shows an electrode pair with rounded electrode tips formed on a substrate, according to an example embodiment.
Figure 59:
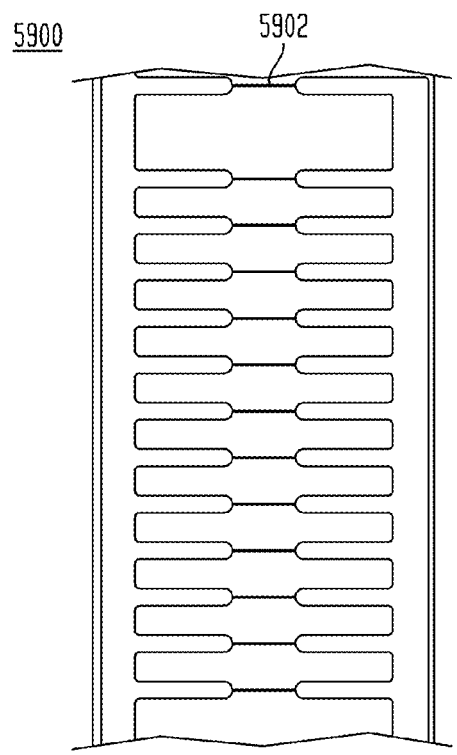
FIG. 59 shows an electrode circuit configuration with rounded electrode tips and a nanowire pinned to each of a plurality of electrode pairs, according to an example embodiment.
Figure 60:
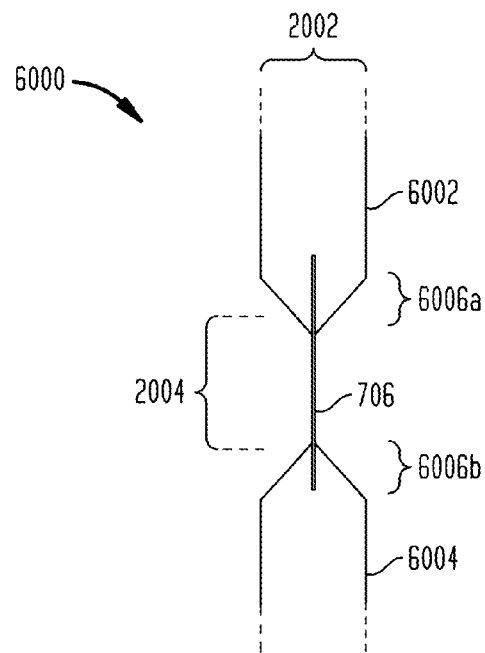
FIG. 60 shows an electrode pair with triangular electrode tips formed on a substrate, according to an example embodiment.
Figure 61:
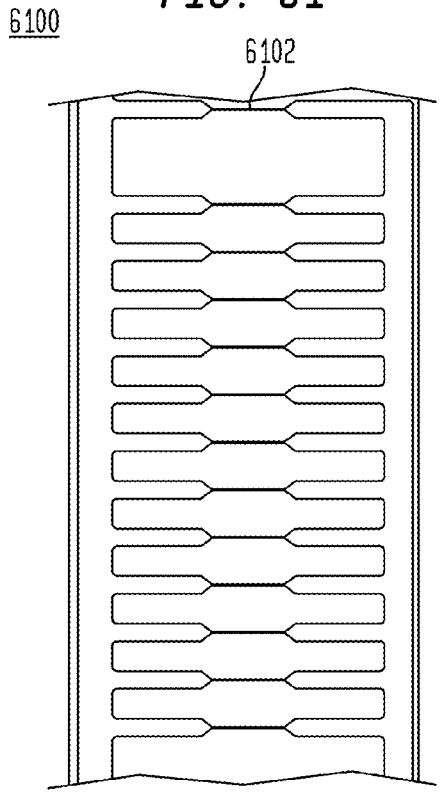
FIG. 61 shows an electrode circuit configuration with triangular electrode tips and a nanowire pinned to each of a plurality of electrode pairs, according to an example embodiment.

FIG. 58 shows an electrode pair 5800 formed on a substrate, according to an example embodiment. Electrode pair 5800 includes a first electrode 5802 and a second electrode 5804. First electrode 5802 has a circular or rounded end 5806*a* and second electrode 5804 has a circular or rounded end 5806*b*. Nanowire 706 is shown in FIG. 58 as pinned to electrodes 5802 and 5804. FIG. 59 show an image 5900 of an electrode array on a wafer that includes electrodes (e.g., 50 nm thick electrodes) having rounded ends, according to an example embodiment. Furthermore, as shown in FIG. 59, a nanowire 5902 is shown pinned to each electrode pair. As shown in FIGS. 58 and 59, the centering of nanowires on the electrode pairs appears to be better than for electrodes having rectangular ends (e.g., FIG. 57). For electrodes with rounded tips, the nanowires tend to lock centered on rounded electrode tip where the electric field is strongest. The locking voltage can be modified to enhance locking FIG. 60 shows an electrode pair 6000 formed on a substrate, according to an example embodiment. Electrode pair 6000 includes a first electrode 6002 and a second electrode 6004. First electrode 6002 has a pointed, triangular end 6006a and second electrode 6004 has a pointed, triangular end 6006b. Nanowire 706 is shown in FIG. 60 as pinned to electrodes 6002 and 6004. FIG. 61 show an image 6100 of an electrode array on a wafer that includes electrodes (e.g., 50 nm thick electrodes) having triangular ends, according to an example embodiment. Furthermore, as shown in FIG. 61, a nanowire 6102 is shown pinned to each electrode pair. As shown in FIGS. 60 and 61, the centering of nanowires on the electrode pairs appears to be better than for electrodes having rectangular ends (e.g., FIG. 57). For electrodes with triangular tips, the nanowires tend to lock centered on the apex of the triangular electrode tip where the electric field is strongest. The locking voltage can be modified to enhance locking FIG. 62 shows a flowchart 6200 providing example steps for deposition of nanostructures, according to example embodiments. For illustrative purposes, flowchart 6200 is described as follows with respect to FIGS. 58 and 60. Other structural and operational embodiments will be apparent to persons skilled in the relevant art(s) based on the following discussion. Not all steps of flowchart 6200 are necessarily performed in all embodiments. For example, step 6202 (forming) may be performed by an entity separately from an entity that performs steps 6204 and 6206.

Flowchart 6200 begins with step 6202. In step 6202, a first electrode and a second electrode of an electrode pair are formed to be coaxially aligned on a surface of a substrate, the first electrode having a first end and the second electrode having a second end that are adjacently positioned and separated by a first distance, the first end and the second end each being non-square shaped. For example, as shown in FIG. 58, ends 5806a and 5806b of first and second electrodes 5802 and 5804 are rounded such that their rounded ends are separated by gap 2004. Alternatively, as shown in FIG. 60, ends 6006a and 6006b of first and second electrodes 6002 and 6004 are triangular such that their apexes are separated by gap 2004.

In step 6204, an electrical signal is received at the electrode pair to generate an electric field to associate at least one nanowire from a suspension with the electrode pair. For example, as described elsewhere herein (e.g., with regard to step 304 of FIG. 3), an electrical signal may be applied to electrode pair 5800 of FIG. 58 or electrode pair 6000 of FIG. 60 to generate a corresponding electric field to associate one or more nanowires with the electrode pair.

In step 6206, the at least one nanowire is locked to the surface of the substrate. For example, as described above, the nanowire(s) may be pinned or locked to electrode pair 5800 or electrode pair 6000. For example, as described above, a locking voltage may be applied to the electrode pair, such as 10 Vpp, or greater. For electrodes with triangular tips, nanowires can be locked above 10 Vpp, because the electric field is very high at the triangular tip apex.

I. Techniques to Remove Excess Nanowires from Substrates after Dielectrophoretic Deposition As described above, nanowire deposition may be performed by capturing nanowires in solution onto a surface of a substrate using an electric field. Deposition can be performed with the substrate below a nanowire ink such that the nanowires settle toward the surface and gravity promotes a higher nanowire concentration near the surface, which speeds deposition and total loading of the electrodes. In such a configuration, nanowires can be difficult to flush from the surface because the nanowires are located very near the surface, and a fluid velocity near the surface is relatively small. Thus, a flush stage can take 75% or more time of an entire deposition process, and improved techniques for enhancing flush may substantially speed up the entire process.

Accordingly, example embodiments are provided for using electrostatic, dielectrophoretic, and/or magnetic forces to attract nanowires away from a surface to which nanostructures are deposited to improve flush. For instance, in embodiments, an enclosed system may be used for deposition, where the deposition substrate makes up one of the larger walls of a high aspect ratio channel. During deposition, the deposition substrate forms a bottom surface/wall of the channel, with electrodes on the substrate exposed to the fluid forced to flow through the channel. Nanowires are deposited directly from the fluid onto the electrodes using an AC electric field (dielectrophoresis). Once the electrodes have been sufficiently filled with nanowires, excess nanowires may be flushed from the channel. Because the tangential velocity of the fluid (nanowires) near the surface of the substrate is relatively small, it would be advantageous to move the nanowires away from the surface where the fluid flow is much higher, which reduces the flush time significantly. One example technique for moving the nanowires away from the surface is to apply an electrostatic force originating from one or more additional electrodes (the "flush electrode(s)") within the channel. If the flush electrode is small compared to the substrate, or if an electrode pair is used, the electric field gradient toward the electrodes attracts the nanowires when an AC signal is supplied (AC electrophoresis). This attractive force toward the electrode causes nanowires to move away from the surface but is not be strong enough to remove pinned nanowires from electrode on the surface. In addition, the tangential fluid flow at the flush electrode(s) is typically high enough so that the nanowires would not pin thereto.

The flush electrode may be configured in various ways. For instance, in an embodiment, two narrow rods may be used that form an electrode pair with a specific separation distance between the positive and negative (in phase and anti-phase for AC) electrodes. The rods span the width of the channel and can be at different distances from the surface. The rods translate in the direction of fluid flow from one end of the cell to the other. In this case, as the rods scan over the surface, they locally remove non-pinned nanowires form the surface and enhance flush. In another embodiment, multiple rods or other electrodes are used to affect a larger area on the wafer. In still another embodiment, a fixed electrode grate located near the surface is used to attract the wires.

System parameters may be varied in embodiments, including system geometry and size, the nanowire type, the type of ink solvent, the deposition substrate, etc. Many different geometries and materials for the electrode may be used to force the nanowires from the surface.

Figure 64:
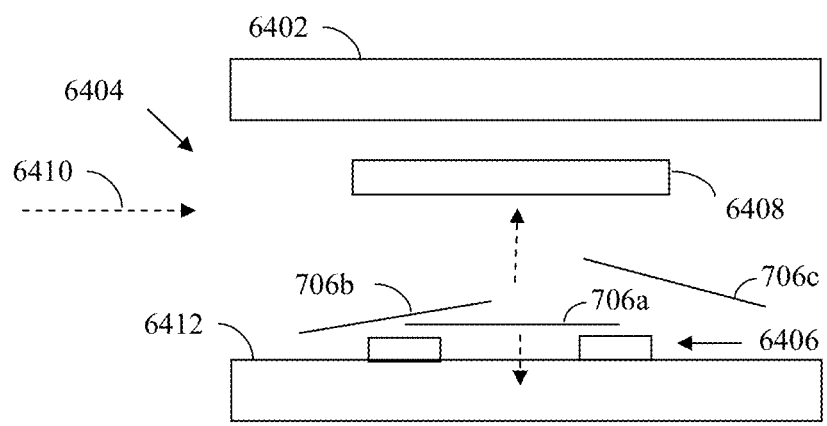
FIG. 64 shows a system for deposition of nanostructures, according to an example embodiment.

For instance, FIG. 63 shows a flowchart 6300 providing example steps for deposition of nanostructures, according to example embodiments. FIG. 63 is described with respect to FIG. 64 for illustrative purposes. FIG. 64 shows a system 6400 for deposition of nanostructures, according to an embodiment. Other structural and operational embodiments will be apparent to persons skilled in the relevant art(s) based on the following discussion.

Flowchart 6300 begins with step 6302. In step 6302, a suspension that includes a plurality of nanowires is flowed through a flow channel having a first surface, the first surface including an electrode pair that includes a first electrode and a second electrode. For example, as shown in FIG. 64, system 6400 includes a flow channel 6402, an inlet port 6404, an electrode pair 6406, and an electrical conductor 6408. Flow channel 6402 has a first surface 6412. Inlet port 6404 is configured to provide a flow of a suspension 6410 into channel 6402 (which may or may not be enclosed). Suspension 6410 includes a plurality of nanowires, including a nanowire 706a. Electrode pair 6406 includes a first electrode and a second electrode on surface 6412.

In step 6304, an AC electric field is generated with the electrode pair to associate at least one nanowire of the suspension with the electrode pair. For instance, in an embodiment, electrode pair 6406 of FIG. 64 may be configured to receive a first electrical signal (e.g., from an electrical signal source) to generate a first electric field to associate at least one nanowire of suspension 6410 with electrode pair 6406. For instance, as shown in FIG. 64, nanowire 646a is associated with electrode pair 6406.

In step 6306, a second electric field is generated with at least one electrical conductor to attract excess nanowires from the first surface of the flow channel. For example, electrical conductor 6408 of FIG. 64 may be configured to receive a second electrical signal (e.g., from the same or a different electrical signal source) to generate a second electric field to attract excess nanowires from surface 6412. For instance, nanowires 706b and 706c, which are not pinned to electrode pair 6406 or any other electrode pair, may be attracted toward electrical conductor 6408. As such, suspension 6410 flowing through channel 6402 is enabled to flush away nanowires 706b and 706c, ridding electrode pair 6406 of excess nanowires in this manner.

Note that as described above, electrical conductor 6408 may include one or more electrical conductors, including an electrode, an electrode pair, etc. Electrical conductor 6408 may include one or more wires, rods, grates, etc. Electrical conductor 6408 may be stationary, or may be mobile (e.g., by manual effort, by motor, etc.) to enable excess nanowires to be flushed from channel 6402.

J. Dielectrophoretic Directed Assembly of Nanowires Over Large Areas

Embodiments for dielectrophoretic directed assembly of nanowires over large areas are provided in this subsection. In this subsection, applications and approaches for nanowires, dielectrophoresis, an operating window, hardware, large area deposition, alignment, and further embodiments are described.

As described elsewhere herein, many devices and systems can incorporate nanostructures and/or other electrical devices deposited according the techniques described herein. For instance, one example application that may incorporate nanowires is an LCD/OLED (liquid crystal diode/organic light emitting diode) display backplane (e.g., a Sony® OLED). Such a display backplane may have a higher performance than an amorphous silicon display backplane, and has low cost. Another example application that may incorporate nanowires is flexible electronics (e.g., a flexible display by Polymer Vision Ltd, of Eindhoven, Netherlands). The lower processing temperature for nanowires is compatible with plastics, and thus enables many applications of nanowires with plastics. Further example applications of nanowires include printed electronics, sensors, and RF identification (RFID).

Figure 65:
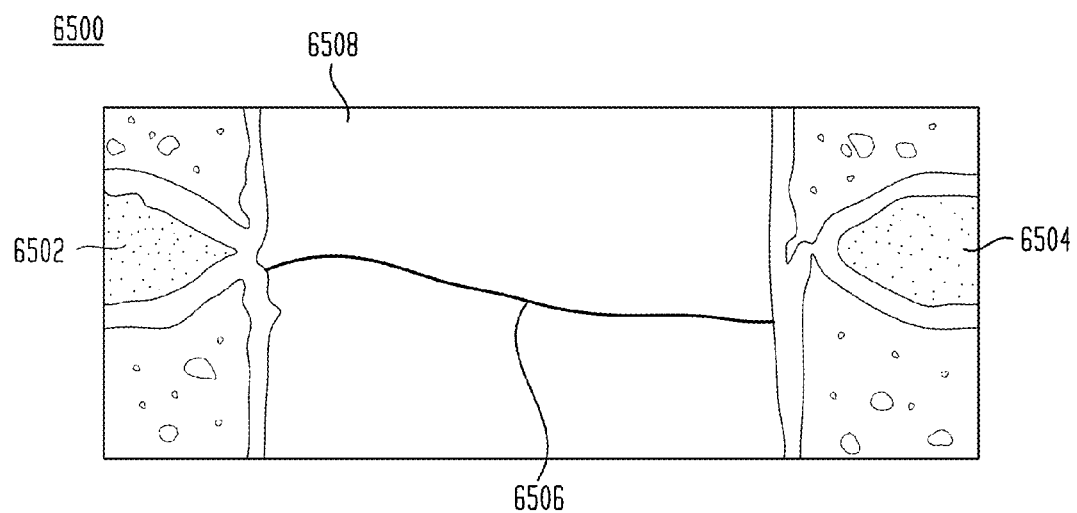
FIGS. 65 and 66 show views of electronic devices assembled according to a dielectrophoresis (DEP) technique.
Figure 66:
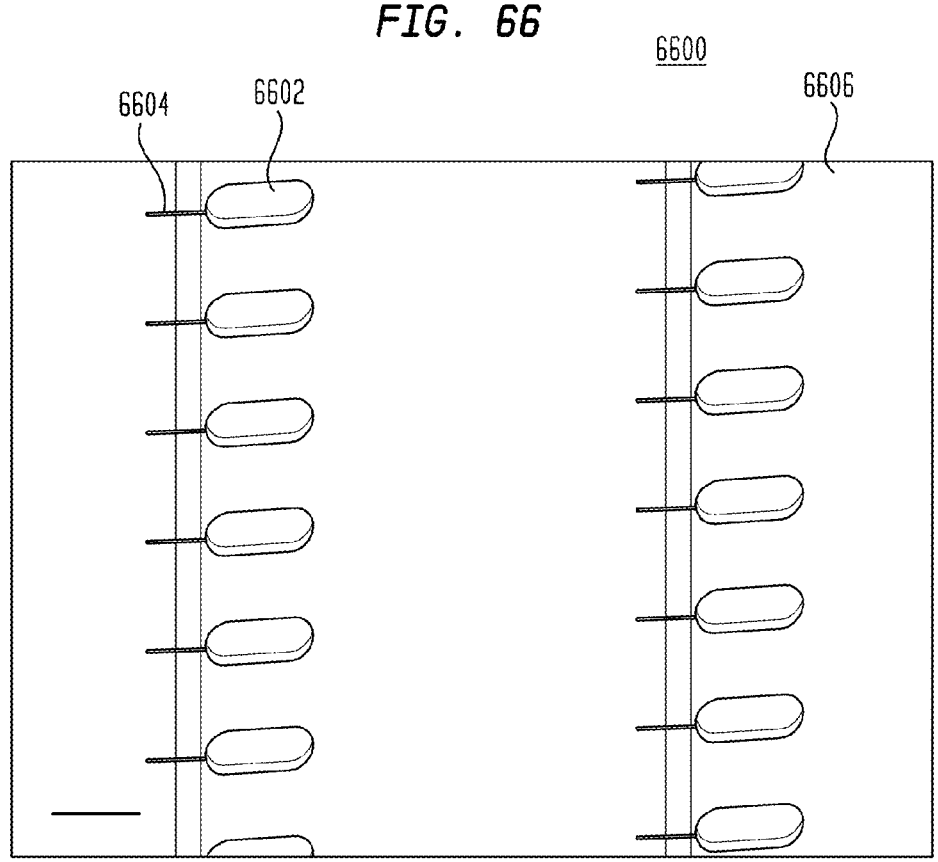

FIGS. 65 and 66 show views of electronic devices assembled according to a dielectrophoresis (DEP) technique. For example, FIG. 65 shows a two-terminal device 6500 on a substrate 6508 that includes a first electrode 6502 and a second electrode 6504. A carbon nanowire 6506 is shown coupled to first and second electrodes 6502 and 6504. According to the dielectrophoresis deposition technique used to assemble devices similar to device 6500, 90% of the devices received a single carbon nanotube (in a 100 µm×100 µm area). FIG. 66 shows an array 6600 of devices 6602 on a substrate 6606 that each include a first electrode 6602 and a nanowire 6604 coupled to the corresponding first electrode 6602. According to the dielectrophoresis deposition technique used to assemble array 6600, 80% of the devices received single nanowires.

Figure 67:
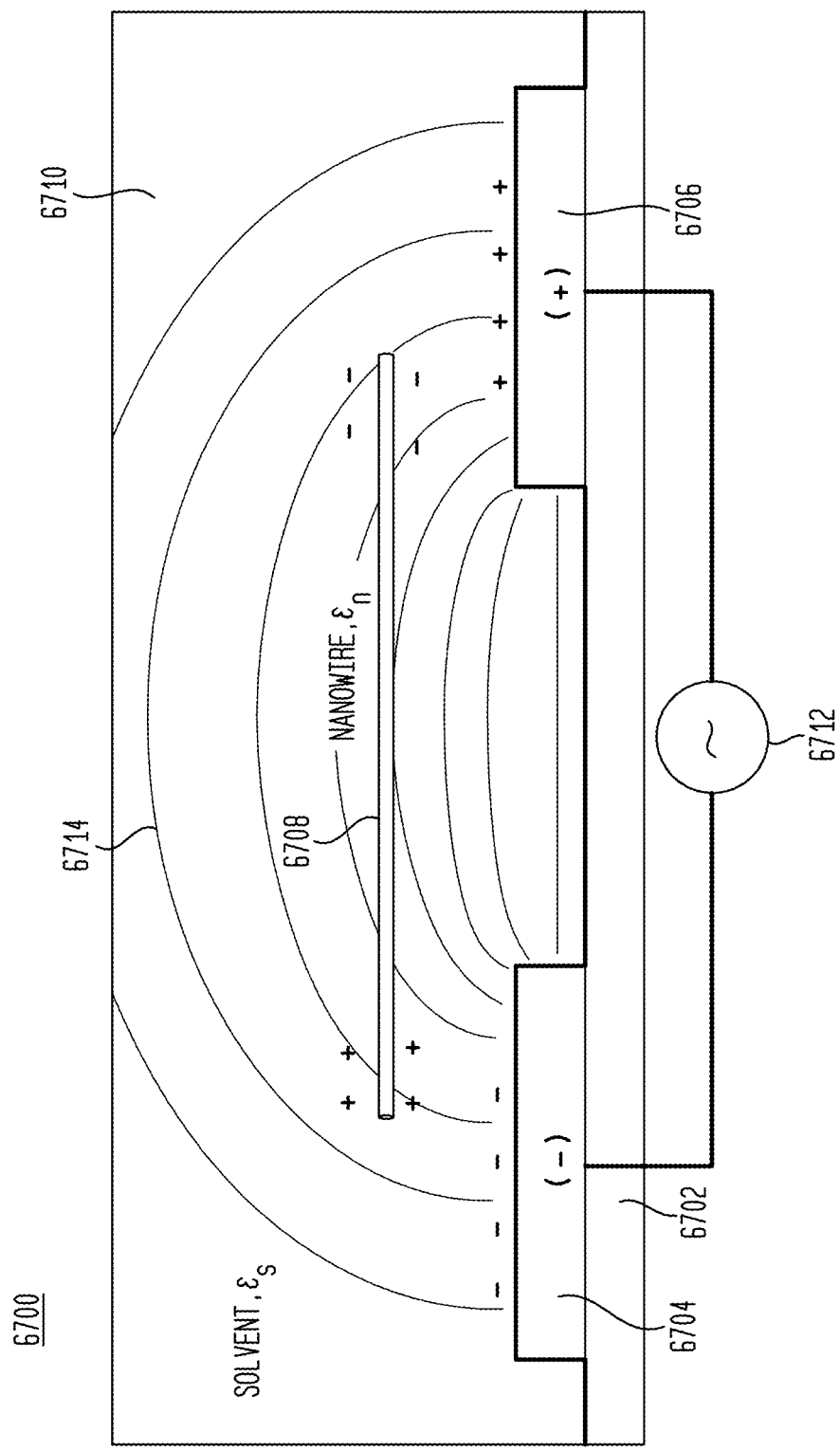
FIG. 67 shows a deposition system that illustrates an example principle of electric field directed assembly, according to an example embodiment.

FIG. 67 shows a deposition system 6700 that illustrates an example principle of electric field directed assembly, according to an example embodiment. For instance, FIG. 67 illustrates electric field directed assembly that utilizes dielectrophoresis, as described elsewhere herein. As shown in FIG. 67, system 6700 includes a substrate 6702, a first electrode 6704, a second electrode 6706, a nanowire 6708, a solvent 6710 (contained by a container), and an AC signal generator 6712. First and second electrodes 6704 and 6706 are positioned on a surface of substrate 6702. First electrode 6704 is coupled to a negative terminal of AC signal generator 6712, and second electrode 6706 is coupled to a positive terminal of AC signal generator 6712. In FIG. 67, substrate 6702 is entirely submerged in solvent 6710. An electromagnetic field 6714 is generated by application of an AC current/voltage to first and second electrodes 6704 and 6706 by AC signal generator 6712. Electromagnetic field 6714 is an AC electromagnetic field generated to associate at least some of the nanowires in solvent 6710 with first and second electrodes 6704 and 6706, such as nanowire 6708.

Energizing first and second electrodes 6704 and 6706 to generate electromagnetic field 6714 can be performed during part or all of a nanowire alignment and deposition process, including step 304 of flowchart 300. As described herein, as nanowire 6708 encounters an AC electric field generated between electrodes 6704 and 6706, a field gradient results. A net dipole moment is produced in proximate nanowires, and the AC electric field exerts a torque on the dipole, such that proximate nanowires align parallel to the direction of the electric field. For example, nanowire 6708 is shown having been aligned by electromagnetic field 6714 parallel to an electric field component of field 6714 in association with electrodes 6704 and 6706.

In addition to aligning nanowire 6708 parallel to an AC electric field, the field gradient exerts a dielectrophoretic force on nanowire 6708, attracting nanowire 6708 towards electrodes 6704 and 6706. Equation 7 below represents the dielectrophoretic force, Fdep, exerted on nanowire 6708 in FIG. 67.

$$Fdep = K \nabla \vec{E}^2, \quad \text{Equation 7}$$

where $$K = \frac{\varepsilon n - \varepsilon s}{\varepsilon s}, \quad \text{Equation 8}$$

E=the electric field,
∈n=a complex dielectric constant for nanowire 6708, and
∈p=a complex dielectric constant for solvent 6710.

The gradient is highest at electrodes 6704 and 6706, exerting an increasing attraction toward electrodes 6704 and 6706. An electric double-layer is produced at the surface of each of electrodes 6704 and 6706, such that oppositely charged ions are present at each electrode (e.g., negatively charged ions are present at electrode 6704, and positively charged ions are present at electrode 6706). In the presence of electromagnetic field 6714, the ions migrate away from each of electrodes 6704 and 6706 and initially toward nanowire 6708 hovering proximately nearby. As ions approach oppositely charged nanowire 6708, the ions are repulsed by the like charge and then directed back toward the respective electrode resulting in a circulating pattern of ions (e.g., positively charged ions are shown at the end of nanowire 6708 nearest to electrode 6704, and negatively charged ions are shown at the end of nanowire 6708 nearest to electrode 6706). Solvent 6710 is also circulated, generating an electro-osmotic force that opposes the dielectrophoretic force attracting nanowire 6708 to electrodes 6704 and 6706. The dielectrophoretic and osmotic forces reach an equilibrium (or relative equilibrium), and nanowire 6708 is thereby held in place such that it becomes associated with electrodes 6704 and 6706.

Various types of nanostructures may be used for deposition in this manner, including types of nanrods, nanotubes, nanowires, etc., mentioned elsewhere herein. For instance, silicon based p-i-p nanowires (boron doped) grown using a VLS (vapor-liquid-solid) technique may be used. Such nanowires may be fabricated to be 18 μm long (or other length) (length uniformity ~1 μm). This type of nanowire is mentioned for purposes of illustration, and is not intended to be limiting.

Figure 68:
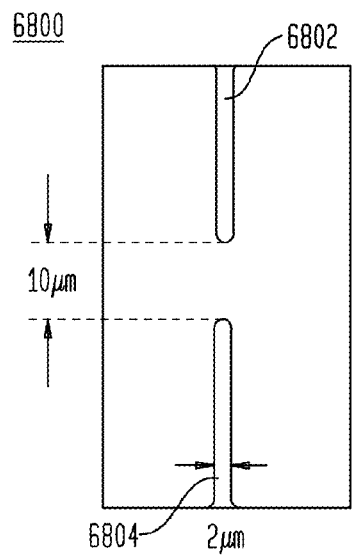
FIGS. 68-71 show sequentially captured images of an electrode pair, illustrating capture of a nanowire using the dielectrophoretic force, according to an example embodiment.
Figure 69:
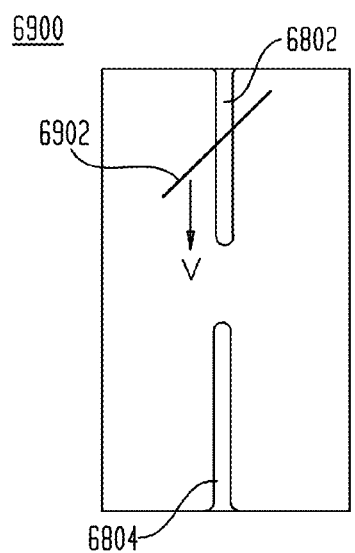
Figure 70:
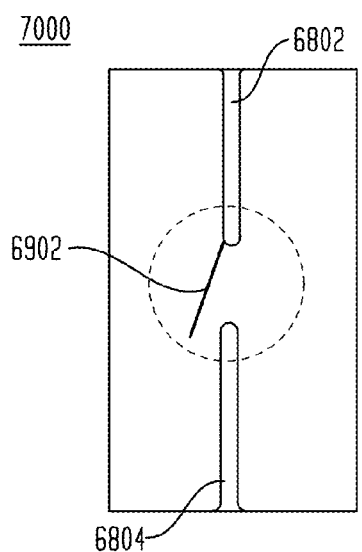
Figure 71:
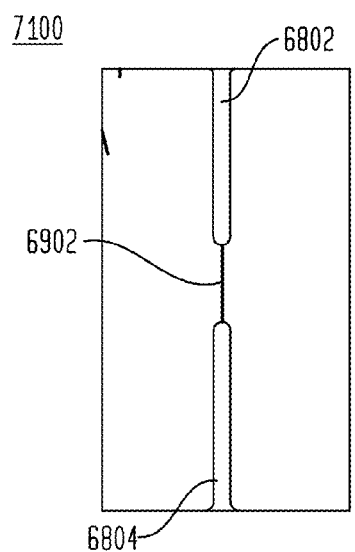
Figure 72:
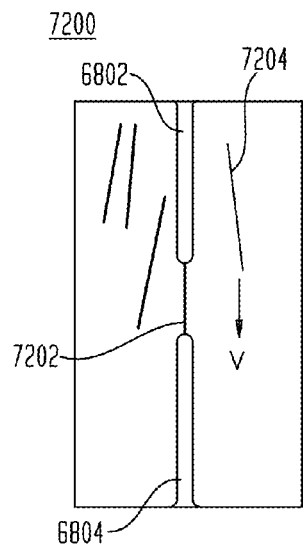
FIGS. 72-76 show sequentially captured images of an electrode pair, illustrating capture of a nanowire using the dielectrophoretic force and self-limiting assembly, according to an example embodiment.
Figure 73:
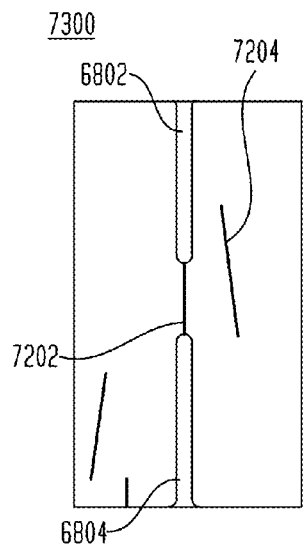
Figure 74:
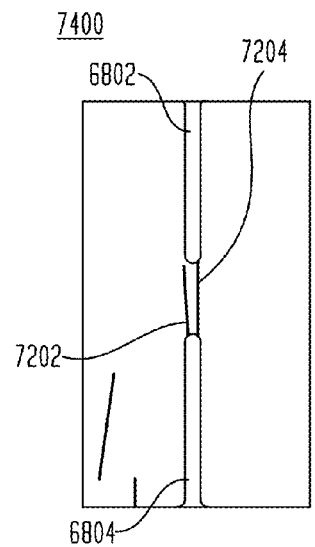
Figure 75:
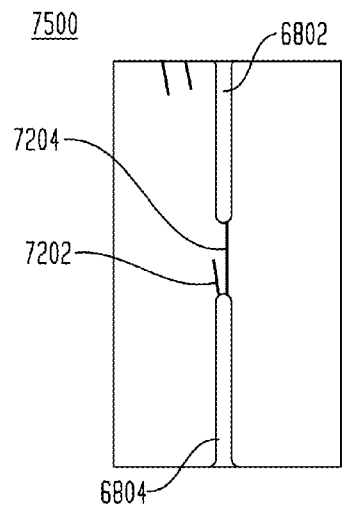
Figure 76:
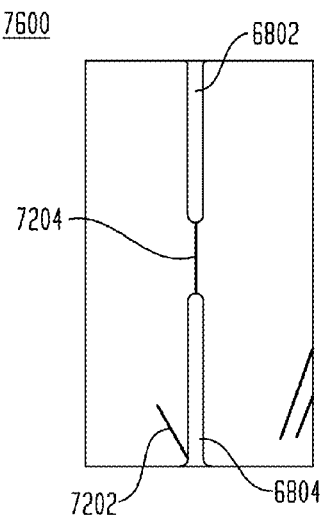

FIGS. 68-71 show sequentially captured images of an electrode pair, illustrating capture of a nanowire using the dielectrophoretic force, according to an example embodiment. For instance, in a first image 6800 of FIG. 68, first and second electrodes 6802 and 6804 are shown on a substrate in solvent. As indicated in FIG. 68, first and second electrodes 6802 and 6804 each have widths of 2 μm and are spaced apart by 10 μm (although in other embodiments may have other widths and/or spacing). In second image 6900 of FIG. 69, a nanowire 6902 is shown approaching first and second electrodes 6802 and 6804. In third image 7000 of FIG. 70, nanowire 6902 is shown having approached first and second electrodes 6802 and 6804 within a capture radius (represented by dotted line circle in FIG. 70) of first and second electrodes 6802 and 6804. This capture radius is a region where the dielectrophoretic force (decaying exponentially in the far field) is larger than the hydrodynamic force (increasing away from the surface). In fourth image 7100 shown in FIG. 71, nanowire 6902 is shown pinned and hovering above first and second electrodes 6802 and 6804. Nanowire 6902 is enabled to be pinned to first and second electrodes 6802 and 6804 because the dielectrophoretic force is larger than viscous drag of the solvent flowing over first and second electrodes 6802 and 6804. In FIGS. 68-71, a torque on nanowire is proportional to $K(\vec{E} \times \vec{E})$.

FIGS. 72-76 show sequentially captured images of an electrode pair, illustrating capture of a nanowire using the dielectrophoretic force and self-limiting assembly, according to an example embodiment. For instance, in a first image 7200 of FIG. 72, first and second electrodes 6802 and 6804 are shown on a substrate in solvent with a first nanowire 7202 pinned to first and second electrodes 6802 and 6804 (according to the dielectrophoretic force), and a second nanowire 7204 is shown approaching first and second electrodes 6802 and 6804. In a second image 7300 of FIG. 73, second nanowire 7204 is shown approaching more closely to first and second electrodes 6802 and 6804, having entered a capture radius. In a third image 7400 of FIG. 74, second nanowire 7204 is shown being pinned to first and second electrodes 6802 and 6804 because the dielectrophoretic force is larger than viscous drag of the solvent flowing over first and second electrodes 6802 and 6804, and is shown beginning to displace first nanowire 7202 (e.g., due to a mutual repulsion between first and second nanowires 7202 and 7204). In fourth image 7500 shown in FIG. 75, second nanowire 7204 is shown pinned and hovering above first and second electrodes 6802 and 6804, and first nanowire 802 has been displaced from first and second electrodes 6802 and 6804. In fifth image 7600 shown in FIG. 76, second nanowire 7204 is shown pinned and hovering above first and second electrodes 6802 and 6804, and first nanowire 802 is being swept away due to the hydrodynamic drag of the solvent flowing over first and second electrodes 6802 and 6804.

Second nanowire 7204 displacing first nanowire 7202 is an example of self-limiting assembly of nanostructures, where the nanowire interactions in the flow channel limit the number of nanowires that pin to a particular electrode pair to a desired number. The particular conditions for single nanowire self-assembly are determined primarily by the applied voltage and flow rate (dielectrophoretic and hydrodynamic forces), provided there is sufficient repulsion between the nanowires and substrate. For instance, as the flow rate increases, the critical pinning voltage increases with a power law exponent of ~2. The critical-pinning voltage lines for single and double nanowires mark the boundary for each occupancy event: no nanowire, single nanowire, and double nanowire. At constant voltage, a single nanowire assembled on an electrode can withstand a larger hydrodynamic drag force than two nanowires. The dielectrophoretic force on the nanowires that opposes the hydrodynamic drag depends on the nanowire position relative to the electrode. For a single nanowire, a nanowire may be pinned at the electrode centerline where the gradient in the electric field is largest. When an additional nanowire assembles on the electrode, the nanowires separate to regions where the electric field gradient is smaller, reducing the dielectrophoretic force. The separation distance between the nanowires depends on the repulsive force between the nanowires relative to the dielectrophoretic force perpendicular to the long-axis of the nanowire, and the hydrodynamic forces from the fluid flow or electroosmosis.

Figure 77:
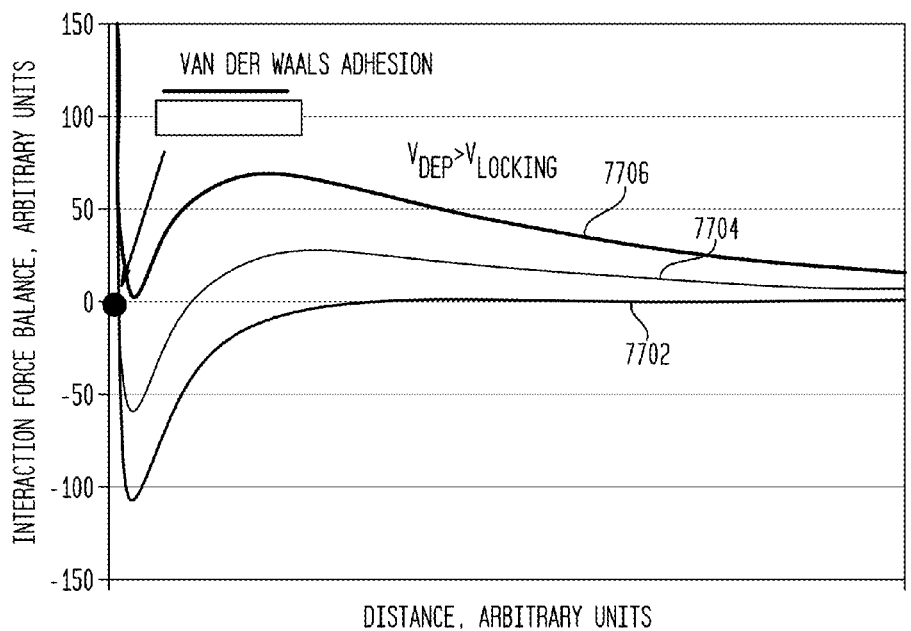
FIG. 77 shows a plot of an interaction force balance versus distance, according to an example embodiment.

FIG. 77 shows a plot 7700 that indicates interaction force balance (arbitrary units) versus distance (arbitrary units) for nanowires with respect to an electrode pair on a substrate, according to an example embodiment. Plot 7700 shows a first plot line 7702, a second plot line 7704, and a third plot line 7706, which correspond to different values for the dielectrophoretic force. First plot line 7702 corresponds to a relatively low value for the dielectrophoretic force, second plot line 7704 corresponds to a relatively medium value for the dielectrophoretic force, and third plot line 7706 correspond to a relatively high value for the dielectrophoretic force. To obtain plot line 7702, a relatively low electrode voltage was applied. To obtain plot line 7704, a relatively medium electrode voltage was applied (e.g., a lower electrode voltage than a locking electrode voltage). To obtain plot line 7706, a relatively high electrode voltage was applied (e.g., a higher electrode voltage than the locking electrode voltage).

As shown in FIG. 77, for first plot line 7702, as distance increases (to the right side in FIG. 77), the interaction force between nanowires and the electrode pair is essentially zero (the interaction force decays as distance from the substrate increases). As distance between the nanowire and substrate decreases, the interaction force becomes more repulsive (e.g., plot line 7702 dips downward in FIG. 77 when moving along plot line 7702 in the leftward direction due to electrostatic repulsion between nanowires and the substrate), and then becomes less repulsive (e.g., plot line 7702 moves back upward in FIG. 77 when moving along plot line 7702 further in the leftward direction as the attractive dielectrophoretic force becomes significant) until plot line 7702 reaches a zero value for the interaction force. The zero value for the interaction force indicates a distance from the substrate at which the attractive dielectrophoretic force and other involved forces (e.g., repulsive electrostatic force, etc.) are balanced such that a nanowire is pinned and hovers at a spacing from the substrate. As distance between the nanowire and substrate further decreases, the interaction force becomes strongly attractive because the van der Waals force becomes significant. As such, the nanowire is pulled to the substrate and is locked.

As shown in FIG. 77, second plot line 7704 is similarly shaped to first plot line 7702, except that second plot line 7704 has a distance range where an attraction exists between the nanowire and substrate prior to dipping below zero to the repulsive range described above for first plot line 7702, the lowest dip of second plot line 7704 is less than that of first plot line 7702 (less repulsion), and the nanowire is distanced closer to the substrate for second plot line 7704 versus first plot line 7702 for the zero value for the interaction force.

As shown in FIG. 77, third plot line 7706 is similarly shaped to second plot line 7704, except that the lowest dip of second plot line 7704 is less than that of second plot line 7702, and in fact does not reach or become less than zero. Thus there is no range of distances in third plot line 7706 where the nanowire is repulsed by the substrate.

Figure 78:
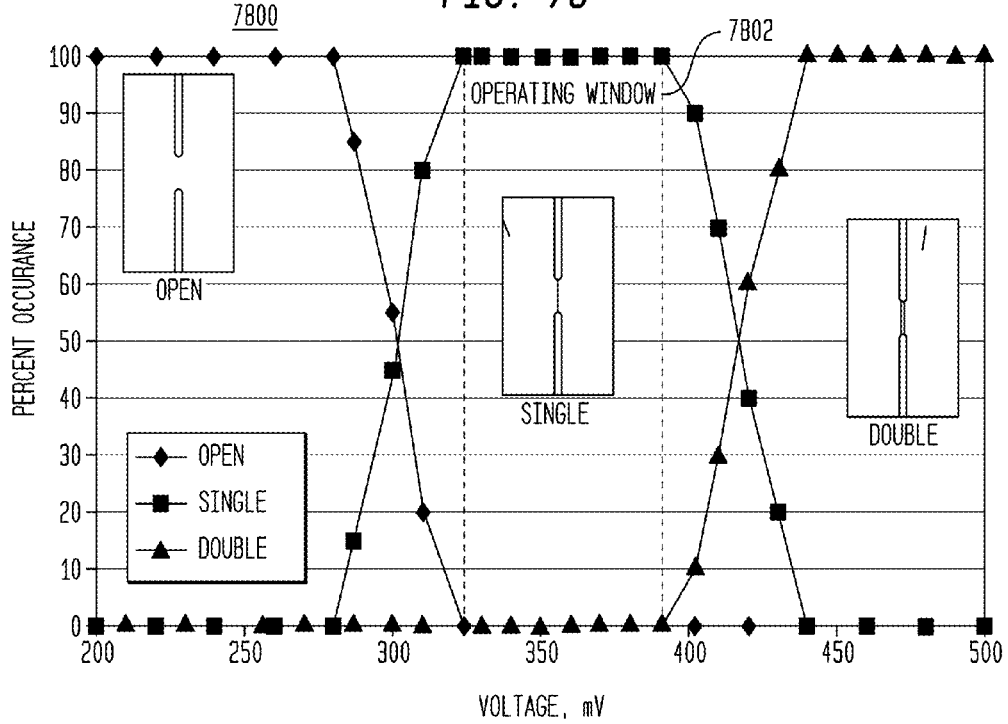
FIG. 78 shows a plot of percentage occurrence of open, single, and double nanowire deposition versus voltage, according to an example embodiment.

FIG. 78 shows a plot 7800 of percentage occurrence of open, single, and double nanowire deposition versus voltage (mV), according to an example embodiment. Plot 7800 illustrates an effect of voltage at constant shear stress and an operating window for single nanowire deposition. In the example of FIG. 78, plot 7800 indicates an operating window 7802 over a voltage range of approximately 325 mV to 390 mV where the percentage occurrence of a single nanowire being deposited on electrode pairs was 100%. At lower voltages than operating window 7802, there was less than a 100% occurrence of single nanowires being deposited on electrode pairs (in some cases, no nanowires were deposited). At higher voltages than operating window 7802, there was a less than 100% occurrence of single nanowires being deposited on the electrode pairs (in some cases, two nanowires were deposited).

Figure 79:
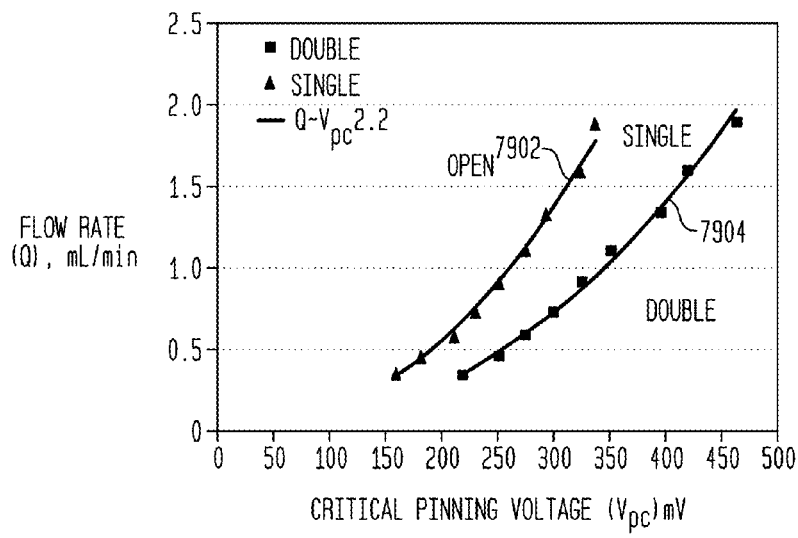
FIG. 79 shows a plot of flow rate versus critical pinning voltage, according to an example embodiment.

FIG. 79 shows a plot 7900 of flow rate (mL/min) versus critical pinning voltage (Vpc) (mV), according to an example embodiment. Plot 7900 shows a first plot line 7902 for single nanowire deposition and a second plot line 7904 for double nanowire deposition. A region between plot lines 7902 and 7904 may be considered to be a process window for deposition of single nanowires on electrode pairs, where ranges of flow rate and electrode voltage are possible for single nanowire deposition. A region to the left of plot line 7902 is a region where no nanowires are deposited on the electrode pairs, and a region to the right of plot line 7904 is a region where two nanowires are deposited on electrode pairs. FIG. 79 indicates that a large process window makes low defect deposition possible, and indicates a tolerance to flow rate variations larger than voltage. According to plot 7900, a pinning force can be approximated by calculating the drag on the nanowire. In FIG. 79, a value for flow rate (Q) for plot lines 7902 and 7904 may be approximated as $Vpc^{2.2}$.

Figure 80:
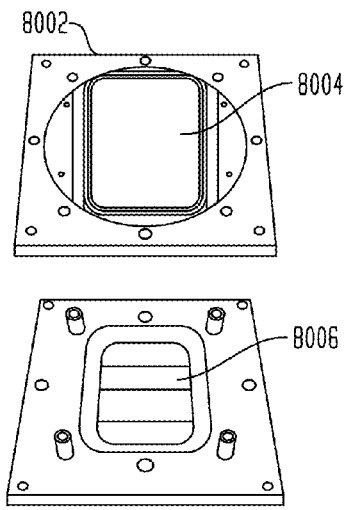
FIG. 80 illustrates an image of a closed cell system for nanowire deposition, according to an example embodiment.
Figure 81:
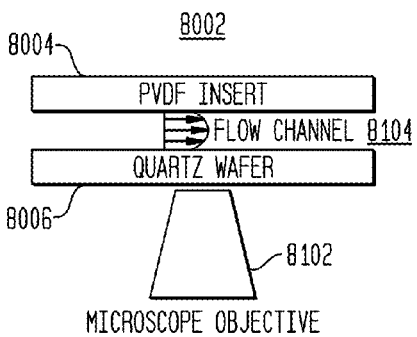
FIG. 81 shows a cross-sectional block diagram view of the closed cell system of FIG. 80, according to an example embodiment.

FIG. 80 illustrates an image 8000 of a closed cell system 8002 for nanowire deposition, according to an example embodiment. FIG. 81 shows a cross-sectional block diagram view of closed cell system 8002 of FIG. 80, according to an example embodiment. In the example of FIGS. 80 and 81, system 8002 includes a PVDF (polyvinylidene fluoride) insert 8004 and a quartz wafer 8006, which are sealed together (e.g., by an o-ring or other type of seal) to form a flow channel. As shown in FIG. 81, a flow channel 8104 is indicated between PVDF insert 8004 and quartz wafer 8006 through which a nanowire solution may flow, for deposition of nanowires to quartz wafer 8006. A microscope objective 8102 or other image capturing device may be present to view nanowires flowing through flow channel 8104, and being deposited to quartz wafer 8006. As shown in FIG. 81, microscope objective 8102 is located adjacent to quartz wafer 8006 to view nanowires through quartz wafer 8006 (which may be transparent). Implementations of closed cell system 8002 can provide repeatable single nanowire deposition, including repeatedly being enabled to deposit single nanowires on electrodes at a success rate of 95% and greater.

Figure 82:
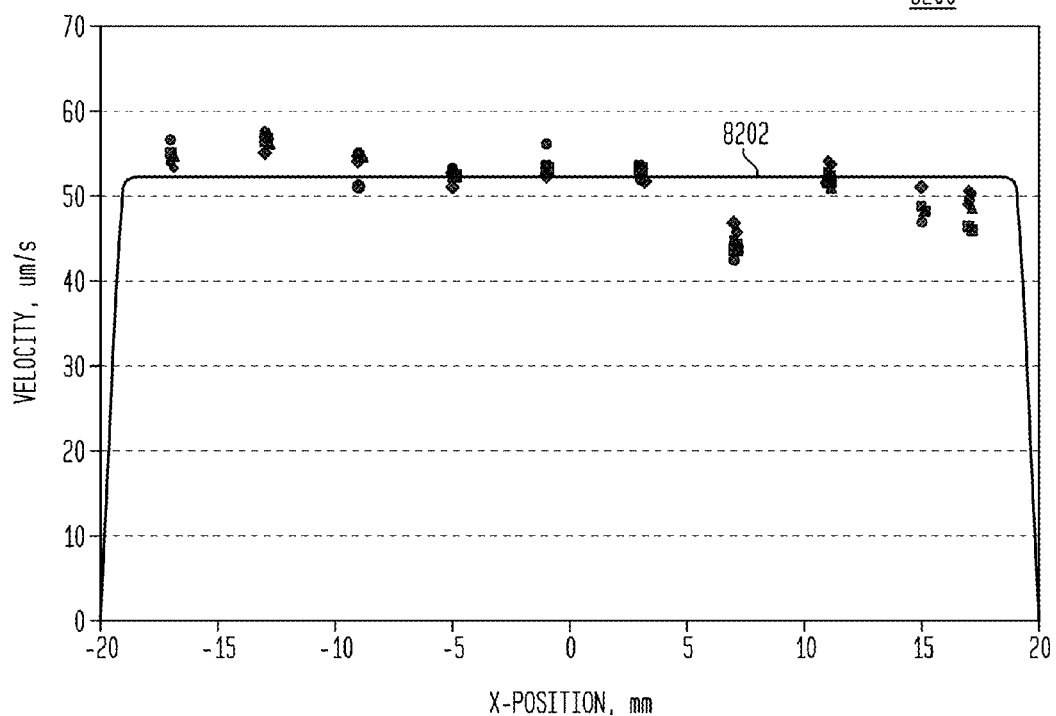
FIG. 82 illustrates a plot of velocity versus x-position for the closed cell system of FIG. 80, according to an example embodiment.

FIG. 82 illustrates a plot 8200 of velocity (μm/sec) versus x-position (mm) for closed cell system 8002, according to an example embodiment. Plot 8200 illustrates cell flow uniformity for closed cell system 8002. Plot points present in plot 8200 were generated by measuring a velocity profile using particle image velocimetry (for $H_2O$ seeded with 5 μm polystyrene spheres). A plot line 8202 was added to plot 8200 as a solution to the Navier-Stokes equations for flow in a rectangular channel. The similarly to the plot points of plot 8200 with plot line 8202 indicates substantial cell flow uniformity for closed cell system 8002 (e.g., a relatively constant velocity for a range of "x" positions across flow channel 8104).

Figure 83:
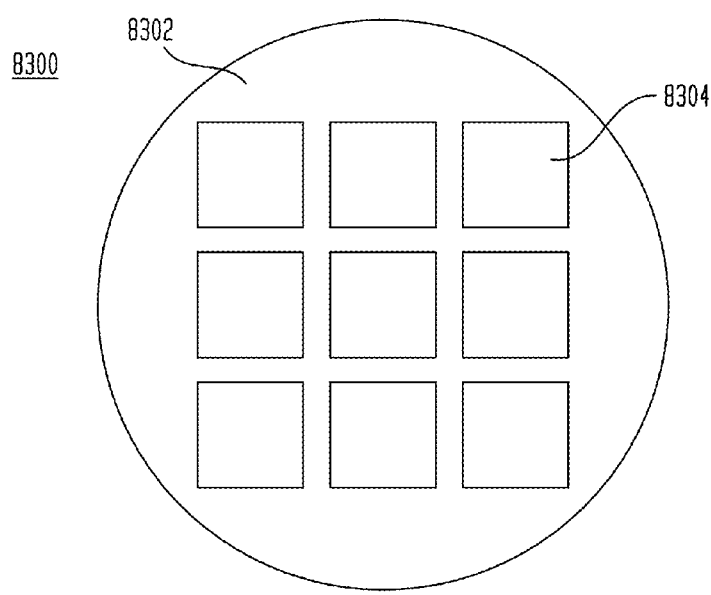
FIG. 83 illustrates a wafer that has a surface having a plurality of electrode arrays, according to an example embodiment.

FIG. 83 illustrates wafer 8300 that has a surface 8302 having a plurality of electrode arrays 8304, according to an example embodiment. In one example of wafer 8300, wafer 8300 is a six inch wafer that includes nine electrode arrays 8304, although in other embodiments, may have other size and/or numbers of electrode arrays. Each electrode array 8304 may be any size and may include any number of electrodes, such as being 20 mm by 20 mm, and including 16,384 electrode sites (e.g., an electrode density of 41 electrode sites/$mm^2$). In one example deposition of nanowires on wafer 8300 to an array 8304 according to embodiments, 98.52% of electrode pairs received a single nanowire, 0.07% of electrode pairs were left open (a total of 12 open electrodes in this example), 0.37% of electrodes pairs were defective, and 1.02% of electrodes pairs received a defective nanowire. As such, wafer 8300 is an example of large area, low defect deposition. In this example, the target array 8304 was inspected using a DUV (deep ultraviolet) microscope (the images were inspected manually).

Figure 84:
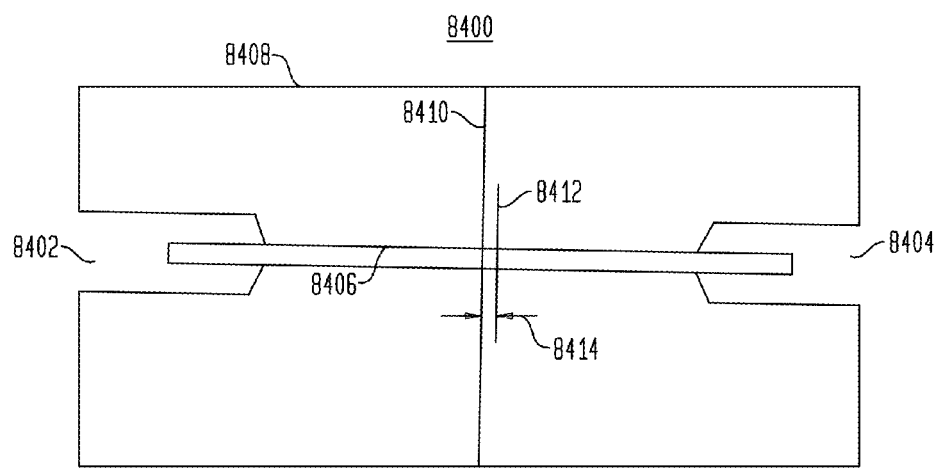
FIG. 84 shows an electrode pair on a substrate that has a nanowire deposited thereon, according to an example embodiment.
Figure 85:
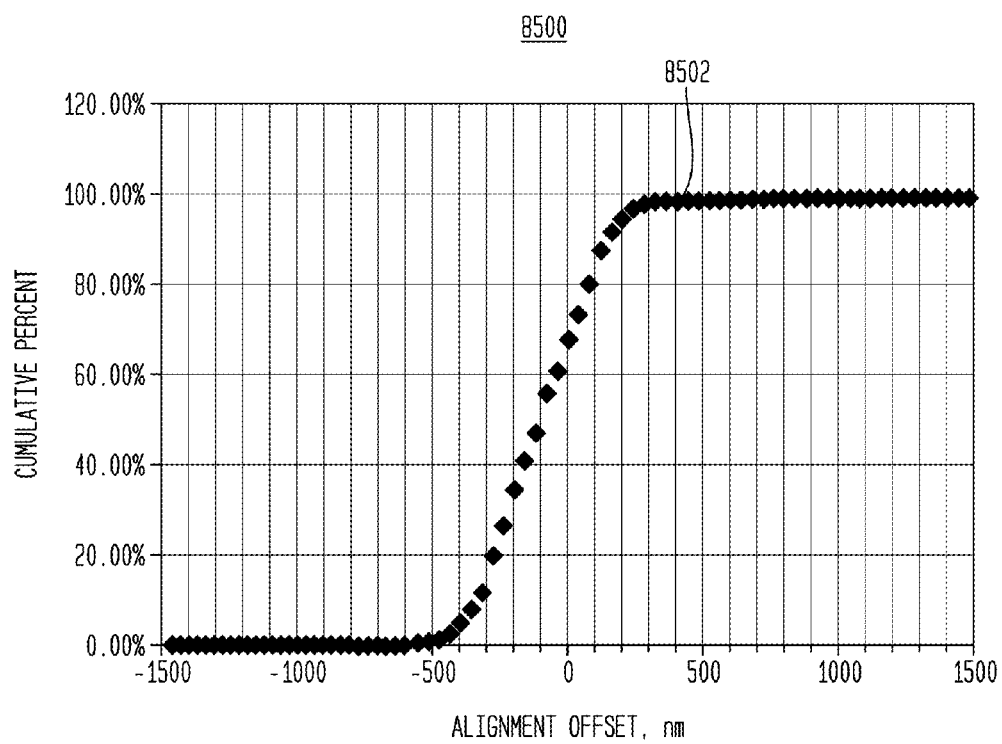
FIG. 85 shows a plot of cumulative percent versus alignment offset, according to an example embodiment.

FIG. 84 illustrates an example of nanowire alignment. For example, FIG. 84 shows an electrode pair 8400 on a substrate 8408 that includes a first electrode 8402 and a second electrode 8404. A nanowire 8406 is shown coupled to first and second electrodes 8402 and 8404. An electrode pair centerline 8410 is indicated between the ends of first and second electrodes 8402 and 8404. A nanowire centerline 8412 is indicated for nanowire 8406. As shown in FIG. 84, nanowire centerline 8412 is offset by a distance 8414 from electrode pair centerline 8410. In embodiments, dielectrophoretic alignment capability according to the deposition techniques described herein reduces distance 8414. For instance, FIG. 85 shows a plot 8500 of cumulative percent versus alignment offset (nm), according to an example embodiment. As indicated by a plot line 8502 in plot 8500, approximately 99.9% of tested electrode pairs have distances 8414 that are less than 1 μm. Dielectrophoretic alignment capability is comparable to Generation 7 and 8 LCD (liquid crystal display) steppers, which is around 0.6 μm (e.g., for a Nikon stepper).

Figure 86:
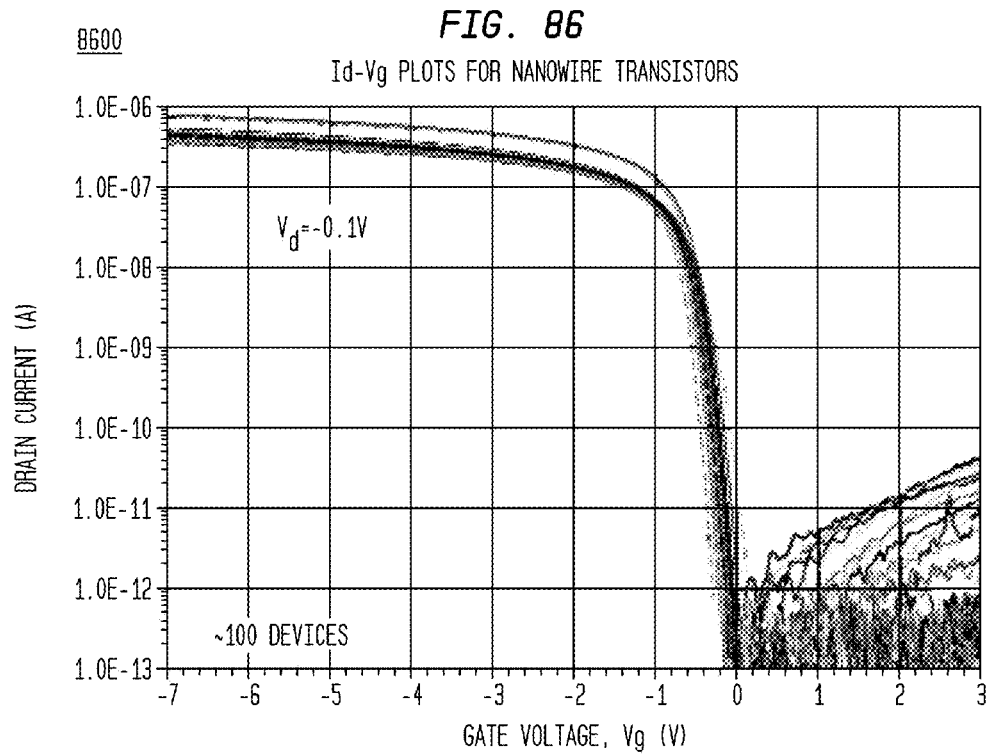
FIGS. 86-88 show plots illustrating electrical characteristics of nanowire transistors, according to example embodiments.
Figure 87:
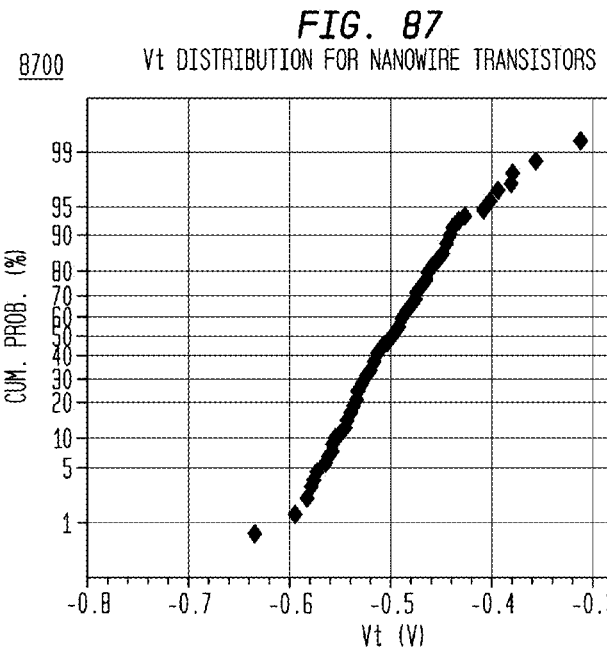
Figure 88:
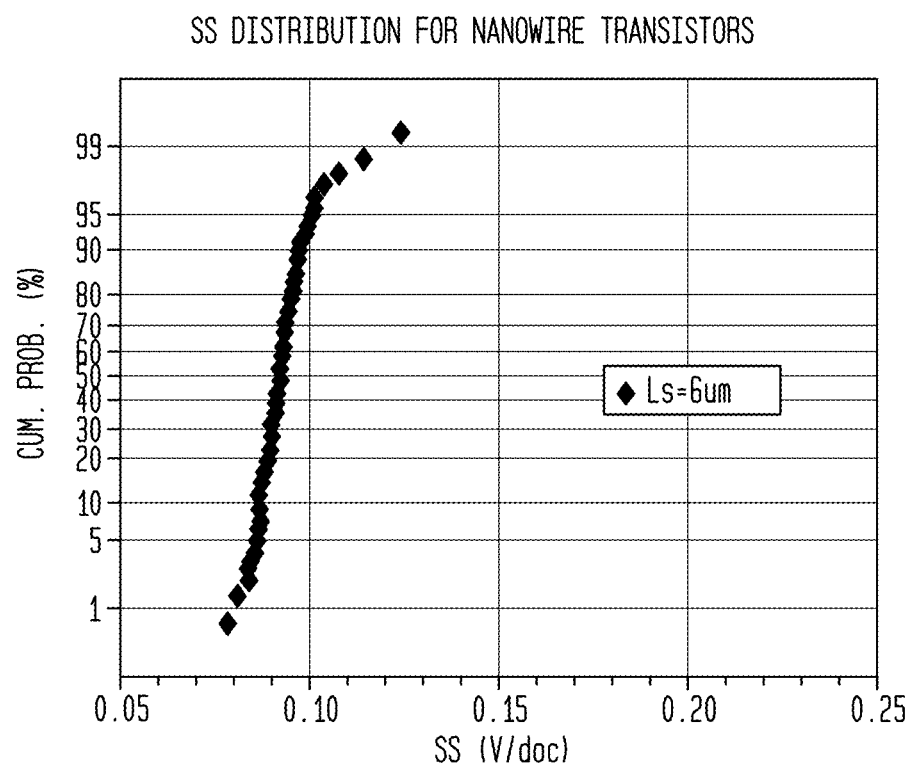

FIGS. 86-88 show plots illustrating electrical characteristics of nanowire transistors, according to example embodiments. With regard to FIGS. 86-88, nanowires were made into p-type MOSFET transistors using conventional top-down fabrication.

FIG. 86 shows a plot 8600 of drain current (A) versus gate voltage (V) for the nanowire transistors. FIG. 87 shows a plot 8700 of Vt distribution for nanowire transistors, plotting cumulative probability (%) versus Vt (V). FIG. 88 shows a plot 8800 of sub-threshold slope (SS) distribution for nanowire transistors, plotting cumulative probability (%) versus SS (V/decade). As indicated by plots 8600, 8700, and 8800, the nanowire transistors exhibit very tight threshold voltage (Vt) and sub-threshold slope (SS) distributions.

In embodiments, 99.9% single nanowire deposition is possible using dielectrophoretic assembly. With good hydrodynamic uniformity, high deposition yield can be attained over very large areas (>100 mm$^2$). Dielectrophoretic assembly techniques, as described herein, enable precise nanowire positioning with low alignment error (e.g., alignment error <0.6 μm (3σ)), enabling these techniques to be compatible with conventional semiconductor processing.

Further example electronic devices and systems that can be formed according to embodiments provided herein are described below.

III. Use of Nanowires and Electrical Devices Deposited According to Embodiments in Exemplary Devices and Applications Numerous electronic devices and systems can incorporate semiconductor or other type devices with thin films of nanowires and/or electrical devices deposited according the techniques described herein. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The nanowires deposited by the techniques described herein can also be incorporated in applications requiring a single semiconductor device, and in multiple semiconductor devices. For example, the nanowires deposited by the techniques described herein are particularly applicable to large area, macro electronic substrates on which a plurality of semiconductor devices is formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The nanowires deposited by the techniques described herein are also applicable to smart libraries, credit cards, large area array sensors, and radio-frequency identification (RFID) tags, including smart cards, smart inventory tags, and the like.

The nanowires deposited by the techniques described herein are also applicable to digital and analog circuit applications. In particular, the nanowires deposited by the techniques described herein are useful in applications that require ultra large-scale integration on a large area substrate. For example, a thin film of nanowires deposited by the techniques described herein can be implemented in logic circuits, memory circuits, processors, amplifiers, and other digital and analog circuits.

The nanowires deposited by the techniques described herein can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires and electrical devices deposited by the techniques described herein. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

Exemplary embodiments have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are herein incorporated by reference to the same extent as if each individual publication, patent or patent application was specifically and individually indicated to be incorporated by reference.

Example Embodiments

In an embodiment, a method for deposition of nanostructures to the surface of a substrate comprises: selecting a first solvent having properties that enable dielectrophoretic pinning of nanowires on electrodes of a substrate without the nanowires sticking to the substrate, selecting a second solvent having properties that enable the nanowires to lock to the substrate, flowing a first suspension that includes the first solvent and the nanowires over the substrate to enable the nanowires to be pinned to the substrate, flowing a second suspension that includes the second solvent over the substrate to enable the nanowires to lock to the substrate, and drying the substrate.

The method may further comprise rinsing the substrate subsequently to said flowing the first suspension.

The first solvent may be selected to include isopropyl alcohol and water.

The first solvent may be selected to include isopropyl alcohol.

At least one of the first and second solvents may include at least one of a water-alcohol mixture, a non-polar solvent, an additive, a pH modifier, or a salt.

The method may further comprise generating an electric field with electrodes of an electrode pair on the substrate to associate at least one nanowire from the first suspension with the electrodes.

In another embodiment, a method for deposition of nanostructures to the surface of a substrate comprises: positioning the surface of the substrate in a first orientation, the surface including an electrode pair that includes a first electrode and a second electrode, flowing a suspension that includes a plurality of nanowires over the surface of the substrate, generating an electric field with the electrode pair to associate at least one nanowire from the suspension with the electrode pair, flushing the surface of the substrate in the first orientation to remove excess nanowires, rotating the substrate into a second orientation, and flushing the surface of the substrate in the second orientation to remove excess nanowires.

The surface of the substrate may be a surface of a channel, and said flowing may include flowing the suspension through the channel over the surface of the substrate.

Said generating an electric field with the electrode pair to associate at least one nanowire from the suspension with the electrode pair may include applying a voltage in the range of 210 mV to 230 mV to the electrode pair.

The first electrode and the second electrode may each have a width of approximately 2 μm, where a spacing between the first electrode and the second electrode is approximately 8 μm, and said generating an electric field with the electrode pair to associate at least one nanowire from the suspension with the electrode pair may include applying an alternating current (AC) voltage in the range of 190 mVrms to 270 mVrms to the electrode pair.

In a further embodiment, a system for deposition of nanostructures comprises: an enclosed flow channel having a first surface that includes an electrode pair that includes a first electrode and a second electrode, an inlet port configured to provide a flow of a suspension into the channel, the suspension including a plurality of nanowires, the enclosed flow channel being capable of being positioned in a first orientation to enable the suspension to flow over the first surface, and an electrical signal source coupled to the electrode pair that is configured to generate an electric field with the electrode pair to associate at least one nanowire from the suspension with the electrode pair. The inlet port provides a solution to flush the first surface of the enclosed flow channel in the first orientation to remove excess nanowires. The enclosed flow channel is configured to be rotatable into a second orientation. The inlet portion provides a solution to flush the first surface of the enclosed flow channel in the second orientation to remove excess nanowires.

In the first orientation, the first surface may be positioned such that gravity pulls nanowires to the first surface from the suspension flowing through the enclosed flow channel.

In the second orientation, the first surface may be positioned such that gravity pulls nanowires away from the first surface into a central portion of the enclosed flow channel.

In the second orientation, the first surface may be inverted relative to the first orientation.

The electrical signal source may be configured to generate an alternative current (AC) electric field with the electrode pair to exert a dielectrophoretic force that attracts at least one nanowire from the suspension to the electrode pair.

In the first orientation, the first surface may be flushed for a period of time that enables a nanowire proximate to the first surface to traverse a length of the enclosed flow channel.

A spacing between the first electrode and the second electrode may be approximately equal to a length of a nanowire minus 5 μm.

The first electrode and the second electrode may each have a width of approximately 2 μm.

The first electrode and the second electrode may each have a width within the range of 2 μm to 3 μm.

In yet another embodiment, a method for deposition of nanostructures comprises: receiving at a bounding surface a target panel having a plurality of electrode pairs on a surface of the target panel, each electrode pair being configured to receive at least one nanowire, conveying the target panel over the bounding surface at a predetermined velocity through a plurality of panel processing zones, and processing the target panel at each panel processing zone of the plurality of panel processing zones, each panel processing zone being configured to perform a respective process to a portion of the surface of the target panel.

In still a further embodiment, a system for deposition of nanostructures comprises: an enclosed flow channel having opposing first and second surfaces, the first surface including a first electrode pair that includes a first electrode and a second electrode, and the second surface including a second electrode pair that includes a third electrode and a fourth electrode, a dielectric material that coats the first electrode pair and the second electrode pair, an inlet port configured to provide a flow of a suspension into the channel, the suspension including a plurality of nanowires, and an alternating current (AC) electrical signal source coupled to the first and second electrode pairs that is configured to generate an AC electric field with the first and second electrode pairs to impose a net force in a direction normal to the first and second surfaces on at least one nanowire in the suspension.

The AC electric field may be asymmetric.

The AC electric field may have a triangular waveform that has a rise time that is different from a fall time of the AC electric field.

The AC electric field may have a rectangular waveform that has a high voltage level for a first period of time and a low voltage level for a second period of time, and the first period of time may be different from the second period of time.

In yet another embodiment, a system for deposition of nanostructures comprises: an enclosed flow channel having a first surface, the first surface including an electrode pair that includes a first electrode and a second electrode, an electrical conductor, an inlet port configured to provide a flow of a suspension into the channel, the suspension including a plurality of nanowires, and an alternating current (AC) electrical signal source coupled to the electrode pair and the electrical conductor that is configured to generate an AC electric field with the electrode pair and electrical conductor to impose a net force in a direction normal to the first surface on at least one nanowire in the suspension.

The electrical conductor may be a wire, a rod, or a screen.

In still a further embodiment, a method for deposition of nanostructures to the surface of a substrate comprises: flowing a suspension that includes a plurality of nanowires through an enclosed flow channel having opposing first and second surfaces, the first surface including a first electrode pair that includes a first electrode and a second electrode, and the second surface including a second electrode pair that includes a third electrode and a fourth electrode and generating an alternating current (AC) electric field with the first and second electrode pairs to impose a net force in a direction normal to the first and second surfaces on at least one nanowire in the suspension.

In yet another embodiment, a method for deposition of nanostructures to the surface of a substrate comprises: flowing a suspension that includes a plurality of nanowires through an enclosed flow channel having a first surface, the first surface including an electrode pair that includes a first electrode and a second electrode, positioning an electrical conductor in the enclosed flow channel, and generating an AC electric field with the electrode pair and electrical conductor to impose a net force in a direction normal to the first surface on at least one nanowire in the suspension.

In still a further embodiment, a system for deposition of nanostructures comprises: a substrate having a surface and an electrode pair that includes a first electrode and a second electrode that are coaxially aligned on the surface, the first electrode having a first end and the second electrode having a second end, the first end and the second end being adjacently positioned and separated by a first distance on the surface of the substrate. The electrode pair is configured to receive an electrical signal to generate an electric field to associate at least one nanowire with the electrode pair, and the first end and the second end are each non-square shaped.

The first end and the second end may be each triangular shaped, and an apex of the first end may be separated by the first distance from an apex of the second end.

The first end and the second end may be each rounded.

The surface of the substrate may be a surface of a channel, and the system may include an inlet port configured to provide a flow of a suspension into the channel, the suspension including a plurality of nanowires, and an electrical signal source coupled to the electrode pair that is configured to provide the electrical signal to generate the electric field with the electrode pair to associate at least one nanowire from the suspension with the electrode pair.

The electrical signal may be approximately 10 Vpp.

In yet another embodiment, a method for deposition of nanostructures comprises: receiving an electrical signal at a first electrode and a second electrode of an electrode pair that are coaxially aligned on a surface of a substrate to generate an electric field with the electrode pair to associate at least one nanowire from a suspension with the electrode pair, the first electrode having a first end and the second electrode having a second end, the first end and the second end being adjacently positioned and separated by a first distance on the surface of the substrate, the first end and the second end each being non-square shaped, and locking the at least one nanowire to the surface of the substrate.

In still a further embodiment, a system for deposition of nanostructures comprises: a flow channel having a first surface, an inlet port configured to provide a flow of a suspension into the channel, the suspension including a plurality of nanowires, an electrode pair that includes a first electrode and a second electrode on the first surface, the electrode pair being configured to receive a first electrical signal to generate a first electric field to associate at least one nanowire of the suspension with the electrode pair, and at least one electrical conductor configured to receive a second electrical signal to generate a second electric field to attract excess nanowires from the first surface of the flow channel.

The at least one electrical conductor may include at least one of a third electrode, a second electrode pair, a plurality of rods, or an electrode grate.

The second electric field may be configured to have an attractive force that is not great enough to remove a pinned nanowire from the electrode pair.

The second electric field may be configured to attract the excess nanowires into a fluid flow in a central portion of the flow channel to be flushed from the flow channel.

In yet another embodiment, a method for deposition of nanostructures to the surface of a substrate comprises: flowing a suspension that includes a plurality of nanowires through a flow channel having a first surface, the first surface including an electrode pair that includes a first electrode and a second electrode, generating an AC electric field with the electrode pair to associate at least one nanowire of the suspension with the electrode pair, and generating a second electric field with at least one electrical conductor to attract excess nanowires from the first surface of the flow channel.

In still a further embodiment, a method for deposition of nanostructures to the surface of a substrate comprises: configuring a geometry of an electrode pair to increase an operating window of a pinning voltage associated with the electrode pair, the electrode pair including a first electrode and a second electrode on a surface of a flow channel, flowing a suspension that includes a plurality of nanowires through the flow channel, and applying a voltage having a value within the operating window to the electrode pair to generate an AC electric field with the electrode pair to pin at least one nanowire from the suspension at the electrode pair.

Said configuring may comprise decreasing a thickness of the first electrode and the second electrode.

Said configuring may comprise forming a damascene structure on the surface of the flow channel that includes a low dielectric constant film, the first electrode, and the second electrode, the low dielectric constant film having a surface that is coplanar with surfaces of the first electrode and the second electrode.

Said configuring may comprise increasing a gap between the first electrode and the second electrode.

Said configuring may comprise decreasing a width of the first electrode and the second electrode.

Said configuring may comprise increasing a spacing between the first electrode pair and a second electrode pair.

Said configuring may comprise configuring the geometry of the electrode pair to increase the operating window for pinning a single nanowire to the electrode pair.

Said configuring may comprise configuring the geometry of the electrode pair to increase the operating window for pinning two nanowires to the electrode pair.

Said configuring may comprise configuring the electrode pair to have a first geometry to match a minimum pinning voltage associated with the first electrode pair with a minimum pinning voltage associated with a second electrode pair having a second geometry.

What is claimed is:

1. A nanostructure deposition apparatus, comprising:
   a bounding surface configured to receive a target panel configured to receive at least one nanowire;
   a transport mechanism configured to convey the target panel over the bounding surface at a predetermined velocity; and
   a plurality of panel processing zones, each panel processing zone being configured to perform a respective process to a portion of a surface of the target panel, at least one of the plurality of panel processing zones including a nanostructure deposition device;
   wherein the transport mechanism is configured to convey the target panel through the plurality of panel processing zones;
   wherein the nanostructure deposition device includes a plurality of nanowire injection ports configured to provide a nanowire suspension adjacent to the surface of the target panel; and
   wherein the plurality of nanowire injection ports includes a first row of nanowire injection ports and a second row of nanowire injection ports, the first row and second row being parallel, and the first row being offset from the second row.

2. The nanostructure deposition apparatus of claim 1, wherein the plurality of panel processing zones further includes a rinse zone.

3. The nanostructure deposition apparatus of claim 1, wherein the plurality of panel processing zones further includes a drying zone.

4. The nanostructure deposition apparatus of claim 1, wherein the plurality of panel processing zones further includes a repair zone.

5. The nanostructure deposition apparatus of claim 4, wherein the plurality of panel processing zones further includes a second nanostructure deposition device and a rinse zone arranged in series following the repair zone.

6. The nanostructure deposition apparatus of claim 1, wherein the nanostructure deposition device includes a nanowire ink injection port configured to provide a nanowire ink adjacent to the surface of the target panel, a solvent injection port configured to provide a solvent between the surface of the target panel and the bounding surface, and a solvent removal port configured to remove the solvent.

7. The nanostructure deposition apparatus of claim 2, wherein the rinse zone includes a nanowire ink removal port configured to remove nanowire ink from adjacent to the surface of the target panel, and a solvent injection port configured to provide a solvent between the surface of the target panel and the bounding surface.

8. The nanostructure deposition apparatus of claim 7, wherein a first gap between the bounding surface and the surface of the target panel is approximately 1 mm, and a second gap between the nanowire ink removal port and the surface of the target panel is in the range of 10 μm to 100 μm.

9. The nanostructure deposition apparatus of claim 2, wherein the rinse zone includes a plurality of nanowire ink removal ports configured to remove nanowire ink from adjacent to the surface of the target panel, and a plurality of solvent injection ports configured to provide a solvent between the surface of the target panel and the bounding surface; and
wherein the plurality of nanowire ink removal ports includes a first row of nanowire ink removal ports and a second row of nanowire ink removal ports, the first row and second row being parallel, the first row being offset from the second row, and at least one of the solvent injection ports being positioned between the first row and the second row.

10. The nanostructure deposition apparatus of claim 1, wherein the predetermined velocity is 10 mm/sec.

11. The nanostructure deposition apparatus of claim 1, wherein the target panel comprises a plurality of electrode pairs on a surface of the target panel, each electrode pair being configured to receive at least one nanowire.

12. A nanostructure deposition apparatus, comprising:
a bounding surface configured to receive a target panel configured to receive at least one nanowire;
a transport mechanism configured to convey the target panel over the bounding surface at a predetermined velocity; and
a plurality of panel processing zones, each panel processing zone being configured to perform a respective process to a portion of a surface of the target panel, at least one of the plurality of panel processing zones including a nanostructure deposition device, and at least one of the plurality of panel processing zones including a rinse zone that includes a plurality of nanowire ink removal ports configured to remove nanowire ink from adjacent to the surface of the target panel and a plurality of solvent injection ports configured to provide a solvent between the surface of the target panel and the bounding surface, wherein the plurality of nanowire ink removal ports includes a first row of nanowire ink removal ports and a second row of nanowire ink removal ports, the first row and second row being parallel, the first row being offset from the second row, and at least one of the solvent injection ports being positioned between the first row and the second row;
wherein the transport mechanism is configured to convey the target panel through the plurality of panel processing zones.

13. The nanostructure deposition apparatus of claim 12, wherein the plurality of panel processing zones further includes a drying zone.

14. The nanostructure deposition apparatus of claim 12, wherein the plurality of panel processing zones further includes a repair zone.

15. The nanostructure deposition apparatus of claim 12, wherein the nanostructure deposition device includes a nanowire ink injection port configured to provide a nanowire ink adjacent to the surface of the target panel, a solvent injection port configured to provide a solvent between the surface of the target panel and the bounding surface, and a solvent removal port configured to remove the solvent.

16. A nanostructure deposition apparatus, comprising:
a bounding surface configured to receive a target panel configured to receive at least one nanowire;
a transport mechanism configured to convey the target panel over the bounding surface at a predetermined velocity; and
a plurality of panel processing zones, each panel processing zone being configured to perform a respective process to a portion of a surface of the target panel, at least one of the plurality of panel processing zones including a nanostructure deposition device, and at least one of the plurality of panel processing zones including a rinse zone that includes a nanowire ink removal port configured to remove nanowire ink from adjacent to the surface of the target panel and a solvent injection port configured to provide a solvent between the surface of the target panel and the bounding surface, wherein a first gap between the bounding surface and the surface of the target panel is approximately 1 mm, and a second gap between the nanowire ink removal port and the surface of the target panel is in the range of 10 μm to 100 μ;
wherein the transport mechanism is configured to convey the target panel through the plurality of panel processing zones.

17. The nanostructure deposition apparatus of claim 16, wherein the plurality of panel processing zones further includes a drying zone.

18. The nanostructure deposition apparatus of claim 16, wherein the plurality of panel processing zones further includes a repair zone.

* * * * *